United States Patent [19]

Shelley

[11] Patent Number: 4,620,282

[45] Date of Patent: Oct. 28, 1986

[54] SYSTEM AND METHOD FOR DOCUMENTING AND CHECKING CABLE INTERCONNECTIONS

[76] Inventor: Marlin C. Shelley, 2641 Edgehill Dr., Bountiful, Utah 84010

[21] Appl. No.: 576,612

[22] Filed: Feb. 3, 1984

[51] Int. Cl.⁴ .............................................. G06F 11/00
[52] U.S. Cl. ..................................... 364/489; 324/66; 361/428; 364/580
[58] Field of Search ............... 364/489, 490, 488, 580; 371/25; 324/51, 66; 361/428

[56] References Cited

U.S. PATENT DOCUMENTS

| | | | |
|---|---|---|---|
| 4,218,745 | 8/1980 | Perkins | 361/428 |
| 4,257,002 | 3/1981 | Helms et al. | 324/66 |
| 4,384,249 | 5/1983 | Medina | 324/66 |
| 4,399,400 | 8/1983 | Rockwell et al. | |
| 4,510,572 | 4/1985 | Reece et al. | 371/25 |

FOREIGN PATENT DOCUMENTS 0111466 7/1982 Japan ..................................... 324/66

OTHER PUBLICATIONS

"Cable Testing Instrument Model C120" (Vann Instruments), product brochure (not dated).
"Cable Testing Instrument Model C120" (Vann Instruments), operation manual, containing a copyright notice dated 1983.
Cablescan, Inc., "JB-100 Test Interface Junction Box" (Oct. 1980; Orange, Calif.).
Cablescan, Inc., "Simple Automatic Continuity Tester ST-200B" (Sep. 1982; Orange, Calif.).
Cablescan, Inc., "ET-1024 Self Programming Assembly Continuity Tester System" and AHT-200C, AHT-200 CP Self-Programming-Continuity Monitor/Tester, (Dec. 1982; Orange, Calif.).
H. W. Markstein, "Update on Cable and Harness Testing," Electronic Packaging & Production, pp. 65-70 (Feb., 1983).
National Industries, Inc., "A.T.E. for the 80's," Circuit Analyzer Models 2200, 2060 and 2040 (1982; Montgomery, Ala.).
Hollex, Inc., "The Complete IDC Test"(1982; Melrose, Mass.).
Hewlett Packard, "5004A Signature Analyzer . . . A Microprocessor Service Solution" (Oct. 1980; location not specified).
Hewlett Packard, "Application Note 222, A Designer's Guide to Signature Analysis" (1976; location not specified).
Hewlett Packard, "Application Note 222-2, Application Articles on Signature Analysis," pp. 1-8 (Mar. 1977; New York, N.Y.), 9-15 (May 1977; Palo Alto, Calif.), 17-18 (May 1978, location not specified), 23-28 (Jan. 1979; Rochelle Park), 29-35 (Mar. 1979; location not specified), and 41 (Mar. 1979).
Hewlett Packard, "Application Note 222-4, Guidelines for Signature Analysis, Understanding the Signature Measurement" (1980).

*Primary Examiner*—Parshotam S. Lall
*Attorney, Agent, or Firm*—Workman, Nydegger & Jensen

[57] ABSTRACT

A system and method for documenting and checking the common connections provided by each wire of a cable between connector terminals located at opposite ends of the cable. The system includes a cable analyzer which is used to generate control information for quickly and reliably verifying standardization of each cable design, an optional printer or other suitable means of documenting the control information, and a binder or other appropriate means for organizing and filing the documentation which contains the control information. The analyzer automatically scans and records the common connections provided by each wire of the cable between the connector terminals at the ends of the cable. The terminal interconnections may then be printed so as to document the cable design for later reference. The analyzer also uses the terminal interconnections to automatically generate and record a unique alphanumeric or numeric code, called a "cable signature," which is also printed as part of the design documentation. Proper cable design can be quickly verified for subsequent cables by using the cable analyzer and the documented design information.

31 Claims, 14 Drawing Figures

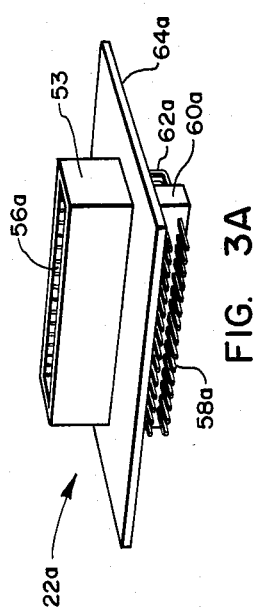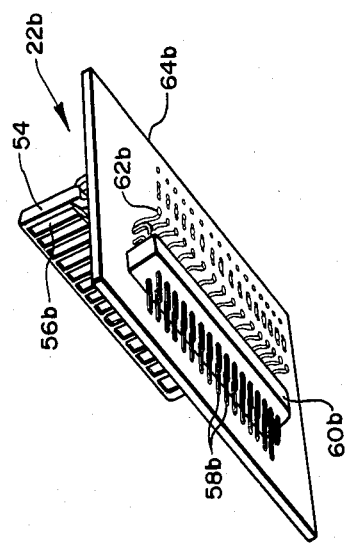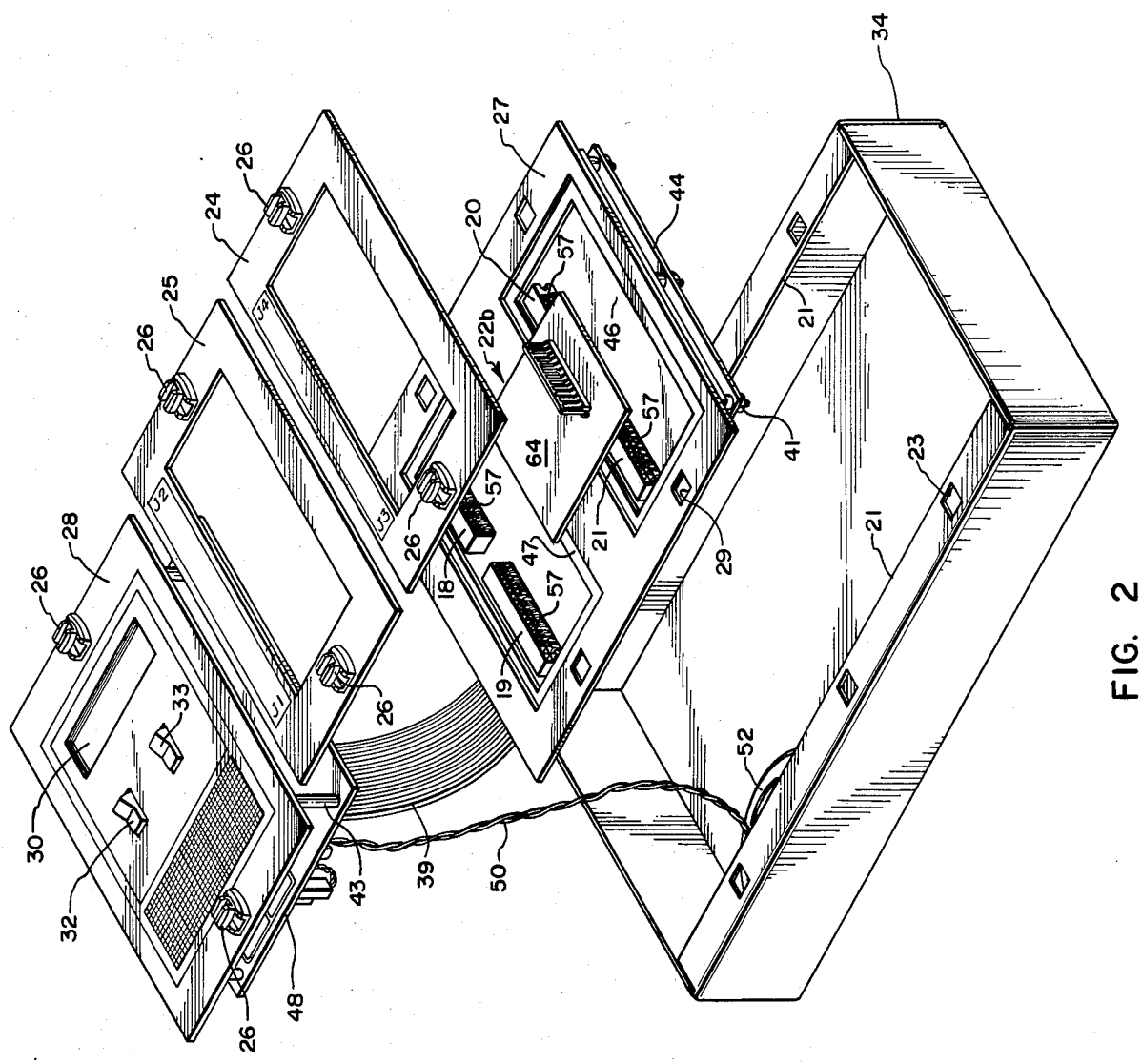

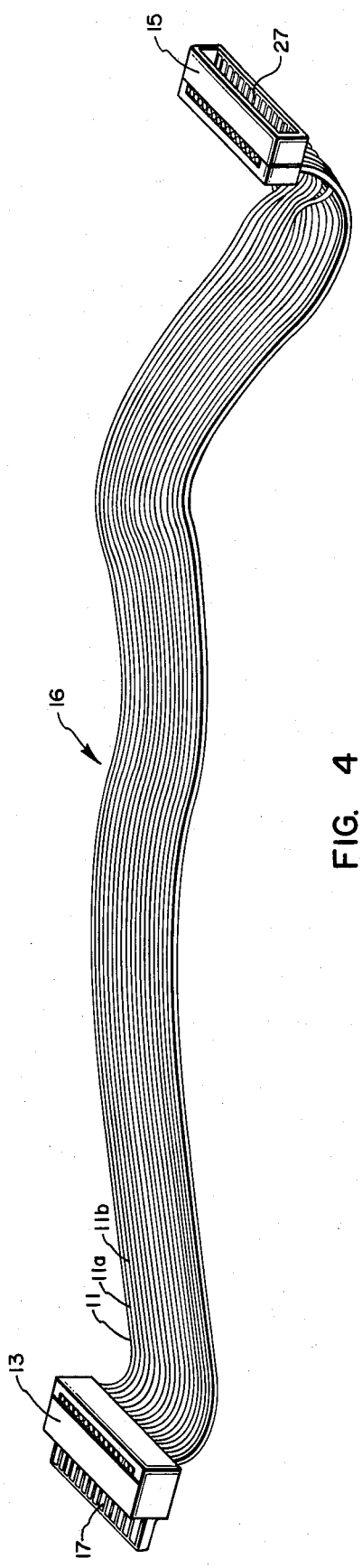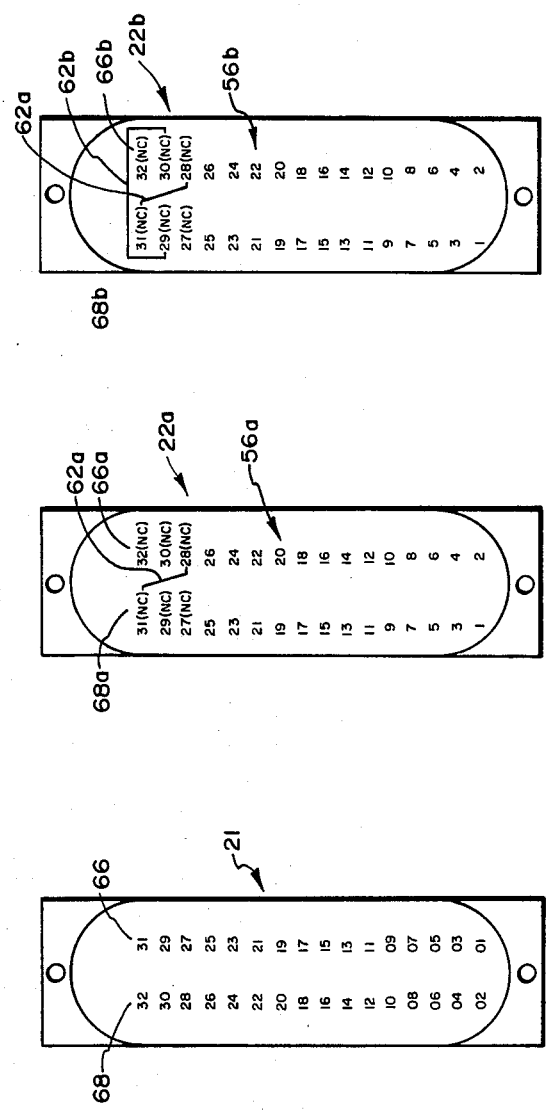
FIG. 4
FIG. 5A
FIG. 5B
FIG. 5C

| TEST POINTS (INDEX$_i$) | TABLE OF PRIMES (P$_i$ ARRAY) | LINKED DATA LIST (R$_i$ ARRAY) | P$_{R_i}$ VALUE | P$_i$ × P$_{R_i}$ PRODUCT |
|---|---|---|---|---|
| | P$_0$ = 0 | | | |
| 1 | P$_1$ = 103 | R$_1$ = 0 | P$_{R_1}$ = P$_0$ = 0 | 103 × 0 |
| 2 ⎫ | P$_2$ = 107 | R$_2$ = 4 | P$_{R_2}$ = P$_4$ = 113 | 107 × 113 |
| 3 ⎬ 82 | P$_3$ = 109 | R$_3$ = 0 | P$_{R_3}$ = P$_0$ = 0 | 107 × 0 |
| 4 ⎪ | P$_4$ = 113 | R$_4$ = 6 | P$_{R_4}$ = P$_6$ = 131 | 113 × 131 |
| 5 ⎪ | P$_5$ = 127 | R$_5$ = 0 | P$_{R_5}$ = P$_0$ = 0 | 127 × 0 |
| 6 ⎭ | P$_6$ = 131 | R$_6$ = 0 | P$_{R_6}$ = P$_0$ = 0 | 131 × 0 |
| ⋮ | ⋮ | ⋮ | ⋮ | ⋮ |
| 128 | | | | |

FIG. 8

```
CABLE DOCUMENTATION                      ,-98                    ,-103
--------------------------------------------------------------------
CABLE SIGNATURE:       7C7D5B  CABLE PART NO. :_____
J1 ADAPTER SIGNATURE:  ICAF30  CONNECTOR DESCRIPTION:_____
J3 ADAPTER SIGNATURE:  337A11  CONNECTOR DESCRIPTION:_____
CABLE DESCRIPTION:_____
--------------------------------------------------------------------
NO.  COMMON  CONNECTION  LIST:    ,-100
 1    J1-01    J3-02       ,-102   `-101
 2    J1-02    J3-04
 3    J1-03    J3-06
 4    J1-04    J3-08
 5    J1-05    J3-10
 6    J1-06    J3-12
 7    J1-07    J3-14
 8    J1-08    J3-16
 9    J1-09    J3-18
10    J1-10    J3-20
11    J1-11    J3-22
12    J1-12    J3-24
13    J1-13    J3-26
14    J1-14    J3-01
15    J1-15    J3-03
16    J1-16    J3-05
17    J1-17    J3-07
18    J1-18    J3-09
19    J1-19    J3-11
20    J1-20    J3-13
21    J1-21    J3-15
22    J1-22    J3-17
23    J1-23    J3-19
24    J1-24    J3-21                       ,-99
25    J1-25    J3-23
--------------------------------------------------------------------
NOTES:_____
_____
```

FIG. 9

SYSTEM AND METHOD FOR DOCUMENTING AND CHECKING CABLE INTERCONNECTIONS

BACKGROUND

1. Field of the Invention

The present invention relates to a novel system and method for accurately documenting and rapidly checking the common connections provided by each wire of a cable between connector terminals located at opposite ends of the cable.

2. The Prior Art

Cables (two or more wires within a single covering) and harnesses (an assembly of discrete wires) have long been used to interconnect the various components of electrical systems. For example, cables (as used herein the term "cable" is intended to include the term "harness") are commonly used to interconnect computer peripheral devices such as keyboards and CRT terminals, printers and other types of devices to the central processing unit of a computer system. It is not uncommon in the art for cable manufacturers to have to design and make many different cables in order to provide compatible cable configurations for the many different types of computers and peripheral devices that are now available on the market.

Typically cables require testing after fabrication to ensure continuity between desired points of connection and to ensure the absence of short circuits. Continuity tests are designed to determine whether there are any breaks or unacceptably high resistances present along the length of each wire. Short circuit tests are designed to detect bare wire contact or high impedance short circuits through low resistance insulation. Continuity and short circuit tests can also be used to verify whether each wire has been properly connected between connector terminals at the ends of the cable. For example, for a terminal with a missing connection an open circuit condition is created; for a terminal incorrectly wires to another terminal, both open and/or short circuit conditions are created.

At present there is a broad range of cable test equipment that is available in the art. See, e.g., Markstein, Howard W., "Update on Cable and Harness Testing," *Electronic Packaging & Production,* February, 1983. Such test equipment varies from highly sophisticated computer systems which are used for testing complex cables used in applications such as electrical systems of aircraft or satellites, which may require cables having as many as one hundred thousand connecting points which must be verified, to more simple "benchtop" test equipment for testing small cables such as those used in the case of personal computers and their peripherals. While large computer test systems work well, they are also very expensive and complicated, thus making them impractical for use in connection with testing cables which are of a more simple construction.

Benchtop testers are usually designed to simply check for continuity and short circuits and to provide some sort of indication in the event of a fault. While many of these small testing devices work reasonably well, frequently they require manual testing with the use of a probe in order to trace a fault once it is detected. This, of course, can be a time consuming and tedious task.

Another problem encountered in the use of smaller benchtop cable testers is that there is no means of adequately documenting and easily verifying control information which can thereafter be used as a standard against which subsequent cables are to be checked. Inadequate documentation and verification of such standards account for additional inefficiency and wasted time.

Still a further problem is encountered in terms of interfacing different kinds of cable connectors to the test equipment. There are presently a number of different types of connectors which are used to provide the connecting terminal points for cable wiring. Since different connectors are commonly in use, it is sometimes necessary to use adapters to properly interface such connectors to the test equipment. However, if the interface is incorrectly made, it is possible to spend more time in troubleshooting the connector interface than in actually testing the cable. This leads to further inefficiency and difficulty in the use of such equipment.

PRINCIPAL OBJECTS AND BRIEF SUMMARY OF THE INVENTION

In view of the present state of the art, it is a principal object of the present invention to provide a system and method for documenting and checking cable interconnections using an apparatus which is relatively uncomplicated and inexpensive and yet which is highly reliable and easy to use.

Another important object of the present invention is to provide a system and method for documenting and checking cable interconnections based on signature analysis techniques which can be conveniently used for purposes of verifying proper terminal interconnections as against control documentation maintained in an easily accessible file.

Another important object of the present invention is to provide a system and method which can be easily and reliably used to interface different types of cable connectors to the test apparatus, and which will ensure that proper cable connectors have been used.

Still another object of the present invention is to provide an apparatus and method which can be used to quickly test a cable for continuity or short circuits and which can be used to automatically trace each fault that is detected.

These and other objects and features of the present invention will become more fully apparent from the following description and appended claims, taken in conjunction with the accompanying drawings.

Briefly summarized, the system of the present invention comprises a cable analyzer which is used to generate control information that is used for quickly and reliably verifying standardization of each cable design, an optional printer or other suitable means of documenting the control information, and a binder or other appropriate means for organizing and filing the documentation which contains the control information.

After a cable having a particular design has been built, it is plugged into the cable analyzer. The analyzer automatically scans and records the common connections (hereinafter sometimes called "terminal interconnections") provided by each wire of the cable between the connector terminals at the ends of the cable. The terminal interconnections may then be printed so as to document the cable design for later reference. The analyzer also uses the terminal interconnections to automatically generate and record a unique alphanumeric or numeric code, hereinafter called a "cable signature," which is also printed as part of the design documentation.

When a batch of cables are subsequently manufactured which are intended to meet the design specifications that were previously documented, the first cable from the batch is used as a reference cable. The reference cable is plugged into the analyzer which then scans the terminal interconnections as before and generates a cable signature based on the detected interconnections. The cable signature for the reference cable is visually displayed at the analyzer so that the user can verify the cable signature for the reference cable and check it against the cable signature that was previously documented and is on file for that design. If the cable signature of the reference cable matches the documented cable signature, the reference cable can then be used as a standard for quickly checking the terminal interconnections for each of the other cables in the batch.

With the cable analyzer turned on, the reference cable is removed and the next cable in the batch is plugged in. The cable analyzer scans the terminal interconnections for the next cable and compares them with the list of terminal interconnections previously stored in memory. The list of previously stored interconnections represents the terminal interconnections of the reference cable. If there are any differences between the stored list of interconnections of the reference cable and the cable in the batch that is being tested, the cable analyzer provides both an audio and a visual indication which alerts the user that the test cable does not meet the required specification since it differs from the reference cable. The cable analyzer determines whether such differences are a result of open and/or short circuit conditions, and provides a visual indication of each fault, identified in terms of the terminal interconnections where such fault occurs.

The cable analyzer is also designed to be used with adapters so that different types of cable connectors can be easily interfaced to the analyzer. Unique adapter signatures are also generated and documented along with the other control information so that proper adapters and adapter position can be quickly and reliably verified to ensure that the correct cable connectors have been used.

BRIEF DESCRIPTION OF THE DRAWINGS

FIG. 2 is an exploded perspective view illustrating in greater detail the cable analyzer used in connection with the system and method of the present invention.

FIGS. 3A and 3B are enlarged perspective views which illustrates in greater detail adapters which can be used to interface cable connectors to the cable analyzer.

FIG. 4 is a perspective view of a cable of the type which can be used in connection with the cable analyzer illustrated in FIGS. 1 and 2.

FIGS. 5A through 5C are schematic illustrations which are used to show how cable connectors having different pin numbering sequences can be interfaced to the cable analyzer using an adapter.

FIG. 8 is a schematic illustration used for purposes of describing how signature values are generated by the cable analyzer of the system.

FIG. 9 illustrates an example of how a cable design can be documented using the system and method of the present invention.

Reference is next made to a detailed description of the presently preferred embodiments as illustrated in the drawings, wherein like parts are designated with like numerals throughout.

DETAILED DESCRIPTION OF THE PRESENTLY PREFERRED EMBODIMENTS

The following detailed description is divided into two parts. In the first part the overall system is described, including a detailed description of the cable analyzer and the manner in which the optional electronic circuits of the cable analyzer operate. In part two the method by which the overall system is used to document and check a cable design is described.

I. The System

Figure 1:
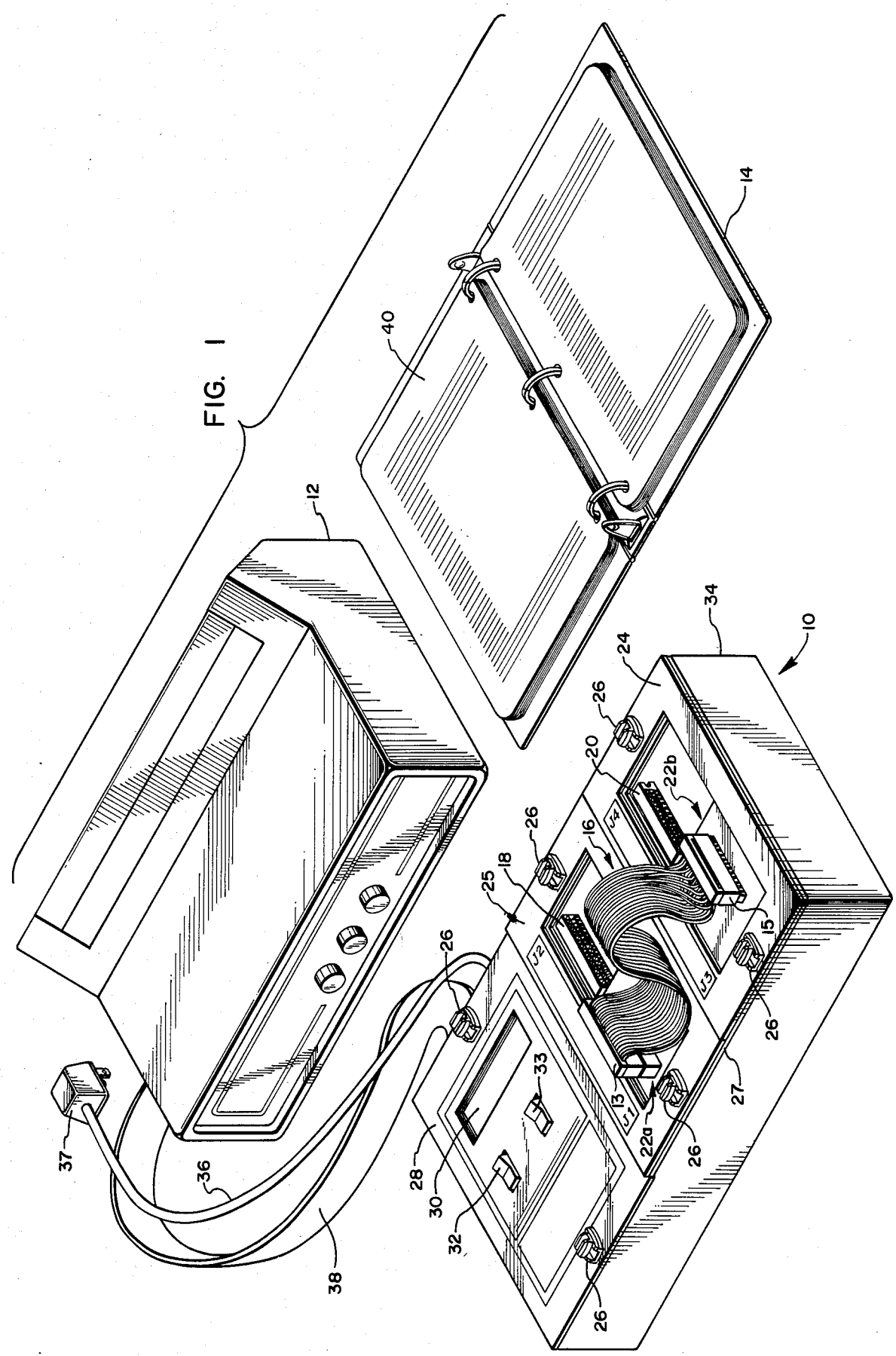
FIG. 1 is a perspective illustration which shows each of the basic elements used in one presently preferred embodiment of the system and method of the present invention.

Reference is first made to FIG. 1. The overall system includes a cable analyzer generally designated at 10, an optional printer which is connected to the cable analyzer 10 by means of a cable 38, and a binder 14 for organizing and filing design documentation which may be prepared using the cable analyzer 10 and printer 12. The cable analyzer 10 includes a metal housing 34 and is connected by a cord 36 to a conventional wall mount transformer 37 which supplies 9 volts AC at 700 milliamps.

As shown best in the exploded perspective view of FIG. 2, removeably mounted to the top of housing 34 are two cover plates 27 and 28. Attached by bolts 41 to the underside of cover plate 27 is a printed circuit card 44 on which are mounted four connectors 18-21. Connectors 18-21 each have thirty-two terminals which are individually accessed through corresponding sockets 57. Cables, such as that generally illustrated at 16 in FIG. 1, are plugged into the connectors 18-21 using adapters 22.

Mounted by bolts 43 to the underside of the other cover plate 28 is another printed circuit card 48 which optionally includes a microprocessor and other electronic components which are used for purposes of scanning the terminal interconnections of cable 16 and generating a unique cable signature which, as hereinafter more fully explained, is used to document and verify cable design. The circuits on printed circuit cards 44 and 48 are electrically connected by cable 39, and are more fully described below in reference to FIG. 6 or 7. Cover plate 28 also includes two switches 32 and 33 which are used to control the operation of the cable analyzer in the learn and test mode, and which are used for purposes of displaying cable signatures, adapter signatures and terminal interconnections at the output display 30.

As illustrated in FIG. 4, each cable 16 which is analyzed by the cable analyzer 10 typically includes a plurality of small wires 11 which run between connectors 13 and 15 at the ends of the cable. Each connector 13 and 15 typically has a series of individual electrical terminals which are mounted either in the form of male connector terminals 17 or female connector terminals 27. Common connections between the terminals of connectors 13 and 15 are provided by the individual wires 11.

For example, wire 11a may provide a common connection between the first terminal of connector 13 and the third terminal of connector 15. Wire 11b may provide a common connection between the second terminal of connector 13 and the fifth terminal of connector 15 and so on. In this manner, each cable can be specially designed so as to provide a particular sequence of common connections between the terminals of the connectors 13 and 15. Thus, as illustrated in FIG. 4 the wires 11 may cross over one another at one of the ends of the cable, such as at connector 15.

As can be appreciated, when manufacturing a large number of such cables it is important to verify that each cable has the proper interconnections between connector terminals. As hereinafter more fully described, use of the system and method of the present invention for documenting and checking such terminal interconnections greatly facilitates this task.

Cable connectors such as those illustrated at 13 and 15 in FIG. 4 come in various sizes to accommodate different sizes of cable. It is also common in the art that the terminals of such connectors may be numbered using any one of several different numbering sequences. For example, as schematically illustrated in FIG. 5A the connector 21 could include two columns 66 and 68 having sixteen terminals each. The terminals are numbered beginning at the lower right hand column 66 and then alternating in ascending order from the right column 66 to the left column 68, moving upwardly from one column to the other.

Another common numbering sequence used in the art (not illustrated herein) is to begin numbering the terminals at the bottom of column 66 then moving in ascending order to the top of column 66 then across to the terminal at the top of column 68 and then continuing in ascending order from the top of column 68 to the bottom thereof. Yet a third common numbering sequence is to begin numbering the pins at the bottom of column 66, then moving upward along column 66 in ascending order and then beginning again at the bottom of column 68 and continuing in ascending order to the top of column 68. Thus, as can be appreciated, there is a wide variety of connectors which can be used based not only on the size of the cable needed but also based on the particular numbering sequence which is desired.

In the system of the present invention, the connectors 18-21 of the cable analyzer 10 are interfaced to cables of differing sizes or having connectors which use a numbering sequence different from those of the connectors 18-21 by means of adapters such as that generally illustrated at 22 (see FIGS. 1-3). In the illustrated embodiment, there are four possible adapter positions which are labeled J1-J4 on the sides of top plates 24 and 25 adjacent to each connector 18-21. Each position thus corresponds to one of the connectors 18-21. For example, position J1 corresponds to connector 19; J2 corresponds to connector 18, and so on.

As shown best in FIGS. 3A and 3B, each adapter 22 may be built on a special printed circuit card 64. The adapter includes either a male plug 54 (see FIG. 3B) or a female socket 53 (see FIG. 3A) which each have a plurality of electrical terminals 56. The terminals 56B of plug 54 will mate with a corresponding female cable connector such as illustrated at 15 in FIG. 4, and the terminals 56A of socket 53 will mate with a corresponding male cable connector such as illustrated at 13.

The printed circuit card 64 is provided with a series of pins 58 which are intended to be connected in mating relationship with the corresponding sockets 57 (see FIG. 2) of one of the connectors 18-21. The pins 58 are connected to the terminals 56 by means of a wiring pattern 62 printed onto card 64. As hereinafter more fully explained, the wiring pattern 62 connects certain of the terminals 56 and pins 58 so as to provide a compatible interconnection between cable connectors 13 and 15 and connectors 18-21 on the analyzer. Thus if the numbering sequence of cable connectors 13 or 15 is different from that used on connectors 18-21 of the analyzer, the cable connectors 13 and 15 may be adapted to the different numbering sequence by means of the adapters 22.

For example, assume that the terminals 56 of adapters 22 have a numerical sequence opposite to the sequence shown in FIG. 5A, so that the numbering of the adapter terminals 56 is such that the numerical sequence of the left column is replaced by the numerical sequence of the right column as indicated at 66a and 68a in FIG. 5B. If positions thirty-one and twenty-eight (see FIG. 5B) of pins 58a and terminals 56A are connected in common as indicated by the wiring 62a and no connection is made to positions twenty-seven, twenty-eight, twenty-nine and thirty-two, then pins 58a of the adapter 22a will have up to twenty-six available pin positions which follow the same numbering sequence as that in FIG. 5A. Thus, assuming that connectors 19 and 21 of the cable analyzer had a numbering sequence starting from right to left as illustrated in FIG. 5A, adapters 22a and 22b could be used to interface cable connectors 13 and 15 even though the cable connectors had a numbering sequence starting from left to right.

In a similar fashion, cable connectors having other types of terminal numbering sequences can also be interfaced to the connectors 18-21 of the cable analyzer by means of properly configured interconnections using the terminal positions twenty-seven through thirty-two. The positions are labeled "NC" because they are not connected to the cable wiring but are merely used to re-configure the numbering sequence as described above.

In the case of cables having more than twenty-six terminals per connector, adapters are used (called "double high" adapters) which connect in series each pair of connectors 18-19 and 20-21 provided on the cable analyzer. Thus, when using double high adapters the J1 and J2 positions are connected together and the J3 and J4 positions are connected together thus eliminating the J2 and J4 positions, respectively. In this manner cables of varying size and having connectors with a different numbering sequence can be easily interfaced to the cable analyzer 10.

As hereinafter more fully explained in part two of the description, each adapter can be documented and later verified by means of a unique adapter signature which is generated in the same way as a cable signature is generated. The interconnection provided by the wiring pattern 62a between terminals thirty-one and twenty-eight (see FIG. 5B) can be used to generate an adapter signature. Since male and female adapters may have the same numbering sequence, in order to provide different adapter signatures as between male and female adapters, additional terminal positions (for example twenty-nine and thirty) may also be interconnected as shown at 62b in FIG. 5C. By so doing, the male adapter 22b will have an adapter signature different from the signature of female adapter 22a, even though the remaining terminal positions (i.e., one through twenty-six) of both adapters and configured the same.

With reference to FIG. 2, it will be seen that the printed circuit card 64 of each adapter 22 is designed so that the edges of the card 64 fit within a recessed edge 46 or 47 which is provided around the periphery of connectors 20-21 or 18-19, respectively. The printed circuit card 64 of each adapter 22 is then secured beneath top plates 24 and 25.

Top plates 24 and 25 are provided with quarter turn fasteners 26 which mate with the openings 23 provided on the upper edges 21 of the housing 34. In a similar fashion, the cover plate 28 is also mounted to the housing 34 by means of quarter turn fasteners 26. Thus, top plates 24 and 25 can be quickly and easily removed by means of the quarter turn fasteners 26 when changing or removing adapters. Cover plates 27 and 28 can also be easily removed to permit repair or replacement of circuit components.

With further reference to FIG. 2, the printed circuit card 48 is attached by means of wiring 50 to a speaker 52. As hereinafter more fully described, speaker 52 provides an audible tone which assists the user in determining whether a cable which is being tested has the proper terminal interconnections or whether the cable has been improperly wired such that open or short circuit conditions are detected.

Figure 6:
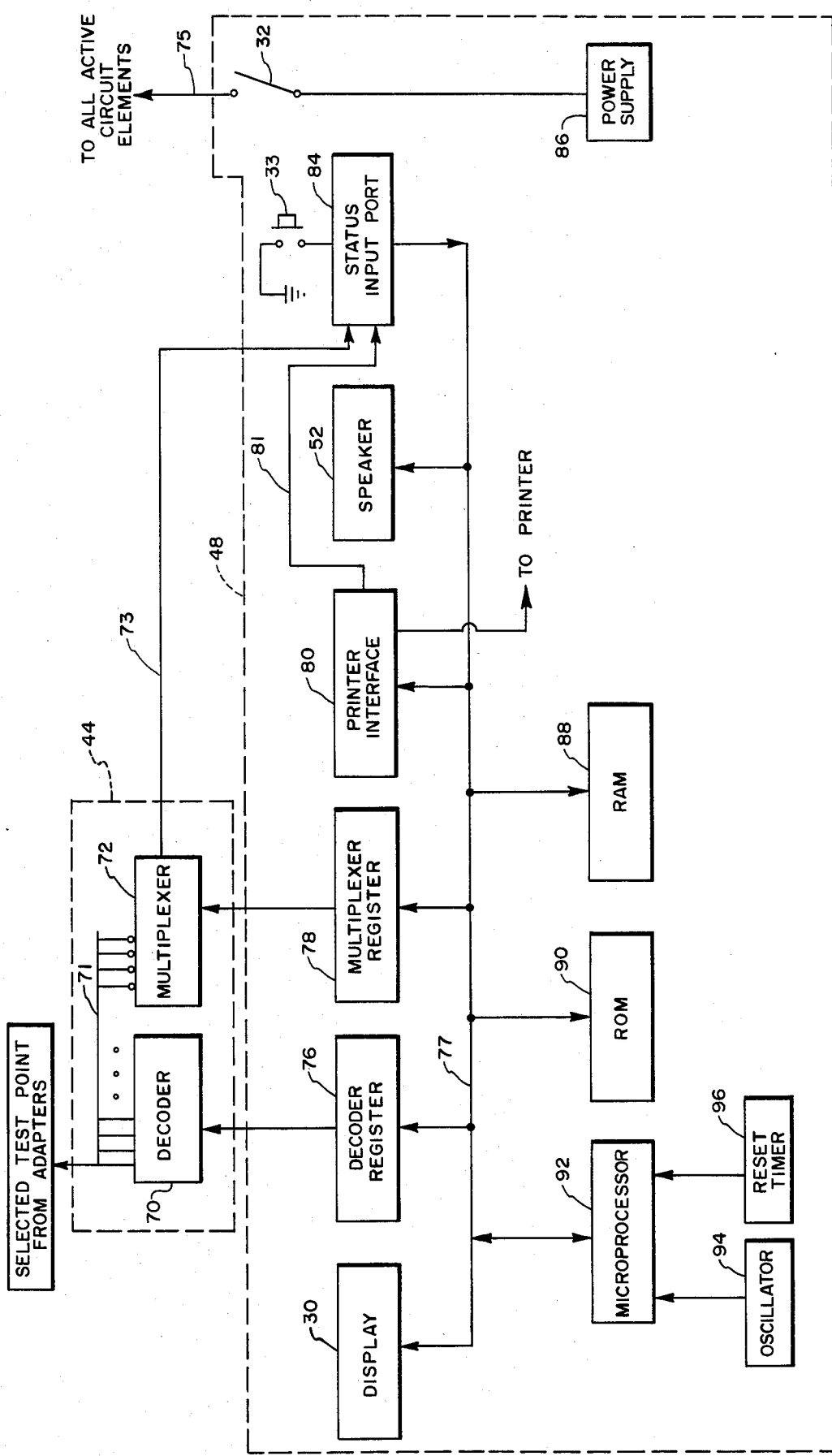
FIG. 6 is a functional block diagram which schematically illustrates the electronic circuit which is used in one presently preferred embodiment of the cable analyzer.

Reference is next made to FIG. 6 which generally illustrates the electronic circuit of the cable analyzer 10. That portion of the electronic circuit which is enclosed by the dashed line 44 corresponds to the circuit components which are mounted on printed circuit card 44 (see FIG. 2), whereas the portion of the circuit enclosed by dashed line 48 corresponds to the circuit components which are mounted or otherwise connected to printed circuit card 48.

As shown in FIG. 6, in one presently preferred embodiment of the system the electronic circuit of analyzer 10 includes a microprocessor 92. Microprocessor 92 may be any conventional microprocessor which is commercially available, as for example a 6504 microprocessor from the 6502 series, which is currently in widespread use and is well-known in the electronics industry.

Microprocessor 92 is connected through a data transfer bus schematically illustrated at 77 to a read only memory (ROM) 90 and a random access memory (RAM) 88. As hereinafter more fully described, ROM 90 is used to store the operating program which is executed by microprocessor 92 for purposes of learning, testing and/or documenting the terminal interconnections of each cable that is connected to the analyzer. RAM 88 is used for storage of the interim values and data generated by the microprocessor 92 as it executes the operating program stored in ROM 90. In one presently preferred embodiment of the invention (see FIG. 6A), RAM 88 is a commercially available 6116 integrated circuit (IC) and ROM 90 is a commercially available 2764 erasable programmable read only memory (EPROM).

An oscillator 94 provides the clock pulse which is used by microprocessor 92 to synchronize the operation of the other circuit components. Oscillator 94 may be, for example, a 4 mHz oscillator which is divided down to supply a 1 mHz clock pulse. Reset timer 96 is connected to microprocessor 92 and provides a reset pulse when switch 32 is closed to supply power to each of the active circuit elements. The reset timer may be, for example, an NE555 timer (see FIG. 6A), which is well-known in the state of the art. The power supply 86 may consist of a 7805 integrated circuit (FIG. 6A) which includes circuitry for rectifying and regulating the voltage supplied to the other active circuit elements.

Also connected to the data transfer bus 77 is a display unit 30. In the presently preferred embodiment the display unit 30 is a conventional liquid crystal display, such as an Epson Y16025AZ with its associated interface. As hereinafter more fully described, the display 30 is used to provide a visual indication of the terminal interconnections and cable or adapter signatures which are determined by the microprocessor 92 when analyzing a cable. In addition to the visual indications provided by display unit 30, audible tones are also provided by speaker 52. The tones are used to indicate whether the analyzer is in the learn or test mode and whether a cable which is being tested conforms to the desired design specifications which are being used as the standard for the test.

Figure 6A:
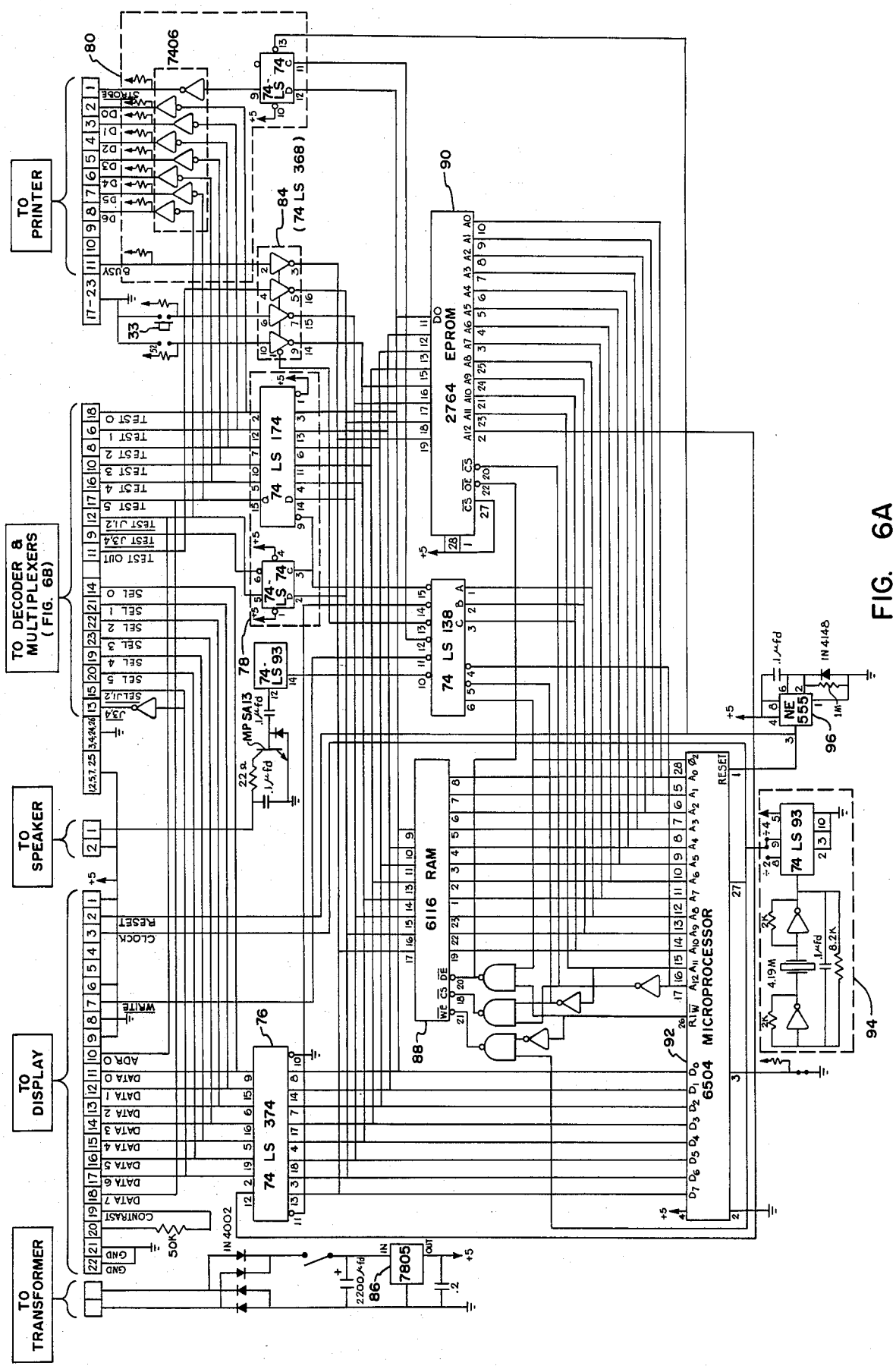
FIGS. 6A and 6B are detailed electrical schematics which represent an example of one way in which the block diagram of FIG. 6 has been implemented.

Status input port 84 is a tri-state buffer used to transfer information to the microprocessor 92 from printer interface 80 and multiplexer 72, as hereinafter more fully described. Status input port 84 is also connected to a switch 33 so that information from RAM 88 can be sequenced as it is sent to display unit 74. As illustrated in FIG. 6A, status input port 84 may be, for example, a 74LS368 tri-state buffer.

The printer interface 80 (see also FIG. 6A) provides the necessary electronic interface for connecting printer 12 to the cable analyzer 10. Printer 12 may be an Epson MX80 dot matrix printer with a parallel interface, or any other suitable printer. As schematically illustrated at 81 in FIG. 6, printer interface 80 is also connected to the status input port 84, which is used to transfer information to microprocessor 92 indicating when the printer 12 is ready to receive output information.

A decoder register 76 is connected to data transfer bus 77 and is used by microprocessor 92 to temporarily store a binary number that is used to determine which terminal on the connectors 18-21 is to be selected by decoder 70 for testing. The selected terminal, referred to herein and in FIG. 6 as the "selected test point" is then used by multiplexer 72 to identify whether any terminal subsequent to the test point is connected in common with it. As schematically indicated at 71, decoder 70 and multiplexer 72 are connected in common to each possible test point.

As more fully described below, multiplexer 72 scans the individual terminals of connectors 18-21 to determine whether any terminal which is numbered after the selected test point is connected in common with it. A multiplexer register 78 is connected to the data transfer bus 77 and is used by microprocessor 92 for temporary storage of a binary number which defines the terminal at which multiplexer 72 is to begin scanning for common connections. As explained below, the number in register 78 is periodically incremented by microprocessor 92 so that multiplexer 72 scans each terminal position subsequent to the selected test point until a common connection is found or until all points have been scanned.

Figure 6B:
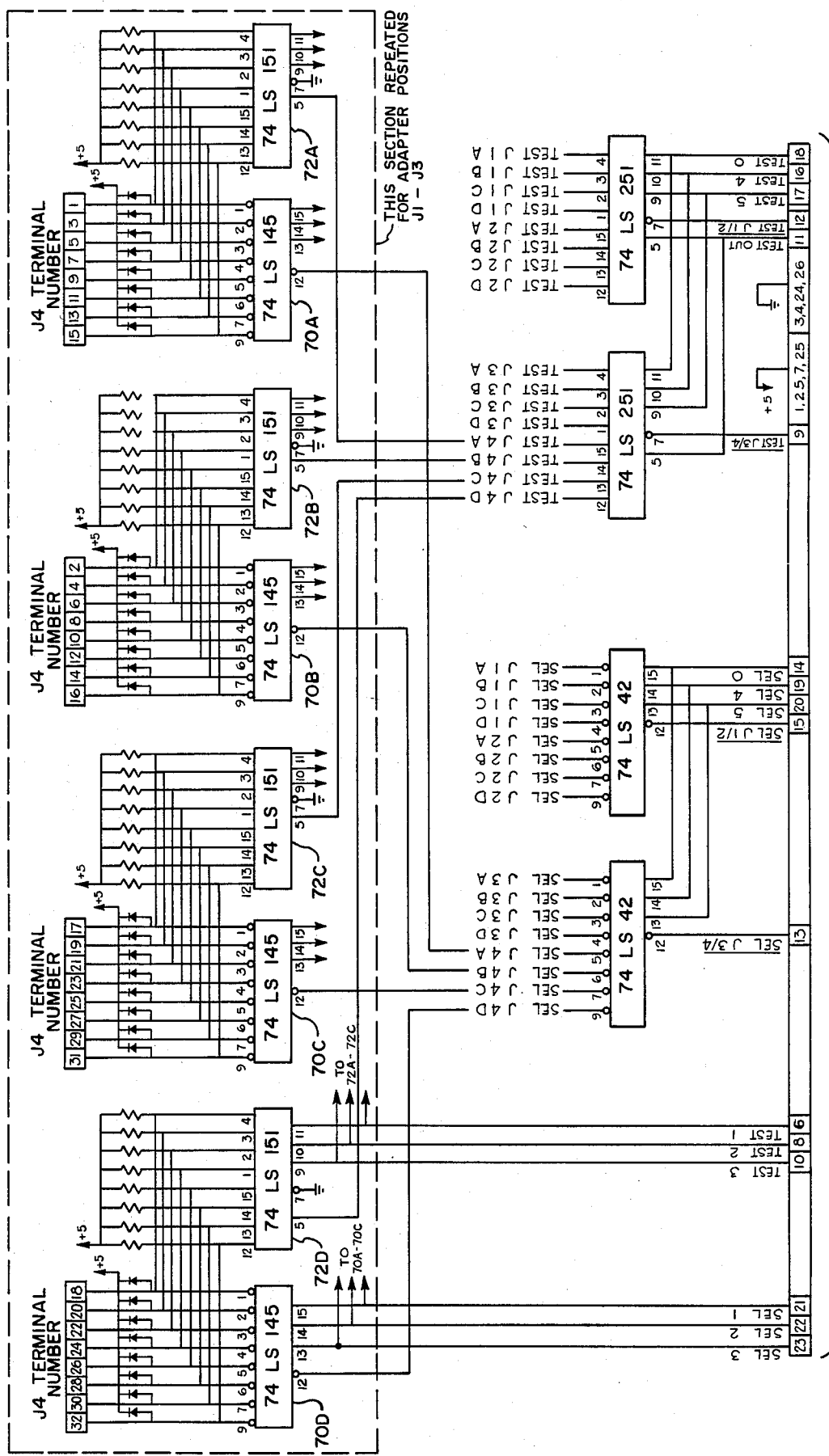

In the example of the circuit as illustrated in FIG. 6A, decoder register 76 may consist of a 74LS374 integrated circuit, and multiplexer register 78 may comprise a 74LS174 integrated circuit and half of a 74LS74 integrated circuit. Decoder 70 and multiplexer 72 may be configured in any suitable manner to accommodate the number of terminal positions to be scanned. For example, in the embodiment of the analyzer illustrated in FIGS. 1 and 2, connectors 18-21 have thirty-two terminals each, thus providing up to one hundred twenty-eight terminal points. For this embodiment, decoder 70 may comprise four 74LS145 decoders 70A-70D coupled to each one of the connectors 18-21. Thus, in this embodiment sixteen 74LS145 decoders are used, as indicated in FIG. 6B. The sixteen 74LS145 decoders may be individually accessed by microprocessor 92 through one of two 74LS42 decoders, also shown in FIG. 6B. Multiplexer 72 may similarly comprise four 74LS151 multiplexers 72A-72D connected in common with each corresponding decoder 70A-70D, and accessed by microprocessor 92 through one of two 74LS251 multiplexers.

One example of an electronic circuit which has been constructed and used to implement the above-described schematic block diagram is illustrated in FIGS. 6A and 6B. FIG. 6A is a detailed electrical schematic diagram showing the interconnections, part number and/or value of each circuit element used on printed circuit card 48, whereas FIG. 6B is a detailed electrical schematic diagram for the decoders and multiplexers mounted on printed circuit card 44. It should be noted that FIGS. 6A and 6B are included merely to show an example of one such circuit which has been used to implement the schematic diagram described in FIG. 6. Other implementations could be designed that would also work satisfactorily.

The embodiment of the electronic circuit illustrated in FIG. 6 is operated under the control of microprocessor 92 as it executes an operating program stored in ROM 90. Operation of the circuit is as follows:

With a cable plugged into the analyzer as illustrated in FIG. 1, switch 32 is turned on so as to supply power to the circuit. The reset timer 96 sends a reset pulse to microprocessor 92 which then powers up each of the other active circuit components. When the cable analyzer is first turned on, the electronic circuit is in the "learn" mode, meaning that the circuit will first perform the task of learning each of the common connections provided by wires 11 between the terminals of connectors 13 and 15.

In order to learn the terminal interconnections of the cable, microprocessor 92 sends to the decoder register 76 a binary number which identifies the first terminal on the first connector to be scanned. The number in decoder register 76 is then transmitted to decoder 70. The decoder 70 decodes the number and selects the terminal identified by that number by placing a logical low signal on that terminal. The selected terminal then becomes the test point which is used by multiplexer 72 for purposes of scanning the remaining terminals.

Microprocessor 92 increments the number sent to decoder register 76 by one and transmits the incremented number to multiplexer register 78. Thus, the first number which is stored in multiplexer register 78 identifies the terminal position which is next in sequence to the selected test point. Multiplexer 72 then begins at the terminal identified by the number stored in the multiplexer register 78 and checks that terminal to determine whether it also has a low signal level. If so, it is identified as being connected in common with the test point and is sent through status input port 84 to RAM 88, where it is stored as part of a linked data list, as described more fully below. Microprocessor 92 then selects the next point and the process is repeated.

If the terminal which is scanned by multiplexer 72 is not detected as having a low signal level, then it is not connected in common with the test point and the microprocessor again increments by one the number which is in the multiplexer register 78. The number in multiplexer register 78 therefore corresponds to the next terminal in the sequence so that multiplexer 72 moves to that terminal to check it for a common connection. This process is repeated until multiplexer 72 finds a terminal which is connected in common to the test point, or until it is determined that no common connections exist for that test point. The microprocessor 92 then increments the decoder register 76 so that a new test point is selected and the process is then repeated.

In this manner, each of the one hundred twenty-eight terminals of the connectors 18-21 are used as test points. When this process is completed, microprocessor 92 has stored in RAM 88 a linked data list which describes each of the terminal interconnections which are provided by the individual wires 11 between the terminals of cable connectors 13 and 15.

After the list of terminal interconnections has been stored in RAM 88 by microprocessor 92, the microprocessor uses the list to generate a unique alphanumeric or numeric code which can be used as a short form for identifying and later verifying the cable design. The code, which is referred to as a "cable signature," is generated using a mathematical relation which is designed to minimize the probability of generating the same signature for any cable which does not contain the same terminal interconnections or which uses a different type of adapter than that used in the original cable design. Thus, the "signature" of the cable is unique to that cable design and can be used to quickly verify the design, just as a person's handwritten signature is unique to that person. Hence the term "signature."

An example of one such mathematical relation which may be used is expressed as follows:

$$\sum_{i=1}^{n} P_i \times P_{Ri}$$

In the above expression, n is the number of test points provided by the connectors 18-21 of the analyzer. P is an array of n+1 elements where $P_0=0$ and $P_1, P_2 \ldots P_n$ are prime numbers stored in ROM 90. $R_i$ is an array of n elements which represents the list of terminal interconnections determined by the microprocessor 92 and stored in RAM 88 when learning the cable. Except for those elements of the array $R_i$ where pointers to common connections have been recorded, all other elements of the array $R_i$ are set to 0. Where pointers to common connections are stored in the array, the value of the array element is the index (i), which is given the value of the pointer.

The manner in which the above expression is used to generate signature values may be understood best by reference to the example illustrated in FIG. 8. As shown in FIG. 8, the index "i" is used to represent each possible test point. The array for $P_i$ is formed by setting $P_0=0$; thereafter, a prime number (one which is divisible only by the number one and itself) is assigned for each possible test point. Thus, for terminal one, prime number 103 is assigned; therefore i=1 and $P_1=103$. For terminal two, number 107 is assigned; therefore i=2 and $P_2=107$, and so on. In this manner, a table of prime numbers (called the $P_i$ array) is prepared which is then stored in ROM 90 as part of the operating program. Preferably each prime number is larger than 100.

If it is assumed for purposes of the example in FIG. 8 that terminals 2, 4 and 6 are interconnected as schematically indicated at line 82, then during the "learn" mode described above microprocessor 92 will learn the interconnections and will store them in the form of a linked data list (called the $R_i$ array). For each terminal position one through one hundred twenty-eight, the data list will contain either a zero or a number which points to the next terminal connected in common with it. Thus, in the data list of FIG. 8, for terminal position two the number four is the "pointer" since that is the next terminal connected in common with terminal two. For terminal position four, the pointer six is referenced.

To generate a cable signature using the linked data list, microprocessor 92 multiplies the prime number for each terminal position ($P_i$) with the prime number indexed by the pointer ($P_{Ri}$), and then adds each such product. Thus, for the example in FIG. 8 the cable signature is the sum of $(107 \times 113)+(113 \times 131)$, or 26,894. This sum is then stored in RAM 88 and is converted to hexadecimal form when it is output at display 30 or printer 12 as the signature.

Adapter signatures are generated in the same way as cable signatures. As shown best in FIGS. 5B and 5C, each adapter has several terminals which are not used by the cable wiring. For example, in FIGS. 5B and 5C terminals twenty-seven through thirty-two are not connected to the cable wiring 11. As previously described, these unused terminals (those labeled "NC") are interconnected by the wiring pattern 62 in such a way that the cable connectors 13 and 15 will be compatible with the connectors 18-21 of analyzer 10. The interconnections of these unused terminals are separately scanned by the decoder 70 and multiplexer 72 and are used to generate adapter signature values. As previously mentioned, different wiring patterns such as 62a (FIG. 5B) and 62b (FIG. 5C) can be used so that different interconnections and hence different signatures will be generated for male and female adapters which are otherwise the same.

After the signatures are generated and output at the display 30 microprocessor 92 then displays the message "please verify" and causes the speaker 52 to sound an audible tone which consists, for example, of three rising notes. This signals the user that the cable analyzer has completed the learn mode and is now ready to be used in the test mode if so desired. In the alternative, as hereinafter more fully described in connection with part two, the cable analyzer can also be used at this point for purposes of documenting the cable design.

In the test mode, with the cable analyzer still turned on the cable which was used during the learn mode (referred to hereinafter as the "reference cable") is removed. Microprocessor 92 then displays the message "ready to test" signaling that subsequent cables may now be verified using the data learned from the reference cable. The next cable is plugged into the connectors and the cable analyzer then proceeds to scan and record the terminal interconnections for the cable under test using the same process that was used earlier during the learn mode. Microprocessor 92 stores the linked data list which represents the terminal interconnections for the cable under test in RAM 88. Microprocessor 92 then compares the list of terminal interconnections for the tested cable with the list of terminal interconnections previously learned from the reference cable and notes any differences between the two.

If there are differences between the two lists, microprocessor 92 stores those differences in a separate list in RAM 88 and then provides a visual indication at display 30 which indicates that errors have been detected in the tested cable. The display 30 indicates whether the error is the result of an open circuit, a short circuit or whether both types of errors were detected. Microprocessor 92 also causes the speaker 52 to sound an audible tone which also signals the presence of detected errors in the tested cable. Different tones may be used to indicate whether the detected errors resulted from open circuit conditions, short circuit conditions, or a combination of both.

The location at which each detected error occurred is output at the display unit 30 by depressing the switch 33. Each time the switch 33 is depressed, the location of one of the detected errors will be displayed in terms of the terminal interconnections where such error occurred. Upon completion of testing the cable so as to verify that it either matches or does not match the reference cable, the test mode is complete. The cable under test can then be removed and another cable can be plugged into the analyzer for purposes of testing.

It will be appreciated that microprocessor 92 could be programmed so as to implement the above-described circuit operation using any one of a variety of different programming languages and programming techniques. Attached hereto as Appendix A is one such program which was prepared for use with the 6504 microprocessor and circuit as illustrated in FIGS. 6A and 6B. The attached program comprises a listing of source code in assembly language for the 6504 microprocessor.

It is to be emphasized that the detailed schematic diagrams of FIGS. 6A and 6B and the attached program listing of Appendix A are merely representative of one example for implementing the inventive concepts described herein. The scope of the invention is described by the claims and is not intended to be limited by the specific examples of the circuit or the program listing included herewith.

Figure 7:
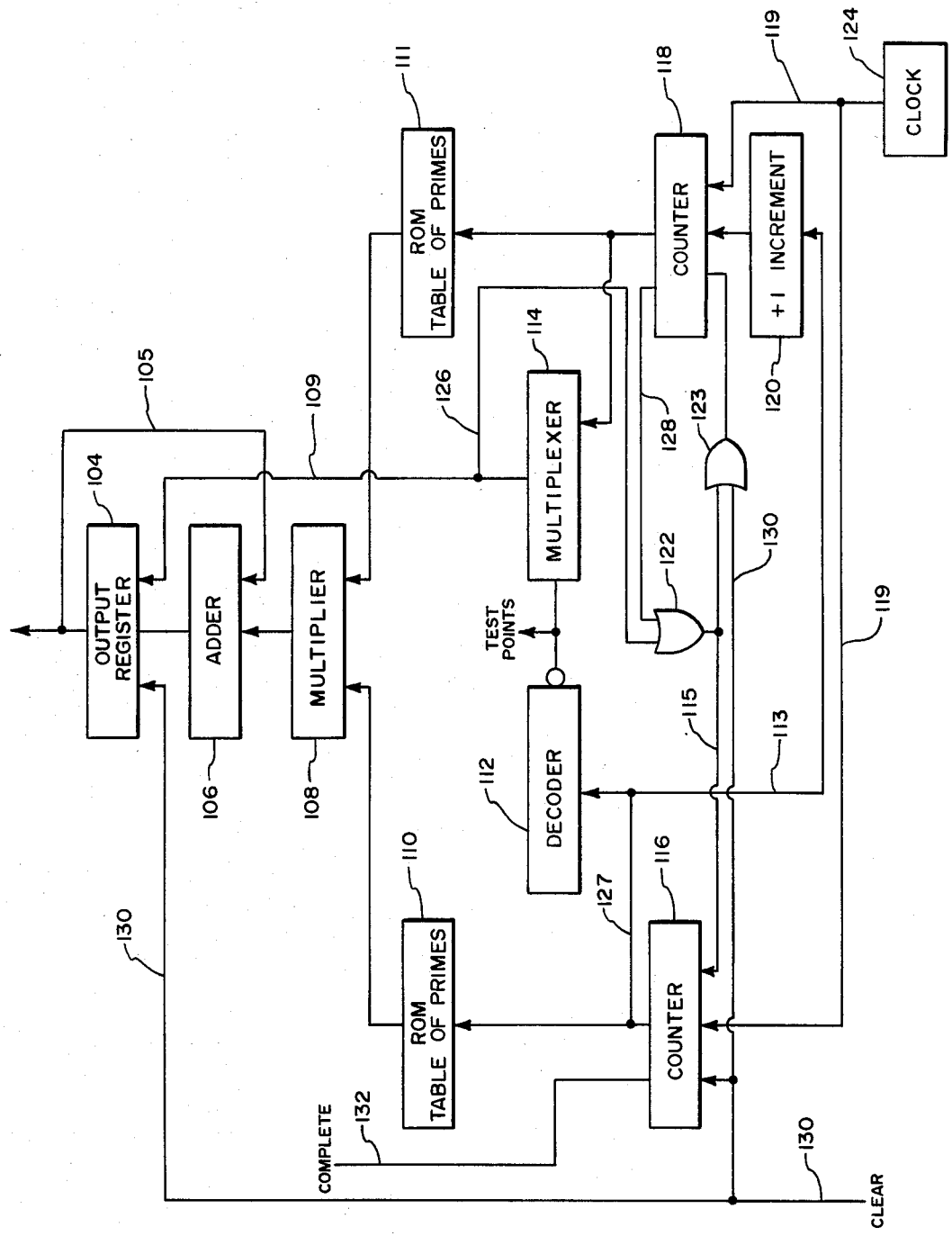
FIG. 7 is a functional block diagram which schematically illustrates another embodiment of an electronic circuit which can be used for purposes of the cable analyzer.

Another embodiment of the electronic circuit which may be used in the cable analyzer is generally illustrated in FIG. 7. In the circuit of FIG. 7, all of the interconnecting lines represent parallel data input paths except for lines 109, 119, 130, 132 and the input/output lines of OR-gates 122 and 123.

As shown in FIG. 7, a clock 124 is connected as schematically indicated at 119 to counters 116 and 118. Clock 124 provides a clock pulse used for purposes of periodically incrementing the count of each counter. As schematically indicated at line 127, the count from counter 116 is input to decoder 112. The count from counter 116 is used to determine which test point will be selected by decoder 112, which then drives the selected test point to a logical low signal level in the same manner as previously described in connection with decoder 70 of FIG. 6.

The count from counter 116 is also input, as indicated at line 113, to a unit adder 120 which increments the count by one. The incremented count is input from counter 118 to multiplexer 114 so that multiplexer 114 will begin scanning at the terminal that is next in numerical sequence to the test point selected by decoder 112.

If the terminal scanned by multiplexer 114 has a low signal level on it, it is connected in common to the test point selected by decoder 112. The low signal detected by multiplexer 114 is input as indicated at 126 to an OR-gate 122. OR-gate 122 enables counter 116 through line 115 when either a common connection has been found, which is sensed on line 126, or when the multiplexer has finished scanning the remaining terminals, which is sensed on line 128 when counter 118 finishes its count. The output of OR-gate 122 is also connected to another OR-gate 123 which preloads counter 118 each time the count of counter 116 is incremented. The process can then be repeated for the next test point.

If the terminal scanned by multiplexer 114 is not connected in common so that it does not contain a low signal level, OR-gate 122 is disabled so that counter 116 is not incremented. Meanwhile counter 118 continues to count so that multiplexer 114 will scan the next terminal in the sequence.

When the multiplexer 114 determines a common connection, counters 116 and 118 are caused by OR-gate 122 to access the table of prime numbers stored in ROM 110 and ROM 111, respectively. The table of prime numbers stored in ROM 110 are indexed by the value from counter 116, and thus correspond to the $P_i$ array previously described. The table of prime numbers stored in ROM 111 are indexed by the value of counter 111, and correspond to the $P_{Ri}$ array.

The prime numbers from ROM 110 and ROM 111 are input to a multiplier 108 where the prime numbers are multiplied. The product of the two prime numbers is then input to an adder 106 which then adds that product to any previously calculated sum stored in register 104. For example, each time multiplexer 114 detects a common connection on line 109, register 104 inputs on line 105 the sum stored therein to adder 106. That sum is then added to the product from multiplier 108, thus updating the sum of the products. Accordingly, after all the test points have been scanned the value contained in register 104 will correspond to the sum of the products of $P_i$ and $P_{Ri}$.

When counter 116 reaches the last test point, a signal is provided as indicated on line 132 which indicates completion of the learn mode. The signature value from output register 104 can then be input to a display unit 30. Counters 116 and 118 and output register 104 can be cleared by a signal input as indicated at lines 130 so that the circuit can be used for checking the terminal interconnections of the next cable.

As can be appreciated from the circuit illustrated and described in connection with FIG. 7, the electronic circuitry of analyzer 10 can be implemented in a variety of different ways. The system and method of the present invention are especially designed so that in the event one or more errors are detected in a cable, the resulting signature of the defective cable will not match the cable signature that is documented for the correct cable design.

The mathematical expression used in the system and method of this invention positively assures that the defective cable will have a different signatre value if the defective cable has up to three errors or if there is an odd number of errors which occur in the defective cable. While there is a possibility that under some circumstances the defective cable could generate a signature value that matches the cable signature of a documented design, the probability of an erroneous match occurring is very small. For example, if a defective cable had four errors in it, the probability of generating a signature for the defective cable which would match the cable signature of the documented design would be about one in eight million.

The above-described mathematical expression is able to effectively minimize the possibility of incorrectly duplicating a correct signature value from a defective cable because of the way in which the prime numbers are manipulated. Since the product of two prime numbers is always an odd number, and since the sum of an even number of odd numbers always results in an even number whereas the sum of an odd number of odd numbers always results in an odd number, cable signatures will be odd or even values depending upon whether the cable design has an odd or even number of terminal interconnections.

Therefore, whenever a defective cable has an odd number of errors in it, the signature for the defective cable will be the opposite of the signature documented for that cable design. For example, if the documented cable signature is even, the defective cable will have an odd signature value and vice versa.

The above-described mathematical expression is intended to be only illustrative and any mathematical relation which effectively minimizes the probability of incorrectly duplicating a documented cable signature could be used for purposes of the system and method of the present invention.

Reference is next made to part two of the description, wherein the method of the present invention is described in greater detail.

II. The Method

The method of the present invention is best understood by reference to FIG. 1. After a cable having a new design has been constructed, it is important to document the new cable design for future reference. The new cable is plugged into the cable analyzer 10 using the appropriate adapters 22 and then switch 32 is turned on so as to place the cable analyzer 10 in the learn mode.

The microprocessor 92 then proceeds to scan each of the terminal positions as described earlier so that a list is stored in the RAM 88 which describes the common terminal interconnections. Microprocessor 92 then proceeds to generate the cable signature and adapter signatures which are also stored in RAM 88. As described in part one above, after the cable and adapter signatures have been generated and stored in RAM 88, the microprocessor 92 displays a message at display 30 which reads "please verify." Microprocessor 92 also causes speaker 52 to sound an audible tone such as a series of three rising notes which serve to indicate that the terminal interconnections for the new cable have been learned.

The terminal interconnections, cable signature and adapter signatures can be quickly documented using the printer 12. By pressing the display advance switch 33, the cable and adapter signatures stored in RAM 88 and the list of terminal interconnections stored in RAM 88 are output by microprocessor 92 and printed at printer 12. The format for the printed documentation is illustrated in FIG. 9.

As shown in FIG. 9, the documentation includes cable signature 98 and the adapter signatures 100-101 which correspond to the adapters used at the selected adapter positions. As previously described, each of the signatures 98, 100 and 101 may be represented, for example, in hexadecimal form.

The list of terminal interconnections is printed as generally indicated at 102. The list identifies each adapter position, as for example J1 and J3, as well as the common connections which are detected by the cable analyzer. Thus, as illustrated in FIG. 9, for a cable which is connected to the cable analyzer at adapter positions J1 and J3, the common terminal connections between the J1 and J3 positions may be documented as follows: terminal 01 of J1 connected to terminal 02 of J3; terminal 02 of J1 connected to terminal 04 of J3; terminal 03 of J1 connected to terminal 06 of J3, and so on.

The documentation format printed by printer 12 may also include additional space as indicated at 103 and at 99 which can be used to record other information such as designated part numbers, connector descriptions or other pertinent information which may be desired for purposes of fully documenting the cable design.

If the optional printer 12 is not used with the cable analyzer, the documentation may be prepared by hand. In order to do so, the display advance switch 33 is depressed which causes the cable signature to appear at the display 30. The next time the display advance switch 33 is depressed, the adapter signature for the first adapter position is displayed. Switch 33 is again depressed in order to display the adapter signature for the second adapter position. Thereafter, the cable analyzer will begin to display the sequence of terminal interconnections so that by using the switch 33 the entire list of terminal interconnections can be displayed in sequence. In this manner, each of the signature values as well as the list of terminal interconnections can be read from display 30 and recorded by hand.

After the cable design has been recorded, the documentation is filed as indicated at 40 in a loose leaf binder 14 or other suitable filing system. As described more fully below, the recorded documentation is later used to verify the reference cable when a subsequent batch of cables has been manufactured in accordance with the documented design.

When a subsequent batch of cables has been manufactured the cable analyzer 10 can be used to quickly verify that each cable in the batch has the proper terminal interconnections as specified in the documented cable design. The first cable in the batch is used as a reference cable. The reference cable is plugged into the cable analyzer 10 using the appropriate adapters 22 which are positioned at the proper adapter positions, as for example J1 and J3, which correspond to connectors 19 and 21. Switch 32 is then turned on placing the cable analyzer 10 in the learn mode.

Microprocessor 92 then proceeds to scan and learn each of the terminal interconnections using the same process which has been described above. After the terminal interconnections of the reference cable have been learned and stored in RAM 88, the cable and adapter signature values are generated and stored in RAM 88. Microprocessor 92 then displays the cable signature of the reference cable along with the message "please verify" and sounds the audible tone which signals that the learn mode is complete. The user then checks the cable signature which is output at display 30 with the cable signature 98 (see FIG. 9) which was previously printed and documented in the loose leaf filing system 14.

If the cable signature values match, the reference cable will have the same design as that which was documented, including the same terminal interconnections, adapters and adapter positions. If the cable signature at the display 30 does not match the cable signature 98 which was previously documented for that cable design, the user may proceed to verify whether proper adapters 22 have been used and whether the adapters were connected at the proper positions of the cable analyzer 10. This may be done by depressing the display advance switch 33 so as to output in sequence each adapter signature at the display 30. If the adapter signatures at display 30 match the adapter signatures 100-101 documented for the cable design, the user then knows that the signature of the reference cable doesn't match the documented signature because the reference cable has improper terminal connections. The user may discard that cable so that another cable from the batch may be verified and used as the reference cable.

Once the cable signature of the reference cable has been verified so that it matches the documented cable signature for the intended design, the remaining cables in the batch can be very quickly tested to verify proper design. In order to do so, the reference cable is removed from the cable analyzer. Microprocessor 92 then displays the message "ready to test" at display 30. The next cable from the batch is then plugged into the cable analyzer and microprocessor 92 proceeds to learn the terminal interconnections for that cable. The terminal interconnections for the cable under test are stored in RAM 88 and microprocessor 92 then compares the list of terminal interconnections for the cable under test with the list of terminal interconnections previously learned from the reference cable.

If there are any differences between the two lists, microprocessor 92 displays an appropriate error message. For example, if terminal interconnections are missing, the error message "opens detected" is displayed. If interconnections are shorted together, the message "short detected" is displayed. If the wrong terminals were connected in common the message "errors detected" is displayed. The system user can then either print a list of such differences identified in terms of the terminal interconnections where the errors were detected, or if the optional printer 12 is not used then the system user can sequentially display the list of differences by sequentially depressing the display advance switch 33.

If the list of terminal interconnections stored in RAM 88 for the cable under test matches the list of terminal interconnections for the reference cable, microprocessor 92 outputs at display 30 the message "good cable" thus indicating that the cable under test has the proper design.

As indicated above, the system and method of the present invention may be embodied in other specific forms without departing from its spirit or essential characteristics. The embodiments and examples described herein are to be considered in all respects only as illustrative and not restrictive, and the scope of the invention is therefore indicated by the appended claims rather than by the foregoing description. All changes which come within the meaning and range of equivalency of the claims are to be embraced within their scope.

```
1 ; SIGNATURE 1000 PROGRAM DOCUMENTATION
2 ***********************************************************************
3 ; SIGNATURE 1000 PROGRAM DOCUMENTATION
4 ; HIGH LEVEL LANGUAGE DESCRIPTION (PSEUDO CODE)
5 ; COPYRIGHT 1983, MARLIN C. SHELLEY
6 ***********************************************************************
7 ;
8 ; MAIN PROGRAM PSEUDO CODE:
9 ;
10 ; SELF TEST & INITIALIZATION
11 ; DO LABEL PINS
12 ; DO COMPUTE ADAPTER SIGNATURES
13 ; DO LEARN CABLE
14 ; LOOP DOING CABLE TEST
15 ; END.
16 ;
17 ;
18 ; PSEUDO CODE CABLE TEST:
19 ;
20 ; CHECK CABLE
21 ; IF DISPLAY ADVANCE KEY DEPRESSED
22 ;     THEN DO DISPLAY OR PRINT RESULTS
23 ; RETURN
24 ;
25 ;
26 ; LABEL PINS PSEUDO CODE:
27 ;
28 ; THIS ROUTINE REPEATED FOR ALL CONNECTOR POSITIONS IN USE:
29 ; SET PIN 31 LOW
30 ; IF PIN LOW ON RIGHT
31 ;     THEN LABEL PINS ON RIGHT UP PIN THAT IS LOW
32 ;         IF PIN LOW ON LEFT
33 ;             THEN CIRCULAR PIN OUT PATTERN STARTING ON RIGHT
34 ;                 LABEL PINS ON LEFT, START WITH LOW PIN, END WITH 1ST PIN ON LEFT
35 ;             ELSE RIGHT SIDE THEN LEFT SIDE PIN OUT PATTERN
36 ;                 LABEL PINS ON LEFT, START WITH 1ST LEFT, SAME QTY. AS AT RIGHT
37 ;     ELSE IF LOW ON LEFT
38 ;         THEN IF PIN 32 IS LOW
39 ;             THEN DOUBLE CONNECTOR ALT PATTERN
40 ;                 START ON RIGHT ALTERNATING UP TO PIN 62. 31 & 32
41 ;             ELSE ALTERNATING PATTERN START ON RIGHT
42 ;                 LABEL ALL PINS STARTING ON RIGHT UP TO LOW PIN
43 ;         ELSE SET PIN 32 LOW
44 ;             IF PIN LOW ON LEFT
45 ;                 THEN LABEL PINS ON LEFT UP TO LOW PIN
46 ;                     IF LOW ON RIGHT PIN
47 ;                         THEN CIRCULAR PATTERN STARING ON LEFT
48 ;                             LABEL PINS ON RIGHT FROM LOW PIN BACK TO 1ST PIN
49 ;                         ELSE LEFT SIDE THEN RIGHT SIDE PATTERN
50 ;                             LABEL PINS ON RIGHT AS MANY AS AT LEFT
51 ;                 ELSE IF LOW PIN ON RIGHT
52 ;                     THEN ALTERNATING PATTERN STARTING ON LEFT
53 ;                         LABEL ALL PINS UP TO LOW PIN STARTING AT LEFT
54 ;                     ELSE ALTERNATING PATTERN STARTING ON RIGHT
55 ;                         LABEL ALL PINS THROUGH 30 ON THE SAME CONNECTOR
56 ; RETURN
57 ;
58 ;
59 ; COMPUTE ADAPTER SIGNATURES PSEUDO CODE:
60 ;
61 ; THIS ROUTINE REPEATED FOR ALL CONNECTOR POSITIONS IN USE:
62 ; DO READ ROUTINE
63 ; PREPARE LIST OF UNLABELED PIN CONNECTIONS FOR CONNECTOR POSITION
64 ; COMPUTE SIGNATURE
65 ; SAVE SIGNATURE FOR FUTURE DOCUMENTATION
66 ; RETURN
67 ;
68 ;
69 ; COMPUTE SIGNATURE PSEUDO CODE:
70 ;
71 ; INITIALIZE SIGNATURE
```

```
 72 ; INITIALIZE INDEX = 0
 73 ; FOR EACH ELEMENT IN LIST:
 74 ;     GET VALUE AT INDEX IN LIST LIST(INDEX)
 75 ;     IF VALUE LIST(INDEX) IS ZERO
 76 ;         THEN DONE WITH THIS ELEMENT
 77 ;         ELSE USE INDEX TO SELECT PRIME NUMBER. A = PRIME(INDEX)
 78 ;             USE VALUE FROM LIST TO SELECT A PRIME NO. B = PRIME(LIST(INDEX))
 79 ;             ACCUMULATE PRODUCT INTO SIG. SIGNATURE = (A X B) + SIGNATURE
 80 ; RETURN AFTER LAST ELEMENT
 81 ;
 82 ;
 83 ; LEARN CABLE PSEUDO CODE:
 84 ;
 85 ; DO READ CABLE
 86 ; COMPUTE SIGNATURE
 87 ; DISPLAY SIGNATURE
 88 ; IF NO CABLE PRESENT
 89 ;     THEN DISPLAY "READY TO LEARN"
 90 ;         LOOP BACK TO START OF THIS ROUTINE
 91 ;     ELSE IF CHANGE IN INTERCONNECTIONS IN LAST 6 SECONDS
 92 ;             THEN DISPLAY "LEARNING CABLE"
 93 ;                 LOOP BACK TO START OF THIS ROUTINE
 94 ;             ELSE SAVE READ LIST AS LEARNED LIST
 95 ;                 SOUND ACCEPTANCE TONES
 96 ;                 DISPLAY SIGNATURE & "PLEASE VERIFY"
 97 ;                 WAIT FOR NO CABLE OR DISPLAY ADVANCE SWITCH
 98 ; RETURN
 99 ;
100 ;
101 ; CHECK CABLE PSEUDO CODE:
102 ;
103 ; READ CABLE
104 ; IF DIFFERENT INTERCONNECTIONS
105 ;     THEN COMPUTE SIGNATURE
106 ;         DISPLAY SIGNATURE
107 ;         CASE:
108 ;             NO CABLE
109 ;                 DISPLAY "READY TO TEST"
110 ;
111 ;             GOOD CABLE
112 ;                 DISPLAY "GOOD CABLE"
113 ;                 SOUND CLICK
114 ;
115 ;             BAD CABLE
116 ;                 DO ERROR ROUTINE
117 ;
118 ;     ELSE CASE:
119 ;             NO CABLE
120 ;                 NO OPERATION
121 ;
122 ;             GOOD CABLE
123 ;                 SOUND CLICK
124 ;
125 ;             BAD CABLE
126 ;                 IF 3 SECONDS SINCE LAST ERROR TONES
127 ;                     THEN DO ERROR ROUNTINE
128 ; RETURN
129 ;
130 ;
131 ; ERROR ROUTINE PSEDUO CODE:
132 ;
133 ; CASE
134 ;     OPEN
135 ;         DISPLAY "OPEN DETECTED"
136 ;         SOUND 1 ERROR TONE
137 ;
138 ;     SHORT
139 ;         DISPLAY "SHORT DETECTED"
140 ;         SOUND 2 ERROR TONES
141 ;
142 ;     OPEN AND SHORT
```

```
143 ;      DISPLAY "ERRORS DETECTED"
144 ;      SOUND 3 ERROR TONES
145 ;
146 ; RETURN
147 ;
148 ;
149 ; DISPLAY OR PRINT RESULTS PSEUDO CODE:
150 ;
151 ; IF PRINTER READY
152 ;    THEN SEND INFORMATION TO PRINTER
153 ;         IF BUSY TOO LONG THEN TIME OUT
154 ;
155 ;    ELSE SEND INFORMATION IN PIECES TO DISPLAY
156 ;         WITH EACH DISPLAY ADVANCE DEPRESSION
157 ;         UNTIL END OF INFORMATION OR NO CABLE DETECTED
158 ; RETURN
159 ;
160 ;
161 ; READ ROUTINE PSEUDO CODE:
162 ;
163 ; CLEAR FLAGS
164 ; DO FOR EACH PIN (TERMINATION POINT) IN SEQUENCE
165 ;    BRING DECODE PIN LOW
166 ;    SET PIN TO TEST TO ONE PIN AHEAD OF LOW DECODE PIN
167 ;    TEST, INCREMENTING TEST PIN UNTIL LOW IS FOUND
168 ;    IF LOW PIN FOUND
169 ;       THEN DO FOUND CONNECT
170 ;       ELSE DO NO CONNECT
171 ;    IF NOT SAME RESULT AS LAST READ
172 ;       THEN SET CHANGE FLAG
173 ; RETURN ON READ OF LAST PIN
174 ;
175 ;
176 ; FOUND CONNECT PSEUDO CODE:
177 ;
178 ; SAVE "0" (NO CONNECT) NOTE: 128 MAY BE USED INSTEAD OF ZERO
179 ; AT DECODER PIN INDEX IN READ LIST
180 ; IF NOT SAME VALUE AS IN LEARNED LIST
181 ;    THEN SET OPEN FLAG
182 ; RETURN
183 ;
184 ;
185 ; NO CONNECT PSEUDO CODE:
186 ;
187 ; SAVE TEST PIN (MULTIPLEXER) VALUE IN READ LIST AT DECODER INDEX
188 ; CASE VALUE IN LEARNED LIST:
189 ;    NO CONNECT (ZERO)
190 ;       SET SHORT FLAG
191 ;
192 ;    SAME VALUE
193 ;       NO OPERATION
194 ;
195 ;    WRONG VALUE
196 ;       IF THIS TEST PIN IS NOT TO BE INTERCONNECTED
197 ;          THEN SET SHORT FLAG
198 ;       SET OPEN FLAG
199 ;
200 ; RETURN
201 ;

0800:         1 ; SIGNATURE 1000
0800:         2 ; ************************************************************
0800:         3 ; SIGNATURE 1000 CABLE ANALYZER PROGRAM LISTING #1
0800:         4 ; ************************************************************
0800:         5 ;
0800:         6 EFLG    EQU  $10     ; CHANGE FLAG <>0 IS CHANGE
0800:         7 CFLG    EQU  $11     ; CABLE PRESENT FLAG $FF IS PRESENT
0800:         8 PFLG    EQU  $12
0800:         9 PVECTOR EQU  $1F     ; PRINT VECTOR
0800:        10 PTR     EQU  $20     ; NET POINTER
0800:        11 PARM    EQU  $28
```

```
0800:                 12 OLIST    EQU   $280      ; READ LIST
0800:                 13 DLIST    EQU   $300      ; LEARNED LIST
0800:                 14 LLIST    EQU   $380      ; LABEL LIST
0800:                 15 SLIST    EQU   $400      ; SCRATCH LIST
0800:                 16 NLIST    EQU   $480      ; NET LIST
0800:                 17 PLIST    EQU   $500      ; ALREADY PRINTED LIST
0800:                 18 MREG     EQU   $800      ; REG TO MULTIPLEXER & PRINTER
0800:                 19 DREG     EQU   $900      ; REG TO DECODER & VIDEO
0800:                 20 STATUS   EQU   $A00      ; PRINTER BUSY & SCANNER LOW DETECT
0800:                 21 RCABLE   EQU   $F000     ; SUBROUNTINES IN LISTING #2
0800:                 22 LABLER   EQU   $F003
0800:                 23 PLINE    EQU   $F006
0800:                 24 SIGCOM   EQU   $F009
0800:                 25 PSIG     EQU   $F00C
0800:                 26 SPARM    EQU   $F00F
0800:                 27 LPARM    EQU   $F012
0800:                 28 TPG10    EQU   $F015
0800:                 29 ACONS    EQU   $F016
0800:                 30 ;
0800:                 31 ;************************************************************
F800:                 32          ORG   $F800
F800:                 33          OBJ   $C800
F800:                 34 ;************************************************************
F800:                 35 ; OUTPUT ROUTINES
F800:                 36 ; THESE ROUTINES PASS DATA TO PRINTER AND DISPLAY
F800:                 37 ;************************************************************
F800:                 38 ;
F800:                 39 TOUT     EQU   $23
F800:                 40 LSCREEN  EQU   $29
F800:                 41 VIDEO    EQU   $C00
F800:                 42 PRINTER  EQU   $B00
F800: 09 80           43 COUT     ORA   #$80
F802: 24 1F           44          BIT   PVECTOR
F804: 30 47           45          BMI   COT10     ; PRINTER BRANCH
F806: C9 8D           46          CMP   #$8D
F808: F0 0E           47          BEQ   COT04
F80A: 29 7F           48          AND   #$7F      ; DATA TO DISPLAY
F80C: 8D 00 09        49          STA   DREG
F80F: A9 40           50          LDA   #$40
F811: 8D 00 08        51          STA   MREG
F814: 8D 00 0C        52          STA   VIDEO
F817: 60              53          RTS
F818:                 54 ;
F818: A5 29           55 COT04    LDA   LSCREEN   ; LINE FEED
F81A: 29 40           56          AND   #$40
F81C: 49 40           57          EOR   #$40
F81E: 09 80           58          ORA   #$80
F820: 4C 3D F8        59          JMP   CCOUT
F823:                 60 ;
F823: A9 8D           61 CROUT    LDA   #$8D
F825: 20 00 F8        62          JSR   COUT
F828: A9 8A           63          LDA   #$8A
F82A: 24 1F           64          BIT   PVECTOR
F82C: 30 D2           65          BMI   COUT
F82E: 60              66          RTS
F82F:                 67 ;
F82F: A9 80           68 HOMET    LDA   #$80      ; TOP LINE HOME
F831: 85 29           69          STA   LSCREEN
F833: 4C 3D F8        70          JMP   CCOUT
F836:                 71 ;
F836: A9 C0           72 HOMEB    LDA   #$C0      ; BOTTOM LINE HOME
F838: 85 29           73          STA   LSCREEN
F83A: 4C 3D F8        74          JMP   CCOUT
F83D:                 75 ;
F83D: 48              76 CCOUT    PHA             ; DISPLAY COMAND OUT
F83E: 29 7F           77          AND   #$7F
F840: 8D 00 09        78          STA   DREG
F843: 68              79          PLA
F844: 4A              80          LSR
F845: 4A              81          LSR
F846: 8D 00 08        82          STA   MREG
F849: 8D 00 0C        83          STA   VIDEO
```

```
F84C: 60             84               RTS
F84D:                85 ;
F84D: 2C 00 0A       86 COT10         BIT    STATUS       ; OUTPUT TO PRINTER
F850: 30 10          87               BMI    COT20        ; BUSY BRANCH
F852: 24 23          88               BIT    TOUT
F854: 30 20          89               BMI    COT30        ; BUSY BYPASS BRANCH
F856: CA             90               DEX
F857: D0 F4          91               BNE    COT10
F859: 88             92               DEY
F85A: D0 F1          93               BNE    COT10
F85C: E6 23          94               INC    TOUT
F85E: 10 ED          95               BPL    COT10        ; NOT TIMED OUT BRANCH
F860: 30 14          96               BMI    COT30        ; TIMEOUT BRANCH
F862:                97 ;
F862: 29 7F          98 COT20         AND    #$7F         ; PRINTER OUTPUT
F864: 49 7F          99               EOR    #$7F         ; INVERT DATA FOR OUTPUT
F866: 8D 00 08      100               STA    MREG
F869: A2 01         101               LDX    #1
F86B: 8E 00 0B      102               STX    PRINTER
F86E: E8            103               INX
F86F: 8E 00 0B      104               STX    PRINTER
F872: A9 78         105               LDA    #$78         ; SET TIMEOUT
F874: 85 23         106               STA    TOUT
F876: 60            107 COT30         RTS
F877:               108 ;
F877: A9 A0         109 SPACE         LDA    #" "         "
F879: 4C 00 F8      110               JMP    COUT
F87C:               111 ;
F87C: 8A            112 SPCS          TXA
F87D: 38            113 SPC5          SEC
F87E: E9 01         114               SBC    #1
F880: 90 0A         115               BCC    SPC10        ; END BRANCH
F882: 48            116               PHA
F883: A9 20         117               LDA    #$20
F885: 20 00 F8      118               JSR    COUT
F888: 68            119               PLA
F889: 4C 7D F8      120               JMP    SPC5
F88C:               121 ;
F88C: 60            122 SPC10         RTS
F88D:               123 ;
F88D: 20 C3 FA      124               JSR    DPDATA       ; DISPLAY/PRINT RESULTS
F890:               125 ;****************************************************************
F890:               126 ; MAIN PROGRAM
F890:               127 ;****************************************************************
F890: EA            128 INT00         NOP                 ; START OF PROGRAM
F891: A2 FF         129               LDX    #$FF
F893: 9A            130               TXS    ; SET STACK POINTER
F894: D8            131               CLD
F895: A2 00         132               LDX    #0
F897: 8A            133               TXA
F898: 95 00         134 IT1           STA    0,X
F89A: E8            135               INX
F89B: D0 FB         136               BNE    IT1          ; CLEAR PAGE ZERO
F89D: A9 10         137               LDA    #$10         ; RESET DISPLAY
F89F: 20 3D F8      138               JSR    CCOUT
F8A2: A9 01         139               LDA    #1
F8A4: 20 3D F8      140               JSR    CCOUT
F8A7: 20 B7 FA      141               JSR    PAUSE
F8AA: A9 0D         142               LDA    #$D          ; DISPLAY ON
F8AC: 20 3D F8      143               JSR    CCOUT
F8AF: 20 2F F8      144               JSR    HOMET
F8B2: 20 1B F9      145               JSR    SELFT        ; SELF TEST
F8B5: 20 E9 F8      146               JSR    INITAL       ; INITIALIZE
F8B8: 20 03 F0      147               JSR    LABLER       ; LABEL PINS & COMPUTE ADP. SIG.
F8BB: 20 57 F9      148               JSR    LCABLE       ; LEARN CABLE
F8BE: 20 FB FC      149 MAN5          JSR    CABLEP
F8C1: 90 1C         150               BCC    MAN30        ; START TEST IF NO CABLE
F8C3: 20 7A FD      151               JSR    STATST
F8C6: F0 F6         152               BEQ    MAN5         ; WAIT FOR VERIFY
F8C8: 20 CB FA      153               JSR    DPDAT1       ; DO DOCUMENTATION
F8CB: A2 00         154               LDX    #0
```

```
F8CD: 8D 80 02    155            STA  OLIST
F8D0: A9 00       156 MAN10      LDA  #0
F8D2: 85 1F       157            STA  PVECTOR    ; REDIRECT OUTPUT TO DISPLAY
F8D4: 20 45 FA    158            JSR  CCABLE     ; CHECK CABLE
F8D7: 20 7A FD    159            JSR  STATST
F8DA: F0 F4       160            BEQ  MAN10      ; NO DISPLAY ADVANCE BRANCH
F8DC: 20 C3 FA    161            JSR  DPDATA     ; DISPLAY/PRINT RESULTS
F8DF: A9 00       162 MAN30      LDA  #0
F8E1: 85 28       163            STA  PARM       ; ZERO PSTACK
F8E3: 8D 80 02    164            STA  OLIST      ; FORCE DISPLAY UPDATE
F8E6: 4C D0 F8    165            JMP  MAN10      ; LOOP
F8E9:             166 ;***********************************************************
F8E9:             167 ; INITIALIZE RAM
F8E9:             168 ; INITIALIZATION SUBROUTINE
F8E9:             169 ;***********************************************************
F8E9: 20 2F F8    170 INITAL     JSR  HOMET
F8EC: A2 26       171            LDX  #38        ; PRINT HEADING
F8EE: 20 06 F0    172            JSR  PLINE
F8F1: 20 BD FA    173            JSR  LPAUSE
F8F4: 20 BD FA    174            JSR  LPAUSE
F8F7: 20 BD FA    175            JSR  LPAUSE
F8FA: 20 2F F8    176            JSR  HOMET
F8FD: A2 18       177            LDX  #24        ; PRINT COPYRIGHT
F8FF: 20 06 F0    178            JSR  PLINE
F902: A2 00       179            LDX  #0
F904: A9 80       180 ITA        LDA  #$80
F906: 9D 00 03    181            STA  DLIST,X    ; CLEAR LEARNED LIST
F909: E8          182            INX
F90A: 10 F8       183            BPL  ITA
F90C: A2 00       184            LDX  #0
F90E: 8A          185 ITO        TXA
F90F: A9 00       186            LDA  #0
F911: 9D 80 03    187            STA  LLIST,X    CLEAR LABELS
F914: E8          188            INX
F915: 10 F7       189            BPL  ITO
F917: 20 BD FA    190            JSR  LPAUSE
F91A: 60          191            RTS
F91B:             192 ;
F91B:             193 ;***********************************************************
F91B:             194 ; TEST SCANNER
F91B:             195 ; SELFTEST ON POWER UP SUBROUTINE
F91B:             196 ;***********************************************************
F91B:             197 ; LOCAL VARIABLES
F91B:             198 TPTR       EQU  1
F91B: A2 00       199 SELFT      LDX  #0         ; START WITH FIRST PIN
F91D: 86 01       200            STX  TPTR
F91F: A6 01       201 INT10      LDX  TPTR       ; INPUT POINTER
F921: A4 01       202            LDY  TPTR       ; OUTPUT POINTER
F923: 8C 00 09    203            STY  DREG
F926: 8E 00 08    204            STX  MREG
F929: 2C 00 0A    205            BIT  STATUS
F92C: 50 18       206            BVC  INT210     ; NO HIGH BRANCH
F92E: C8          207 INT20      INY
F92F: 10 04       208            BPL  INT30
F931: 98          209            TYA
F932: 29 7F       210            AND  #$7F
F934: A8          211            TAY            ; GET RID OF MSB
F935: C4 01       212 INT30      CPY  TPTR
F937: F0 0D       213            BEQ  INT210     ; NO LOW BRANCH
F939: 8C 00 09    214            STY  DREG
F93C: 2C 00 0A    215            BIT  STATUS
F93F: 70 ED       216            BVS  INT20      ; ***KEEP LOOKING FOR HIGH BRANCH
F941: E6 01       217            INC  TPTR      ; KEEP CHECKING OUTPUTS BRANCH
F943: 10 DA       218            BPL  INT10
F945: 60          219            RTS
F946:             220 ;
F946: 20 2F F8    221 INT210     JSR  HOMET
F949: A2 2A       222            LDX  #42        ; "SCANNER FAILURE"
F94B: 20 06 F0    223            JSR  PLINE
F94E: 20 BD FA    224            JSR  LPAUSE
F951: 20 BD FA    225            JSR  LPAUSE
F954: 4C 90 F8    226            JMP  INT00      ; RESTART
```

```
F957:           227 ;
F957:           228 ;
F957:           229 ;************************************************************************
F957:           230 ; LEARN CABLE
F957:           231 ; CREATES LEARNED LIST (DLIST)
F957:           232 ;************************************************************************
F957:           233 ; LOCAL VARIABLES:
F957:           234 LTIME     EQU  1
F957: A2 28     235 LCABLE    LDX  #40            ; "READY TO LEARN"
F959: 20 06 F0  236           JSR  PLINE
F95C: A9 F8     237 LDC10     LDA  #$F8           ; SET SETTLE TIME
F95E: 85 01     238           STA  LTIME
F960: 20 00 F0  239 LDC20     JSR  RCABLE         ; READ CABLE
F963: 20 EA FA  240           JSR  PDSIG          ; DISPLAY SIGNATURE
F966: 20 36 F8  241           JSR  HOMEB
F969: 24 12     242           BIT  PFLG
F96B: 10 EA     243           BPL  LCABLE         ; NO CABLE BRANCH
F96D: A2 1C     244           LDX  #28            ; "LEARNING CABLE"
F96F: 20 06 F0  245           JSR  PLINE
F972: A5 11     246           LDA  CFLG
F974: D0 E6     247           BNE  LDC10          ; CABLE CHANGING BRANCH
F976: E6 01     248           INC  LTIME
F978: D0 E6     249           BNE  LDC20          ; CABLE NOT STABLE LONG ENOUGH BRANCH
F97A: A2 00     250           LDX  #0             ; TRANSFER LAST LIST TO DEFINITION LIST
F97C: BD 80 02  251 LDC30     LDA  OLIST,X
F97F: 9D 00 03  252           STA  DLIST,X
F982: E8        253           INX
F983: 10 F7     254           BPL  LDC30          ; SAVE 0 TO $80
F985: 20 AB FA  255           JSR  CONGRT
F988: 20 36 F8  256           JSR  HOMEB
F98B: A2 30     257           LDX  #48
F98D: 20 06 F0  258           JSR  PLINE          "PLEASE VERIFY"
F990:           259 ;************************************************************************
F990:           260 ; CREATE NET LIST (NLIST)
F990:           261 ; ENTRIES TO NETS IN DLIST
F990:           262 ; SORTED BY VALUE OF LABEL (LLIST)
F990:           263 ;************************************************************************
F990:           264 ; LOCAL VARIABLES:
F990:           265 BESTL     EQU  3
F990:           266 BESTX     EQU  4
F990:           267 SCHANGE   EQU  5
F990: A0 00     268           LDY  #0             ; TRANSFER LEARNED LIST TO SCRATCH
F992: A2 00     269           LDX  #0
F994: BD 00 03  270 CNL10     LDA  DLIST,X
F997: 9D 00 04  271           STA  SLIST,X
F99A: E8        272           INX
F99B: 10 F7     273           BPL  CNL10
F99D: A2 00     274           LDX  #0
F99F: BD 00 04  275 CNL15     LDA  SLIST,X
F9A2: F0 32     276           BEQ  CNL50          ; CLEARED NET BRANCH
F9A4: 30 26     277           BMI  CNL40          ; NO CONNECT BRANCH
F9A6: BD 80 03  278           LDA  LLIST,X
F9A9: F0 05     279           BEQ  CNL20          ; NO LABEL BRANCH
F9AB: 8A        280           TXA
F9AC: 99 80 04  281           STA  NLIST,Y        ; SAVE IN NET LIST
F9AF: C8        282           INY
F9B0: 8A        283 CNL20     TXA                 ; CLEAR UNLABELED LINKED LIST
F9B1: 48        284           PHA
F9B2: BD 00 04  285 CNL30     LDA  SLIST,X
F9B5: 30 0B     286           BMI  CNL35          ; CLEAR LAST BRANCH
F9B7: 48        287           PHA                 ; HOLD NEXT POINT
F9B8: A9 00     288           LDA  #0             ; CLEAR PRESENT POINT
F9BA: 9D 00 04  289           STA  SLIST,X
F9BD: 68        290           PLA
F9BE: AA        291           TAX
F9BF: 4C B2 F9  292           JMP  CNL30          ; FETCH NEXT POINT
F9C2:           293 ;
F9C2: A9 00     294 CNL35     LDA  #0             ; LAST CLEAR
F9C4: 9D 00 04  295           STA  SLIST,X
F9C7: 68        296           PLA                 ; GET POINTER
F9C8: AA        297           TAX
```

```
F9C9: 4C D6 F9      298           JMP   CNL50
F9CC:               299 ;
F9CC: BD 80 03      300 CNL40     LDA   LLIST,X      ; CLEAR UNLABELED POINTS
F9CF: D0 05         301           BNE   CNL50        ; LABEL BRANCH
F9D1: A9 00         302           LDA   #0
F9D3: 9D 00 04      303           STA   SLIST,X
F9D6: E8            304 CNL50     INX                ; GET NEXT NET
F9D7: 10 C6         305           BPL   CNL15        ; CONTINUE BRANCH
F9D9: 98            306           TYA
F9DA: 48            307           PHA                ; SAVE EOF
F9DB: A9 FF         308           LDA   #$FF
F9DD: 99 80 04      309           STA   NLIST,Y      ; EOF MARKER
F9E0: 20 18 FA      310           JSR   SORTL
F9E3: 68            311           PLA                ; GET END OF NLIST POINTER
F9E4: A8            312           TAY
F9E5: A2 FF         313 CNL52     LDX   #$FF         ; FIND UNUSED POINT
F9E7: 86 03         314           STX   BESTL        ; CLEAR BEST
F9E9: E8            315           INX
F9EA: BD 00 04      316 CNL55     LDA   SLIST,X
F9ED: F0 0B         317           BEQ   CNL57        ; CLEARED NET BRANCH
F9EF: BD 80 03      318           LDA   LLIST,X
F9F2: C5 03         319           CMP   BESTL
F9F4: B0 04         320           BCS   CNL57        ; LESS THAN BRANCH
F9F6: 85 03         321           STA   BESTL
F9F8: 86 04         322           STX   BESTX
F9FA: E8            323 CNL57     INX
F9FB: 10 ED         324           BPL   CNL55        ; CONTINUE TO END BRANCH
F9FD: A5 03         325           LDA   BESTL        ; SORT AND ADD UNCONNECTED TEST POINTS
F9FF: C9 FF         326           CMP   #$FF
FA01: B0 0F         327           BCS   CNL60        ; END NO. POINTS LEFT BRANCH
FA03: A6 04         328           LDX   BESTX
FA05: A9 00         329           LDA   #0
FA07: 9D 00 04      330           STA   SLIST,X      ; CLEAR POINT USED
FA0A: 8A            331           TXA
FA0B: 99 80 04      332           STA   NLIST,Y
FA0E: C8            333           INY
FA0F: 4C E5 F9      334           JMP   CNL52        ; FETCH NEXT POINT
FA12:               335 ;
FA12: A9 FF         336 CNL60     LDA   #$FF
FA14: 99 80 04      337           STA   NLIST,Y      ; SAVE EOF MARKER
FA17: 60            338           RTS
FA18:               339 ;
FA18:               340 ;****************************************************************
FA18:               341 ; SORT NLIST
FA18:               342 ; ORDER BY LOWEST TO HIGHEST IN LLIST
FA18:               343 ;****************************************************************
FA18: A2 00         344 SORTL     LDX   #0           ; CLEAR SORT CHANGE FLAG
FA1A: 86 05         345           STX   SCHANGE
FA1C: BC 81 04      346 SRL10     LDY   NLIST+1,X
FA1F: 30 1F         347           BMI   SRL30        ; EOF BRANCH
FA21: B9 80 03      348           LDA   LLIST,Y
FA24: BC 80 04      349           LDY   NLIST,X      ; GET NEXT LABEL
FA27: 30 17         350           BMI   SRL30
FA29: D9 80 03      351           CMP   LLIST,Y
FA2C: B0 0F         352           BCS   SRL20        ; SMALLER BRANCH
FA2E: E6 05         353           INC   SCHANGE      ; SET SORT FLAG
FA30: BD 80 04      354           LDA   NLIST,X      ; SWAP POINTERS
FA33: BC 81 04      355           LDY   NLIST+1,X
FA36: 9D 81 04      356           STA   NLIST+1,X
FA39: 98            357           TYA
FA3A: 9D 80 04      358           STA   NLIST,X
FA3D: E8            359 SRL20     INX
FA3E: 10 DC         360           BPL   SRL10        ; ADVANCE IN LIST BRANCH
FA40:               361 ;
FA40: A6 05         362 SRL30     LDX   SCHANGE      ; END OF PASS
FA42: D0 D4         363           BNE   SORTL        ; SORT NOT DONE BRANCH
FA44: 60            364           RTS
FA45:               365 ;
FA45:               366 ;****************************************************************
FA45:               367 ; CHECK CABLE
FA45:               368 ;****************************************************************
FA45:               369 TSOUND    EQU   $24
```

```
FA45: 20 00 F0    370 CCABLE    JSR  RCABLE    ; READ CABLE
FA48: A5 11       371           LDA  CFLG
FA4A: D0 35       372           BNE  CCB50     ; BRANCH IF CHANGE
FA4C: 24 12       373           BIT  PFLG
FA4E: 10 07       374           BPL  CCB15     ; CABLE NOT PRESENT BRANCH
FA50: A5 10       375           LDA  EFLG      ; CABLE PRESENT
FA52: D0 04       376           BNE  CCB10     ; BRANCH ON ERROR
FA54: 4C B1 FA    377           JMP  CLICK     ; GOOD CABLE CLICK
FA57: 60          378 CCB15     RTS
FA58:             379 ;
FA58:             380 ;
FA58: C6 24       381 CCB10     DEC  TSOUND    ; CHECK TIMOUT
FA5A: 10 FB       382           BPL  CCB15     ; NOT TIME TO REPEAT BRANCH
FA5C: A9 0A       383 CCB20     LDA  #10
FA5E: 85 24       384           STA  TSOUND
FA60: 20 36 F8    385           JSR  HOMEB
FA63: 24 10       386           BIT  EFLG      ; ERROR TYPE TEST
FA65: 30 08       387           BMI  CCB30     ; SHORTS BRANCH
FA67: A2 20       388           LDX  #32       ; OPEN DETECT
FA69: 20 06 F0    389           JSR  PLINE
FA6C: 4C 99 FA    390           JMP  ERROR1
FA6F:             391 ;
FA6F: 70 08       392 CCB30     BVS  CCB40     ; COMBINATION ERRORS
FA71: A2 1E       393           LDX  #30       ; "SHORT DETECTED"
FA73: 20 06 F0    394           JSR  PLINE
FA76: 4C 9F FA    395           JMP  ERROR2
FA79:             396 ;
FA79: A2 22       397 CCB40     LDX  #34       ; "ERRORS DETECTED"
FA7B: 20 06 F0    398           JSR  PLINE
FA7E: 4C A5 FA    399           JMP  ERROR3
FA81:             400 ;
FA81: 20 EA FA    401 CCB50     JSR  PDSIG     ; DISPLAY SIGNATURE
FA84: 20 36 F8    402           JSR  HOMEB
FA87: A2 1A       403           LDX  #26       ; "READY TO TEST"
FA89: 24 12       404           BIT  PFLG
FA8B: F0 09       405           BEQ  CCB60     ; NO CABLE CABLE BRANCH
FA8D: A5 10       406           LDA  EFLG
FA8F: D0 CB       407           BNE  CCB20     ; ERROR BRANCH
FA91: 20 B1 FA    408           JSR  CLICK     ; GOOD CABLE CLICK
FA94: A2 24       409           LDX  #36
FA96: 4C 06 F0    410 CCB60     JMP  PLINE
FA99:             411 ;
FA99:             412 ;****************************************************************
FA99:             413 ; SOUND/PAUSE GENERATOR SUBROUTINES
FA99:             414 ; NO REGISTERS OR MEMORY ALTERED
FA99:             415 ;****************************************************************
FA99: 48          416 ERROR1    PHA                ; ONE ERROR TONE
FA9A: A9 01       417           LDA  #1
FA9C: 4C 15 F0    418           JMP  TPG10
FA9F:             419 ;
FA9F: 48          420 ERROR2    PHA                ; 2 ERROR TONES
FAA0: A9 02       421           LDA  #2
FAA2: 4C 15 F0    422           JMP  TPG10
FAA5:             423 ;
FAA5: 48          424 ERROR3    PHA                ; 3 ERROR TONES
FAA6: A9 03       425           LDA  #3
FAA8: 4C 15 F0    426           JMP  TPG10
FAAB:             427 ;
FAAB: 48          428 CONGRT    PHA                ; ACCEPTANCE TONES
FAAC: A9 08       429           LDA  #8
FAAE: 4C 15 F0    430           JMP  TPG10
FAB1:             431 ;
FAB1: 48          432 CLICK     PHA                ; CLICK
FAB2: A9 FD       433           LDA  #$FD
FAB4: 4C 15 F0    434           JMP  TPG10
FAB7:             435 ;
FAB7: 48          436 PAUSE     PHA                ; SHORT PAUSE
FAB8: A9 FE       437           LDA  #$FE
FABA: 4C 15 F0    438           JMP  TPG10
FABD:             439 ;
FABD: 48          440 LPAUSE    PHA                ; LONG PAUSE
FABE: A9 FF       441           LDA  #$FF
```

```
FAC0: 4C 15 F0    442           JMP   TPG10
FAC3:             443 ;
FAC3:             444 ; ************************************************************
FAC3:             445 ; DISPLAY/PRINT RESULTS
FAC3:             446 ; ************************************************************
FAC3: A5 12       447 DPDATA    LDA   PFLG
FAC5: F0 22       448           BEQ   DPD40          ; IGNORE IF NO CABLE PRESENT
FAC7: A5 10       449           LDA   EFLG
FAC9: D0 0F       450           BNE   DPD20          ; ERROR RETURN TEMP
FACB: 2C 00 0A    451 DPDAT1    BIT   STATUS
FACE: 10 07       452           BPL   DPD10          ; BRANCH IF PRINTER BUSY
FAD0: A9 FF       453           LDA   #$FF
FAD2: 85 1F       454           STA   PVECTOR        ; DIRECT DATA TO PRINTER
FAD4: 4C F8 FA    455           JMP   PRCABL         ; PRINT CABLE DOCUMENTATION
FAD7:             456 ;
FAD7: 4C B0 FB    457 DPD10     JMP   DSCABL         ; DISPLAY CABLE DOCUMENTATION
FADA:             458 ;
FADA: 2C 00 0A    459 DPD20     BIT   STATUS
FADD: 30 03       460           BMI   DPD30          ; BRANCH IF PRINTER READY
FADF: 4C 39 FE    461           JMP   DERROR         ; PRINT ERRORS
FAE2:             462 ;
FAE2: A9 FF       463 DPD30     LDA   #$FF
FAE4: 85 1F       464           STA   PVECTOR
FAE6: 4C 8C FD    465           JMP   PERROR
FAE9:             466 ;
FAE9: 60          467 DPD40     RTS
FAEA:             468 ;
FAEA:             469 ; ************************************************************
FAEA:             470 ; DISPLAY SIGNATURE
FAEA:             471 ; PRINTS 3 CHARACTERS IN HEX FROM PSTACK
FAEA:             472 ; ************************************************************
FAEA: 20 2F F8    473 PDSIG     JSR   HOMET          ; DISPLAY TO HOME
FAED: A2 02       474           LDX   #2
FAEF: 20 06 F0    475           JSR   PLINE          ; "SIGNATURE
FAF2: 20 09 F0    476           JSR   SIGCOM
FAF5: 4C 0C F0    477           JMP   PSIG
FAF8:             478 ;
FAF8:             479 ;
FAF8:             480 ;
FAF8:             481 ; ************************************************************
FAF8:             482 ; PRINT CABLE DOCUMENTATION
FAF8:             483 ; ************************************************************
FAF8: A2 0A       484 PRCABL    LDX   #10
FAFA: 20 06 F0    485           JSR   PLINE          ; PRINT HEADER
FAFD: 20 23 F8    486           JSR   CROUT
FB00: 20 5C FB    487           JSR   PMLN
FB03: A2 0C       488           LDX   #12            ; "CABLE SIGNATURE"
FB05: 20 06 F0    489           JSR   PLINE
FB08: 20 09 F0    490           JSR   SIGCOM
FB0B: 20 0C F0    491           JSR   PSIG
FB0E: A2 06       492           LDX   #6
FB10: 20 06 F0    493           JSR   PLINE          ; "CABLE PART NO.
FB13: A2 22       494           LDX   #34
FB15: 20 6E FD    495           JSR   PMIN
FB18: 20 23 F8    496           JSR   CROUT
FB1B: 20 83 FB    497           JSR   PCLIST         ; PRINT CONNECTORS
FB1E: A2 2E       498           LDX   #46
FB20: 20 06 F0    499           JSR   PLINE          ; "DESCRIPTION
FB23: A2 3E       500           LDX   #62
FB25: 20 6E FD    501           JSR   PMIN
FB28: 20 23 F8    502           JSR   CROUT
FB2B: A2 50       503           LDX   #80
FB2D: 20 6E FD    504           JSR   PMIN
FB30: 20 23 F8    505           JSR   CROUT
FB33: A2 12       506           LDX   #18
FB35: 20 06 F0    507           JSR   PLINE          ; "NO. COMMON CONNECTION LIST
FB38: 20 23 F8    508           JSR   CROUT
FB3B: 20 64 FB    509           JSR   PNETS          ; PRINT NETS
FB3E: A2 50       510           LDX   #80
FB40: 20 6E FD    511           JSR   PMIN
FB43: A2 0E       512           LDX   #14
```

```
FB45: 20 06 F0    513          JSR    PLINE     ; "NOTES:
FB48: A2 4A       514          LDX    #74
FB4A: 20 6E FD    515          JSR    PMIN
FB4D: 20 23 F8    516          JSR    CROUT
FB50: 20 5C FB    517          JSR    PMLN
FB53: 20 5C FB    518          JSR    PMLN
FB56: A9 0C       519          LDA    #$C
FB58: 20 00 F8    520          JSR    COUT      ; FORM FEED
FB5B: 60          521          RTS
FB5C:             522 ;
FB5C: A2 50       523 PMLN     LDX    #80
FB5E: 20 6E FD    524          JSR    PMIN
FB61: 4C 23 F8    525          JMP    CROUT
FB64:             526 ; ****************************************************************
FB64:             527 ; PRINT NETS
FB64:             528 ; ****************************************************************
FB64: A9 00       529 PNETS    LDA    #0
FB66: 85 20       530          STA    PTR
FB68: 20 42 FD    531 PNT10    JSR    GTNETX
FB6B: BD 00 03    532          LDA    DLIST,X
FB6E: 30 08       533          BMI    PNT20     ; END OF LIST BRANCH
FB70: 20 79 FB    534          JSR    PANET
FB73: E6 20       535          INC    PTR
FB75: 4C 68 FB    536          JMP    PNT10
FB78:             537 ;
FB78: 60          538 PNT20    RTS
FB79:             539 ;
FB79: 20 49 FD    540 PANET    JSR    PRNNO
FB7C: 20 25 FD    541          JSR    PRNET
FB7F: 20 23 F8    542          JSR    CROUT
FB82: 60          543          RTS
FB83:             544 ;
FB83:             545 ; ****************************************************************
FB83:             546 ; PRINT CONNECTOR ADAPTER SIGNATURES
FB83:             547 ; ****************************************************************
FB83: 20 16 F0    548 PCLIST   JSR    ACONS     ; ADAPTER INFO TO PSTACK
FB86: 20 12 F0    549 PCL10    JSR    LPARM
FB89: F0 ED       550          BEQ    PNT20     ; TERMINATE BRANCH
FB8B: 48          551          PHA
FB8C: A9 CA       552          LDA    #"J"
FB8E: 20 00 F8    553          JSR    COUT
FB91: 68          554          PLA
FB92: 20 00 F8    555          JSR    COUT
FB95: 20 77 F8    556          JSR    SPACE
FB98: A2 04       557          LDX    #4
FB9A: 20 06 F0    558          JSR    PLINE     ; "ADAPTER SIG
FB9D: 20 0C F0    559          JSR    PSIG
FBA0: A2 08       560          LDX    #8
FBA2: 20 06 F0    561          JSR    PLINE     ; "DESCRIPTION
FBA5: A2 1B       562          LDX    #27
FBA7: 20 6E FD    563          JSR    PMIN
FBAA: 20 23 F8    564          JSR    CROUT
FBAD: 4C 86 FB    565          JMP    PCL10
FBB0:             566 ;
FBB0:             567 ; ****************************************************************
FBB0:             568 ; DISPLAY CABLE DOCUMENTATION
FBB0:             569 ; POP OUT OF ROUTINE IF CABLE REMOVED
FBB0:             570 ; ****************************************************************
FBB0: 20 C7 FB    571 DSCABL   JSR    PCDLST    ; DISPLAY ADAPTER SIG'S
FBB3: 20 F3 FB    572          JSR    PDNETS    ; DISPLAY NETS
FBB6: 20 7A FD    573 SWAIT    JSR    STATST    ; WAIT FOR SWITCH DONE
FBB9: D0 FB       574          BNE    SWAIT     ; WAIT FOR KEY RELEASE
FBBB: 20 B7 FA    575          JSR    PAUSE
FBBE: 20 7A FD    576          JSR    STATST
FBC1: D0 F3       577          BNE    SWAIT
FBC3: 60          578          RTS
FBC4: 4C B7 FA    579          JMP    PAUSE
FBC7:             580 ;
FBC7:             581 ; ****************************************************************
FBC7:             582 ; DISPLAY ADAPTER SIGNATURES
FBC7:             583 ; ****************************************************************
```

```
FBC7: 20 16 F0    584 PCDLST   JSR  ACONS    ; ADAPTER INFO TO PSTACK
FBCA: 20 12 F0    585 PDL10    JSR  LPARM    ; CHECK FOR ADAPTER
FBCD: F0 23       586          BEQ  PDL20    ; NO MORE ADAPTERS END
FBCF: 48          587          PHA
FBD0: 20 2F F8    588          JSR  HOMET
FBD3: A9 CA       589          LDA  #"J"
FBD5: 20 00 F8    590          JSR  COUT
FBD8: 68          591          PLA
FBD9: 20 00 F8    592          JSR  COUT
FBDC: A2 10       593          LDX  #16      ; "ADAPTER
FBDE: 20 06 F0    594          JSR  PLINE
FBE1: 20 36 F8    595          JSR  HOMEB
FBE4: A2 02       596          LDX  #2
FBE6: 20 06 F0    597          JSR  PLINE    ; "SIGNATURE
FBE9: 20 0C F0    598          JSR  PSIG
FBEC: 20 64 FC    599          JSR  CATCH2   ; WAIT FOR KEY
FBEF: 4C CA FB    600          JMP  PDL10
FBF2:             601 ;
FBF2: 60          602 PDL20    RTS
FBF3:             603 ;
FBF3:             604 ;***********************************************************
FBF3:             605 ; DISPLAY CONNECTION NET
FBF3:             606 ;***********************************************************
FBF3: A9 00       607 PDNETS   LDA  #0
FBF5: 85 20       608          STA  PTR
FBF7: 20 42 FD    609 PDS10    JSR  GTNETX
FBFA: BD 00 03    610          LDA  DLIST,X
FBFD: 30 08       611          BMI  PDS20
FBFF: 20 21 FC    612          JSR  DNET     ; DISPLAY NET
FC02: E6 20       613          INC  PTR
FC04: 4C F7 FB    614          JMP  PDS10
FC07:             615 ;
FC07: 60          616 PDS20    RTS
FC08:             617 ;
FC08: 20 2F F8    618 DNET1    JSR  HOMET    ; START OF NEW NET
FC0B: 20 49 FD    619          JSR  PRNNO    ; PRINT NET NUMBER
FC0E: 20 77 F8    620          JSR  SPACE
FC11: 20 77 F8    621          JSR  SPACE
FC14: 20 47 FC    622          JSR  PDNET
FC17: 20 77 F8    623          JSR  SPACE
FC1A: 20 47 FC    624          JSR  PDNET
FC1D: 20 77 F8    625          JSR  SPACE
FC20: 60          626          RTS
FC21:             627 ;
FC21: 20 08 FC    628 DNET     JSR  DNET1
FC24: 20 36 F8    629 DNT20    JSR  HOMEB
FC27: A2 04       630          LDX  #4
FC29: 20 7C F8    631          JSR  SPCS
FC2C: 20 47 FC    632          JSR  PDNET
FC2F: 20 77 F8    633          JSR  SPACE
FC32: 20 47 FC    634          JSR  PDNET
FC35: 20 77 F8    635          JSR  SPACE
FC38: 20 64 FC    636          JSR  CATCH2
FC3B: 20 12 F0    637          JSR  LPARM
FC3E: 10 01       638          BPL  DNT30    ; PRINT NET NO AND CONTINUE
FC40: 60          639          RTS
FC41:             640 ;
FC41: 20 0F F0    641 DNT30    JSR  SPARM
FC44: 4C 24 FC    642          JMP  DNT20
FC47:             643 ;***********************************************************
FC47:             644 ; PRINT ITEM IN NET
FC47:             645 ; IF END OF NET DO SPACES INSTEAD
FC47:             646 ;***********************************************************
FC47: 20 12 F0    647 PDNET    JSR  LPARM    ; LOAD LINK
FC4A: 30 0C       648          BMI  PDN20    ; NO CONNECT SPACE
FC4C: 48          649          PHA
FC4D: 20 8F FC    650          JSR  PPIN     ; DISPLAY PIN
FC50: 68          651          PLA
FC51: AA          652          TAX           ; GET NEXT NET
FC52: BD 00 03    653          LDA  DLIST,X
FC55: 4C 0F F0    654 PDN10    JMP  SPARM    ; SAVE NEXT LINK
```

```
FC58:                   655 ;
FC58: A2 05             656 PDN20   LDX     #5
FC5A: 20 7C F8          657         JSR     SPCS            ; SPACE FILL
FC5D: 4C 55 FC          658         JMP     PDN10
FC60:                   659 ;.
FC60:                   660 ; ************************************************************
FC60:                   661 ; WAIT ON KEY AND POP OUT IF NO CABLE
FC60:                   662 ; ************************************************************
FC60:                   663 TIML    EQU     $2C
FC60:                   664 TIMH    EQU     $2D
FC60: 20 64 FC          665 CATCH   JSR     CATCH2          ; POPS OUT ONE ROUTINE
FC63: 60                666         RTS
FC64:                   667 ;
FC64: A2 03             668 CATCH2  LDX     #3              ; POPS OUT TWO ROUTINES
FC66: A9 00             669         LDA     #0
FC68: 85 2C             670         STA     TIML
FC6A: 85 2D             671         STA     TIMH
FC6C: E6 2C             672 CAT5    INC     TIML
FC6E: D0 04             673         BNE     CAT10
FC70: E6 2D             674         INC     TIMH
FC72: F0 15             675         BEQ     CAT30           ; INTERVAL TIME OUT BRANCH
FC74: 20 7A FD          676 CAT10   JSR     STATST
FC77: D0 F3             677         BNE     CAT5            ; WAIT FOR KEY OFF
FC79: 20 B7 FA          678         JSR     PAUSE
FC7C: CA                679         DEX
FC7D: 10 F5             680         BPL     CAT10           ; GIVE TIME FOR SWITCH BOUNCE
FC7F: 20 FB FC          681 CAT20   JSR     CABLEP
FC82: 90 06             682         BCC     CAT40           ; BRANCH IF NO CABLE
FC84: 20 7A FD          683         JSR     STATST          ; KEY ADVANCE
FC87: F0 F6             684         BEQ     CAT20           ; WAIT FOR KEY ON
FC89: 60                685 CAT30   RTS                     ; CONTINUE WITH DISPLAY
FC8A:                   686 ;
FC8A: 68                687 CAT40   PLA     ; POP OUT
FC8B: 68                688         PLA
FC8C: 68                689         PLA
FC8D: 68                690         PLA
FC8E: 60                691         RTS
FC8F:                   692 ; ************************************************************
FC8F:                   693 ; PRINT CONNECTOR & PIN NO. SUBROUTINE
FC8F:                   694 ; USING POINTER IN A TO LLIST
FC8F:                   695 ; DESTROYS A AND X
FC8F:                   696 ; ************************************************************
FC8F: 48                697 PPIN    PHA                     ; SAVE POINTER
FC90: 48                698         PHA                     ; TWICE
FC91: A9 CA             699         LDA     #"J"
FC93: 20 00 F8          700         JSR     COUT
FC96: 68                701         PLA
FC97: AA                702         TAX                     ; GET POINTER
FC98: BD 80 03          703         LDA     LLIST,X
FC9B: F0 1C             704         BEQ     PPN20           ; NOT LABELED BRANCH
FC9D: 2A                705         ROL                     ; COMPUTE CONNECTOR
FC9E: 2A                706         ROL
FC9F: 2A                707         ROL
FCA0: 29 03             708         AND     #3
FCA2: 09 30             709         ORA     #$30
FCA4: 18                710         CLC
FCA5: 69 01             711         ADC     #1
FCA7: 20 00 F8          712         JSR     COUT
FCAA: A9 AD             713         LDA     #"-"
FCAC: 20 00 F8          714         JSR     COUT
FCAF: 68                715         PLA
FCB0: AA                716         TAX                     ; GET POINTER
FCB1: BD 80 03          717         LDA     LLIST,X         ; COMPUTE PIN
FCB4: 29 3F             718         AND     #$3F
FCB6: 4C D5 FC          719         JMP     PNUM
FCB9:                   720 ;
FCB9: A9 AD             721 PPN20   LDA     #"-"            ; NOT LABELED
FCBB: 20 00 F8          722         JSR     COUT
FCBE: 68                723         PLA                     ; GET POINTER
FCBF: 18                724         CLC
FCC0: 69 01             725         ADC     #1
```

```
FCC2: A2 B0         726                 LDX     #"0"
FCC4: C9 64         727                 CMP     #100
FCC6: 90 04         728                 BCC     PPN30
FCC8: E9 64         729                 SBC     #100
FCCA: A2 B1         730                 LDX     #"1"
FCCC: 48            731 PPN30           PHA
FCCD: 8A            732                 TXA
FCCE: 20 00 F8      733                 JSR     COUT
FCD1: 68            734                 PLA
FCD2: 4C D5 FC      735                 JMP     PNUM
FCD5:               736 ;
FCD5:               737 ;****************************************************************
FCD5:               738 ; PRINT TWO DIGET NUMBER
FCD5:               739 ; USING VALUE IN A
FCD5:               740 ; DESTROYS A AND X
FCD5:               741 ;****************************************************************
FCD5: A2 FF         742 PNUM            LDX     #$FF            ; PRINTS 2 DIGET NO IN A
FCD7: 18            743                 CLC
FCD8: E8            744 PNM10           INX
FCD9: 38            745                 SEC
FCDA: E9 0A         746                 SBC     #10
FCDC: B0 FA         747                 BCS     PNM10
FCDE: 48            748                 PHA
FCDF: 8A            749                 TXA
FCE0: 18            750                 CLC
FCE1: 69 30         751                 ADC     #48
FCE3: 20 00 F8      752                 JSR     COUT
FCE6: 68            753 PNM20           PLA
FCE7: 18            754                 CLC
FCE8: 69 3A         755                 ADC     #10+48
FCEA: 20 00 F8      756                 JSR     COUT
FCED: 60            757                 RTS
FCEE:               758 ;
FCEE:               759 ;****************************************************************
FCEE:               760 ; PRINTS AS PNUM BUT LEADING 0 SUPRESSED
FCEE: C9 0A         761 PSNUM           CMP     #10
FCF0: B0 E3         762                 BCS     PNUM
FCF2: E9 09         763                 SBC     #9              ; ADJ FOR -10
FCF4: 48            764                 PHA
FCF5: 20 77 F8      765                 JSR     SPACE
FCF8: 4C E6 FC      766                 JMP     PNM20           ; SECOND DIGET
FCFB:               767 ;
FCFB:               768 ;****************************************************************
FCFB:               769 ; CABLE PRESENT TEST
FCFB:               770 ; NO REGISTERS OR RAM ALTERED
FCFB:               771 ; CARRY IS CABLE PRESENT
FCFB:               772 ;****************************************************************
FCFB: 48            773 CABLEP          PHA                     ; SAVE REGISTERS
FCFC: 98            774                 TYA
FCFD: 48            775                 PHA
FCFE: 8A            776                 TXA
FCFF: 48            777                 PHA
FD00: A0 00         778                 LDY     #0
FD02: 98            779 CBP10           TYA
FD03: 8C 00 09      780                 STY     DREG
FD06: AA            781                 TAX
FD07: E8            782 CBP20           INX
FD08: 30 11         783                 BMI     CBP30           ; NO CONNECT BRANCH
FD0A: 8E 00 08      784                 STX     MREG
FD0D: 2C 00 0A      785                 BIT     STATUS
FD10: 50 F5         786                 BVC     CBP20           ; OPEN BRANCH
FD12: B9 80 03      787                 LDA     LLIST,Y         ; TEST FOR LABELED
FD15: F0 04         788                 BEQ     CBP30           ; NOT LABELED BRANCH
FD17: 38            789                 SEC     ; SET CABLE PRESENT FLAG
FD18: 4C 1F FD      790                 JMP     CBP40
FD1B:               791 ;
FD1B: C8            792 CBP30           INY
FD1C: 10 E4         793                 BPL     CBP10           ; MORE POINTS BRANCH
FD1E: 18            794                 CLC                     ; SET CABLE NOT PRESENT
FD1F: 68            795 CBP40           PLA
FD20: AA            796                 TAX
```

```
FD21: 68              797             PLA
FD22: A8              798             TAY
FD23: 68              799             PLA
FD24: 60              800             RTS
FD25:                 801   ;
FD25:                 802   ;****************************************************************
FD25:                 803   ; PRINT NET USING NET LINK FOR START
FD25:                 804   ;****************************************************************
FD25: A2 03           805   PRNET     LDX   #3
FD27: 20 7C F8        806   PRN10     JSR   SPCS        ; PRINT NET
FD2A: 20 12 F0        807             JSR   LPARM
FD2D: 30 12           808             BMI   PRN20
FD2F: 48              809             PHA
FD30: 20 8F FC        810             JSR   PPIN
FD33: 68              811             PLA
FD34: AA              812             TAX
FD35: BD 00 03        813             LDA   DLIST,X
FD38: 30 07           814             BMI   PRN20       ; END OF NET BRANCH
FD3A: 20 0F F0        815             JSR   SPARM       ; NEXT POINT IN NET SAVE
FD3D: A2 01           816             LDX   #1
FD3F: D0 E6           817             BNE   PRN10
FD41:                 818   ;
FD41: 60              819   PRN20     RTS
FD42:                 820   ;****************************************************************
FD42:                 821   ; GET START OF NET
FD42:                 822   ; PUTS POINTER TO DLIST FROM POINTER TO NET LIST IN X
FD42:                 823   ;****************************************************************
FD42: A6 20           824   GTNETX    LDX   PTR         ; GET START OF NET IN X
FD44: BD 80 04        825             LDA   NLIST,X
FD47: AA              826             TAX
FD48: 60              827             RTS
FD49:                 828   ;****************************************************************
FD49:                 829   ; PRINT NET NO.
FD49:                 830   ; USING PTR AS NET POINTER
FD49:                 831   ; PUT START OF NET IN PSTACK
FD49:                 832   ;****************************************************************
FD49: 20 42 FD        833   PRNNO     JSR   GTNETX      ; PRINT NET NO.
FD4C: BD 00 03        834             LDA   DLIST,X
FD4F: 30 10           835             BMI   PNN30       ; NOT ACTIVE NET BRANCH
FD51: A5 20           836             LDA   PTR
FD53: 18              837             CLC
FD54: 69 01           838             ADC   #1
FD56: 20 EE FC        839             JSR   PSNUM       ; ADJ NO TO NON ZERO AND PRINT
FD59: 20 42 FD        840   PNN9      JSR   GTNETX
FD5C: 8A              841             TXA
FD5D: 20 0F F0        842             JSR   SPARM
FD60: 60              843             RTS
FD61:                 844   ;
FD61: A9 CE           845   PNN30     LDA   #"N"
FD63: 20 00 F8        846             JSR   COUT
FD66: A9 C3           847             LDA   #"C"
FD68: 20 00 F8        848             JSR   COUT
FD6B: 4C 59 FD        849             JMP   PNN9
FD6E:                 850   ;
FD6E:                 851   ;****************************************************************
FD6E:                 852   ; UNDERLINE
FD6E:                 853   ;****************************************************************
FD6E:                 854   ;
FD6E: 86 20           855   PMIN      STX   PTR         ; PRINT MINUS SIGNS X TIMES
FD70: A9 DF           856   PMN10     LDA   #$DF
FD72: 20 00 F8        857             JSR   COUT
FD75: C6 20           858             DEC   PTR
FD77: D0 F7           859             BNE   PMN10
FD79: 60              860             RTS
FD7A:                 861   ;
FD7A:                 862   ; ADVANCE DISPLAY KEY TEST
FD7A: AD 00 0A        863   STATST    LDA   STATUS
FD7D: 29 20           864             AND   #$20
FD7F: 60              865             RTS
FD80:                 866   ;
FD80:                 867   ;
FD80:                 868   ;
```

```
FD80:              869 ;*********************************************************************
FD80:              870 ; PRINT ERROR
FD80:              871 ;*********************************************************************
FD80:              872 HEDFLG    EQU  $2B
FD80: 20 23 F8     873 PER100    JSR  CROUT
FD83: 20 23 F8     874           JSR  CROUT
FD86: 20 23 F8     875           JSR  CROUT
FD89: 4C 23 F8     876           JMP  CROUT
FD8C:              877 ;
FD8C: A2 00        878 PERROR    LDX  #0
FD8E: 86 20        879           STX  PTR
FD90: 20 4B FF     880           JSR  CLRPLT       ; CLEAR SHORTS PRINTED LIST
FD93: 20 09 F0     881           JSR  SIGCOM
FD96: A2 2C        882           LDX  #44          ; "ERROR SIG
FD98: 20 06 F0     883           JSR  PLINE
FD9B: 20 0C F0     884           JSR  PSIG
FD9E: 20 23 F8     885           JSR  CROUT
FDA1: A2 50        886           LDX  #80
FDA3: 20 6E FD     887           JSR  PMIN
FDA6: 20 23 F8     888           JSR  CROUT
FDA9: 20 23 F8     889           JSR  CROUT
FDAC: A2 00        890 PER5      LDX  #0
FDAE: 86 2B        891           STX  HEDFLG       ; CLEAR HEADING FLAG
FDB0: 20 42 FD     892           JSR  GTNETX
FDB3: 30 CB        893           BMI  PER100       ; END OF LIST BRANCH
FDB5: 20 1C FF     894           JSR  OPNLST       ; TEST FOR OPENS
FDB8: F0 3A        895           BEQ  PER10        ; NO OPENS BRANCH
FDBA: 20 FF FE     896           JSR  LRNLST       ; GOOD POINTS TO SLIST
FDBD: 20 49 FD     897           JSR  PRNNO        ; PRINT GOOD PINS
FDC0: A2 02        898           LDX  #2
FDC2: 20 7C F8     899           JSR  SPCS
FDC5: 20 77 F8     900 PER7      JSR  SPACE
FDC8: 20 E7 FE     901           JSR  PDSLT
FDCB: 20 63 FF     902           JSR  TSLIST
FDCE: D0 F5        903           BNE  PER7
FDD0: 20 23 F8     904           JSR  CROUT
FDD3: 20 1C FF     905           JSR  OPNLST       ; GET OPENS
FDD6: A2 03        906           LDX  #3
FDD8: 20 7C F8     907           JSR  SPCS
FDDB: A2 16        908           LDX  #22          ; "OPENS:
FDDD: 20 06 F0     909           JSR  PLINE
FDE0: A2 02        910           LDX  #2
FDE2: 20 7C F8     911 PER9      JSR  SPCS
FDE5: 20 E7 FE     912           JSR  PDSLT
FDE8: 20 63 FF     913           JSR  TSLIST
FDEB: F0 04        914           BEQ  PER9A        ; END BRANCH
FDED: A2 01        915           LDX  #1
FDEF: D0 F1        916           BNE  PER9
FDF1:              917 ;
FDF1: 20 23 F8     918 PER9A     JSR  CROUT
FDF4: 20 42 FD     919 PER10     JSR  GTNETX
FDF7: BD 00 05     920           LDA  PLIST,X
FDFA: D0 2E        921           BNE  PER90        ; SHORT ALREADY PRINTED BRANCH
FDFC: 20 35 FF     922           JSR  SHTLST       ; TEST FOR SHORTS
FDFF: F0 29        923           BEQ  PER90
FE01: A5 2B        924           LDA  HEDFLG
FE03: D0 13        925           BNE  PER11        ; NET ALREADY DISPLAYED
FE05: 20 42 FD     926           JSR  GTNETX
FE08: BD 00 03     927           LDA  DLIST,X
FE0B: 20 79 FB     928           JSR  PANET        ; PRINT NET
FE0E: A2 03        929           LDX  #3
FE10: 20 7C F8     930           JSR  SPCS
FE13: A2 14        931           LDX  #20          ; "SHORTS:
FE15: 20 06 F0     932           JSR  PLINE
FE18: 20 77 F8     933 PER11     JSR  SPACE
FE1B: 20 E7 FE     934           JSR  PDSLT        ; DISPLAY SHORT
FE1E: 20 63 FF     935           JSR  TSLIST
FE21: D0 F5        936           BNE  PER11        ; BRANCH IF MORE SHORTS
FE23: A9 FF        937           LDA  #$FF
FE25: 85 2B        938           STA  HEDFLG
FE27: 20 23 F8     939           JSR  CROUT
```

```
FE2A: A5 2B      940 PER90   LDA  HEDFLG
FE2C: F0 03      941         BEQ  PER99
FE2E: 20 23 F8   942         JSR  CROUT
FE31: E6 20      943 PER99   INC  PTR
FE33: 4C AC FD   944         JMP  PER5       ; DO NET LIST LOOP
FE36:            945 ;
FE36:            946 ; ***********************************************************************
FE36:            947 ; DISPLAY ERROR
FE36:            948 ; ***********************************************************************
FE36: 4C B6 FB   949 DER100  JMP  SWAIT      ; SWITCH DEBOUNCE
FE39:            950 ;
FE39: A2 00      951 DERROR  LDX  #0
FE3B: 86 20      952         STX  PTR
FE3D: 20 4B FF   953         JSR  CLRPLT     ; CLEAR SHORTS PRINTED LIST
FE40: A2 00      954 DER5    LDX  #0
FE42: 86 2B      955         STX  HEDFLG     ; CLEAR HEADING FLAG
FE44: 20 42 FD   956         JSR  GTNETX
FE47: 30 ED      957         BMI  DER100     ; END OF LIST BRANCH
FE49: 20 1C FF   958         JSR  OPNLST     ; TEST FOR OPENS
FE4C: F0 5D      959         BEQ  DER10      ; NO OPENS BRANCH
FE4E: 20 FF FE   960         JSR  LRNLST     ; GOOD POINTS TO SLIST
FE51: 20 2F F8   961         JSR  HOMET
FE54: 20 49 FD   962         JSR  PRNNO      ; PRINT GOOD PINS
FE57: 20 12 F0   963         JSR  LPARM      ; DISPOSE OF LINK
FE5A: 20 77 F8   964         JSR  SPACE
FE5D: 20 77 F8   965         JSR  SPACE
FE60: 20 E7 FE   966         JSR  PDSLT
FE63: 20 77 F8   967         JSR  SPACE
FE66: 20 E7 FE   968         JSR  PDSLT
FE69: 20 77 F8   969         JSR  SPACE
FE6C: 20 63 FF   970         JSR  TSLIST     ; TEST FOR DEF COMPLETE
FE6F: F0 1C      971         BEQ  DER8
FE71: 20 36 F8   972 DER7    JSR  HOMEB
FE74: A2 04      973         LDX  #4
FE76: 20 7C F8   974         JSR  SPCS
FE79: 20 E7 FE   975         JSR  PDSLT
FE7C: 20 77 F8   976         JSR  SPACE
FE7F: 20 E7 FE   977         JSR  PDSLT
FE82: 20 77 F8   978         JSR  SPACE
FE85: 20 60 FC   979         JSR  CATCH
FE88: 20 63 FF   980         JSR  TSLIST
FE8B: D0 E4      981         BNE  DER7
FE8D: 20 1C FF   982 DER8    JSR  OPNLST     ; GET OPENS
FE90: 20 36 F8   983 DER9    JSR  HOMEB      ; PRINT OPENS
FE93: A2 16      984         LDX  #22        ; "OPENS:
FE95: 20 06 F0   985         JSR  PLINE
FE98: A2 04      986         LDX  #4
FE9A: 20 7C F8   987         JSR  SPCS
FE9D: 20 E7 FE   988         JSR  PDSLT
FEA0: 20 77 F8   989         JSR  SPACE
FEA3: 20 60 FC   990         JSR  CATCH
FEA6: 20 63 FF   991         JSR  TSLIST
FEA9: D0 E5      992         BNE  DER9       ; GET NEXT OPEN
FEAB: 20 42 FD   993 DER10   JSR  GTNETX
FEAE: BD 00 05   994         LDA  PLIST,X
FEB1: D0 2F      995         BNE  DER90      ; SHORT PRINTED BYPASS
FEB3: 20 35 FF   996         JSR  SHTLST     ; TEST FOR SHORTS
FEB6: F0 2A      997         BEQ  DER90
FEB8: A5 2B      998         LDA  HEDFLG
FEBA: D0 0B      999         BNE  DER11      ; NET ALREADY DISPLAYED
FEBC: 20 08 FC  1000         JSR  DNET1      ; DISPLAY NET
FEBF: 20 12 F0  1001         JSR  LPARM
FEC2: 30 03     1002         BMI  DER11
FEC4: 20 41 FC  1003         JSR  DNT30      ; PRINT NET CONTINUATION
FEC7: 20 36 F8  1004 DER11   JSR  HOMEB
FECA: A2 14     1005         LDX  #20        ; "SHORTS:
FECC: 20 06 F0  1006         JSR  PLINE
FECF: A2 03     1007         LDX  #3
FED1: 20 7C F8  1008         JSR  SPCS
FED4: 20 E7 FE  1009         JSR  PDSLT      ; DISPLAY SHORT
FED7: 20 77 F8  1010         JSR  SPACE
FEDA: 20 60 FC  1011         JSR  CATCH
```

```
FEDD: 20 63 FF   1012              JSR  TSLIST
FEE0: D0 E5      1013              BNE  DER11        ; BRANCH IF MORE SHORTS
FEE2: E6 20      1014 DER90        INC  PTR
FEE4: 4C 40 FE   1015              JMP  DER5         ; DO NET LIST LOOP
FEE7:            1016 ;
FEE7: A2 00      1017 PDSLT        LDX  #0
FEE9: BD 00 04   1018 PDT10        LDA  SLIST,X
FEEC: D0 08      1019              BNE  PDT20        ; GOT POINT BRANCH
FEEE: E8         1020              INX
FEEF: 10 F8      1021              BPL  PDT10
FEF1: A2 05      1022              LDX  #5           ; SPACE FILL
FEF3: 4C 7C F8   1023              JMP  SPCS
FEF6:            1024 ;
FEF6: A9 00      1025 PDT20        LDA  #0           ; CLEAR SCRATCH ENTRY
FEF8: 9D 00 04   1026              STA  SLIST,X
FEFB: 8A         1027              TXA
FEFC: 4C 8F FC   1028              JMP  PPIN
FEFF:            1029 ;
FEFF:            1030 ; **********************************************************
FEFF:            1031 ; MAKE DEFINED NET MINUS ITEMS IN SCRATCH IN SCRATCH
FEFF:            1032 ; **********************************************************
FEFF: 20 42 FD   1033 LRNLST       JSR  GTNETX
FF02: BD 00 04   1034 LRN10        LDA  SLIST,X
FF05: F0 0C      1035              BEQ  LRN30        ; NO SCRATCH PUT ITEM IN SLIST
FF07: A9 00      1036              LDA  #0
FF09: 9D 00 04   1037              STA  SLIST,X      ; CLEAR ITEM FROM LIST
FF0C: BD 00 03   1038              LDA  DLIST,X      ; GET NEXT POINT
FF0F: AA         1039 LRN20        TAX
FF10: 10 F0      1040              BPL  LRN10        ; MORE TO NET BRANCH
FF12: 60         1041              RTS
FF13:            1042 ;
FF13: BD 00 03   1043 LRN30        LDA  DLIST,X
FF16: 9D 00 04   1044              STA  SLIST,X
FF19: 4C 0F FF   1045              JMP  LRN20        ; ITEM ADDED TO SLIST
FF1C:            1046 ;
FF1C:            1047 ; **********************************************************
FF1C:            1048 ; MAKE OPEN LIST
FF1C:            1049 ; NET IN DEFINED MINUS NET IN READ
FF1C:            1050 ; **********************************************************
FF1C: 20 6E FF   1051 OPNLST       JSR  CSLIST       ; CLEAR SCRATCH LIST
FF1F: 20 42 FD   1052              JSR  GTNETX       ; DO OPENS
FF22: 20 98 FF   1053              JSR  MOLIST       ; MAKE CONNECT LIST
FF25: 20 42 FD   1054              JSR  GTNETX
FF28: 20 B6 FF   1055              JSR  CROLIST      ; CLEAR ACTUAL CONNECTS
FF2B: 20 63 FF   1056              JSR  TSLIST       ; LOOK FOR OPENS
FF2E: F0 04      1057              BEQ  OPN10        ; NO ERROR SKIP
FF30: A9 FF      1058              LDA  #$FF
FF32: 85 2B      1059              STA  HEDFLG       ; SET ERROR FLAG
FF34: 60         1060 OPN10        RTS
FF35:            1061 ;
FF35:            1062 ; **********************************************************
FF35:            1063 ; MAKE SHORT LIST
FF35:            1064 ; NEW SHORTS TO SCRATCH LIST AND PLIST
FF35:            1065 ; **********************************************************
FF35: 20 6E FF   1066 SHTLST       JSR  CSLIST       ; CLEAR SCRATCH LIST
FF38: 20 42 FD   1067              JSR  GTNETX
FF3B: 20 79 FF   1068              JSR  MSLIST       ; MAKE CONNECT LIST
FF3E: 20 42 FD   1069              JSR  GTNETX
FF41: 20 A5 FF   1070              JSR  CRSLIST      ; CLEAR EXPECTED CONNECTS
FF44: 20 55 FF   1071              JSR  UPDPLT       ; UPDATE SHORTS PRINTED
FF47: 20 63 FF   1072              JSR  TSLIST       ; TEST FOR SHORTS
FF4A: 60         1073              RTS
FF4B:            1074 ;
FF4B:            1075 ; **********************************************************
FF4B: A2 00      1076 CLRPLT       LDX  #0
FF4D: 8A         1077              TXA
FF4E: 9D 00 05   1078 CLP10        STA  PLIST,X      ; CLEAR PRINTED LIST
FF51: E8         1079              INX
FF52: 10 FA      1080              BPL  CLP10
FF54: 60         1081              RTS
FF55:            1082 ;
FF55: A2 00      1083 UPDPLT       LDX  #0
```

```
FF57: BD 00 04   1084 UPD10    LDA  SLIST,X
FF5A: F0 03      1085          BEQ  UPD20      ; NO SHORT BRANCH
FF5C: 9D 00 05   1086          STA  PLIST,X
FF5F: E8         1087 UPD20    INX
FF60: 10 F5      1088          BPL  UPD10
FF62: 60         1089          RTS
FF63:            1090 ;
FF63: A9 00      1091 TSLIST   LDA  #0         ; TEST CONTENTS IN SLIST
FF65: AA         1092          TAX
FF66: 1D 00 04   1093 TSL10    ORA  SLIST,X
FF69: E8         1094          INX
FF6A: 10 FA      1095          BPL  TSL10
FF6C: AA         1096          TAX
FF6D: 60         1097          RTS
FF6E:            1098 ;
FF6E: A2 00      1099 CSLIST   LDX  #0         ; CLEAR LIST TO ZERO
FF70: A9 00      1100          LDA  #0
FF72: 9D 00 04   1101 CSL10    STA  SLIST,X
FF75: E8         1102          INX
FF76: 10 FA      1103          BPL  CSL10
FF78: 60         1104          RTS
FF79:            1105 ;
FF79: 48         1106 MSLIST   PHA             ; MAKE LIST OF ACTUAL CONNECTIONS
FF7A: AA         1107          TAX
FF7B: CA         1108 MSL10    DEX
FF7C: 30 0E      1109          BMI  MSL20
FF7E: DD 80 02   1110          CMP  OLIST,X
FF81: D0 F8      1111          BNE  MSL10      ; NO CONNECT BRANCH
FF83: A9 FF      1112          LDA  #$FF       ; ENTER CONNECT
FF85: 9D 00 04   1113          STA  SLIST,X
FF88: 8A         1114          TXA
FF89: 4C 7B FF   1115          JMP  MSL10
FF8C:            1116 ;
FF8C: 68         1117 MSL20    PLA
FF8D: AA         1118          TAX
FF8E: BD 80 02   1119 MSL30    LDA  OLIST,X    ; MAKE LIST
FF91: 9D 00 04   1120          STA  SLIST,X
FF94: AA         1121          TAX
FF95: 10 F7      1122          BPL  MSL30
FF97: 60         1123          RTS
FF98:            1124 ;
FF98: BD 00 03   1125 MDLIST   LDA  DLIST,X    ; MAKE LIST DEFINED CONNECTS
FF9B: 9D 00 04   1126          STA  SLIST,X
FF9E: AA         1127          TAX
FF9F: 10 F7      1128          BPL  MDLIST
FFA1: 60         1129          RTS
FFA2:            1130 ;
FFA2: AA         1131 CRS10    TAX
FFA3: 30 0D      1132          BMI  CRS20      ; END OF NET BRANCH
FFA5: BD 00 03   1133 CRSLIST  LDA  DLIST,X
FFA8: 48         1134          PHA
FFA9: A9 00      1135          LDA  #0
FFAB: 9D 00 04   1136          STA  SLIST,X
FFAE: 68         1137          PLA
FFAF: 4C A2 FF   1138          JMP  CRS10
FFB2:            1139 ;
FFB2: 60         1140 CRS20    RTS
FFB3:            1141 ;
FFB3: AA         1142 CRO10    TAX
FFB4: 30 0D      1143          BMI  CRO30      ; END BRANCH
FFB6: BD 80 02   1144 CROLIST  LDA  OLIST,X    ; CLEAR ACTUAL CONNECTIONS
FFB9: 48         1145          PHA
FFBA: A9 00      1146          LDA  #0
FFBC: 9D 00 04   1147          STA  SLIST,X
FFBF: 68         1148          PLA
FFC0: 4C B3 FF   1149          JMP  CRO10
FFC3:            1150 ;
FFC3: 60         1151 CRO30    RTS
FFC4:            1152 ;
FFD0:            1153          ORG  $FFD0
FFD0:            1154          OBJ  $CFD0
FFD0: 85 70      1155 INTER    STA  $70
```

```
FFD2: 86 71        1156            STX    $71
FFD4: 84 72        1157            STY    $72
FFD6: BA           1158            TSX
FFD7: 86 73        1159            STX    $73
FFD9: E8           1160            INX
FFDA: B5 64        1161            LDA    100,X
FFDC: 85 74        1162            STA    $74
FFDE: A5 FF        1163            LDA    $FF
FFE0: 8D FF FF     1164            STA    $FFFF
FFE3: AD FF FF     1165            LDA    $FFFF
FFE6: 85 6F        1166            STA    $6F
FFE8: A5 70        1167            LDA    $70
FFEA: A6 71        1168            LDX    $71
FFEC: 40           1169            RTI
FFED:              1170 ;
FFFA:              1171            ORG    $FFFA
FFFA:              1172            OBJ    $CFFA
FFFA: 90 F8        1173            DFW    INT00
FFFC: 90 F8        1174            DFW    INT00
FFFE: 90 F8        1175            DFW    INT00

*** SUCCESSFUL ASSEMBLY:  NO ERRORS.
SOURCE LENGTH:   A$2000  22770  $58F2
TABLE  LENGTH:   A$1400   1662  $067E
SPACELEFT:         269  $010D

0800:               1 ; SIGNATURE 1000 - SUBROUTINES
0800:               2 ; *****************************************************************
0800:               3 ; SIGNATURE 1000 CABLE ANALYZER PROGRAM LISTING #2
0800:               4 ; *****************************************************************
0800:               5 ; ROUTINE ENTRY POINTS:
F000:               6            ORG    $F000
F000:               7            OBJ    $C800
F000: 4C 1B F0     8            JMP    RCABLE      ; READ CABLE
F003: 4C 8A F0     9            JMP    LABELER     ; LABEL PINS
F006: 4C 0B F5    10            JMP    PLINE       ; PRINT STRING
F009: 4C C4 F2    11            JMP    SIGCOM      ; COMPUTE SIGNATURE
F00C: 4C 88 F2    12            JMP    PSIG        ; PRINT SIGNATURE
F00F: 4C 4A F4    13            JMP    SPARM       ; SAVE A ON PSTACK
F012: 4C 5B F4    14            JMP    LPARM       ; GET A FROM PSTACK
F015: 4C E7 F3    15            JMP    TPG10       ; TONE/PAUSE GENERATE
F018: 4C 6C F4    16            JMP    ACONS
F01B:             17 ;
F01B:             18 ; *****************************************************************
F01B:             19 ;0-F SCRATCH
F01B:             20 ; *****************************************************************
F01B:             21 ; GLOBAL VARIABLES:
F01B:             22 ; $10 EFLG
F01B:             23 ; $11 CFLG
F01B:             24 ; $12 PFLG
F01B:             25 ; $13-1E ADAPTER SIGNATURES
F01B:             26 ; *****************************************************************
F01B:             27 ; LOCAL VARIABLES:
F01B:             28 ; $25-26 PLINE
F01B:             29 ; $27-28 SPARM
F01B:             30 ; $200-27F SPARM
F01B:             31 ;
F01B:             32 ; *****************************************************************
F01B:             33 ; GLOBAL LISTS:
F01B:             34 OLIST      EQU    $280        ; READ LIST
F01B:             35 DLIST      EQU    $300        ; LEARNED LIST
F01B:             36 LLIST      EQU    $380        ; LABELS LIST
F01B:             37 ;
F01B:             38 ; *****************************************************************
F01B:             39 ; GLOBAL I/O
F01B:             40 DREG       EQU    $900        ; OUTPUT TO SCANNER
F01B:             41 MREG       EQU    $800        ; MULTIPLEXER REG TO SCANNER
F01B:             42 STATUS     EQU    $A00
F01B:             43 ; *****************************************************************
F01B:             44 ; F800 ROUTINES:
F01B:             45 COUT       EQU    $F800
F01B:             46 ;
```

```
F01B:                    47 ;****************************************************************
F01B:                    48 ;****************************************************************
F01B:                    49 ; READ ROUTINE
F01B:                    50 ; READS INTERCONNECTIONS INTO OLIST
F01B:                    51 ; UPDATES ERROR, CHANGE, AND CABLE PRESENT FLAGS
F01B:                    52 ; DESTROYS REGISTERS
F01B:                    53 ;****************************************************************
F01B:                    54 EFLG      EQU   $10
F01B:                    55 CFLG      EQU   $11        ; CHANGE FLAG <>0 IS CHANGE
F01B:                    56 PFLG      EQU   $12        ; CABLE PRESENT FLAG $FF IS PRESENT
F01B:                    57 ;
F01B:                    58 ;
F01B: A0 00              59 RCABLE    LDY   #0         ; ZERO OUTPUT POINTER
F01D: 84 10              60           STY   EFLG       ;- CLEAR ERROR FLAG
F01F: 84 11              61           STY   CFLG       ; CLEAR CHANGE FLAG
F021: 84 12              62           STY   PFLG       ; CLEAR CABLE PRESENT FLAG
F023: 98                 63 RCB20     TYA              ; TRANSFER OUTPUT POINTER TO
F024: 8D 00 09           64           STA   DREG
F027: AA                 65           TAX              ; INPUT POINTER
F028: E8                 66 RCB30     INX              ; INCREMENT INPUT POINTER
F029: 30 17              67           BMI   RCB35      ; END OF TEST BRANCH
F02B: 8E 00 08           68           STX   MREG
F02E: 2C 00 0A           69           BIT   STATUS     ; NO CONNECTION BRANCH
F031: 50 F5              70           BVC   RCB30      ; *****
F033: B9 80 03           71           LDA   LLIST,Y
F036: F0 0A              72           BEQ   RCB35      ; CABLE PRESENT TEST
F038: BD 80 03           73           LDA   LLIST,X
F03B: F0 05              74           BEQ   RCB35      ; NO CABLE PRESENT BRANCH
F03D: 98                 75           TYA
F03E: A9 FF              76           LDA   #$FF
F040: 85 12              77           STA   PFLG       ; SET CABLE PRESENT
F042: 8A                 78 RCB35     TXA              ; CONNECTION INTERPRET
F043: 59 80 02           79           EOR   OLIST,Y
F046: 05 11              80           ORA   CFLG
F048: 85 11              81           STA   CFLG       ; CHANGE FLAG UPDATE
F04A: 8A                 82           TXA
F04B: 99 80 02           83           STA   OLIST,Y    ; SAVE IN LIST
F04E: D9 00 03           84           CMP   DLIST,Y    ; TEST FOR MATCH STD
F051: D0 04              85           BNE   RCB60      ; ERROR BRANCH
F053: C8                 86 RCB50     INY              ; INC OUTPUT POINTER
F054: 10 CD              87           BPL   RCB20      ; KEEP LOOPING
F056: 60                 88           RTS              ; OUTPUT LOOP FINISHED
F057:                    89 ;
F057: A5 10              90 RCB60     LDA   EFLG       ; ERROR DETECTED
F059: B0 1B              91           BCS   RCB70      ; MISSED CONNECTION BRANCH
F05B: 09 80              92           ORA   #$80       ; SET SHORT FLAG
F05D: 85 10              93           STA   EFLG
F05F: 24 10              94           BIT   EFLG
F061: 70 F0              95           BVS   RCB50      ; OPEN ERROR FLAG BRANCH
F063: B9 00 03           96           LDA   DLIST,Y
F066: 30 EB              97           BMI   RCB50      ; NO CONNECTION BRANCH
F068: 8D 00 08           98           STA   MREG
F06B: 2C 00 0A           99           BIT   STATUS
F06E: 70 E3             100           BVS   RCB50      ; ***NOT A MISWIRE BRANCH
F070: A9 C0             101 RCB65     LDA   #$C0
F072: 85 10             102           STA   EFLG
F074: D0 DD             103           BNE   RCB50
F076:                   104 ;
F076: 09 40             105 RCB70     ORA   #$40       ; MISSED CONNECTION
F078: 85 10             106           STA   EFLG       ; SET OPEN FLAG
F07A: 30 D7             107           BMI   RCB50      ; SHORT ERROR FLAG BRANCH
F07C: 98                108           TYA
F07D: AA                109 RCB80     TAX
F07E: BD 00 03          110           LDA   DLIST,X
F081: D9 80 02          111           CMP   OLIST,Y
F084: F0 CD             112           BEQ   RCB50      ; IN LIST BRANCH
F086: 90 F5             113           BCC   RCB80      ; KEEP LOOKING BRANCH
F088: B0 E6             114           BCS   RCB65      ; GONE TOO FAR, ITS A MISWIRE
F08A:                   115 ;****************************************************************
F08A:                   116 ; LABEL PINS
F08A:                   117 ; CREATES LLIST
```

```
F08A:                118 ; COMPUTES ADAPTER SIGNATURES AT ASIG, J1 FIRST, LSB FIRST
F08A:                119 ; DESTROYS SCRATCH AREA AND REGISTERS
F08A:                120 ;*********************************************************************
F08A:                121 ASIG    EQU  $13         ; ADAPTER SIGANTURES (12 BYTES)
F08A:                122 EXTFLG  EQU  6
F08A: A9 01          123 LABELER LDA  #1          ; FIRST PIN OF J1
F08C: A0 1E          124         LDY  #$1E        ; PIN 31 ON J1
F08E: 20 4C F1       125         JSR  LSEQ        ; LABEL J1 PINS
F091: 20 1B F0       126         JSR  RCABLE      ; USED BY ADAPTER SIG
F094: 20 35 F1       127         JSR  CLRJ34      ; CLEAR ALL CONN. ON J3,4
F097: 20 0D F1       128         JSR  CLRLAB      ; CLEAR LABELED PINS
F09A: A5 06          129         LDA  EXTFLG
F09C: D0 54          130         BNE  LBL40       ; NO J2 BRANCH
F09E: 20 23 F1       131         JSR  CLRJ2       ; CLEAR CONNECTIONS ON J2
F0A1: 20 C4 F2       132         JSR  SIGCOM      ; COMPUTE J1 ADAPTER SIGNATURE
F0A4: A9 41          133         LDA  #$41        ; J2 FIRST PIN
F0A6: A0 3E          134         LDY  #$3E        ; J2 PIN 31
F0A8: 20 4C F1       135         JSR  LSEQ        ; LABEL PINS ON J2
F0AB: 20 1B F0       136         JSR  RCABLE      ; GET INTERCONNECTIONS
F0AE: 20 35 F1       137         JSR  CLRJ34      ; CLEAR J3&4 CONNECTIONS
F0B1: 20 1D F1       138         JSR  CLRJ1       ; CLEAR J1 CONNECTIONS
F0B4: 20 0D F1       139         JSR  CLRLAB      ; CLEAR LABELED PINS
F0B7: 20 C4 F2       140         JSR  SIGCOM      ; SIGNATURE TO PSTAT
F0BA: A9 81          141 LBL10   LDA  #$81        ; J3 FIRST PIN
F0BC: A0 5E          142         LDY  #$5E        ; J3 PIN 31
F0BE: 20 4C F1       143         JSR  LSEQ
F0C1: 20 1B F0       144         JSR  RCABLE
F0C4: 20 2F F1       145         JSR  CLRJ12
F0C7: 20 0D F1       146         JSR  CLRLAB
F0CA: A5 06          147         LDA  EXTFLG
F0CC: D0 2A          148         BNE  LBL50
F0CE: 20 29 F1       149         JSR  CLRJ4
F0D1: 20 C4 F2       150         JSR  SIGCOM      ; J3 SIG TO STACK
F0D4: A9 C1          151         LDA  #$C1        ; J4 FIRST PIN
F0D6: A0 7E          152         LDY  #$7E        ; J4 PIN 31
F0D8: 20 4C F1       153         JSR  LSEQ
F0DB: 20 1B F0       154         JSR  RCABLE
F0DE: 20 3B F1       155         JSR  CLRJ123
F0E1: 20 0D F1       156         JSR  CLRLAB
F0E4: 20 C4 F2       157         JSR  SIGCOM
F0E7: A2 0B          158 LBL20   LDX  #11
F0E9: 20 5B F4       159 LBL30   JSR  LPARM       ; XFR SIGNATURES
F0EC: 95 13          160         STA  ASIG,X
F0EE: CA             161         DEX
F0EF: 10 F8          162         BPL  LBL30
F0F1: 60             163         RTS
F0F2:                164 ;
F0F2: 20 FE F0       165 LBL40   JSR  Z3PARM
F0F5: 4C BA F0       166         JMP  LBL10
F0F8:                167 ;
F0F8: 20 FE F0       168 LBL50   JSR  Z3PARM
F0FB: 4C E7 F0       169         JMP  LBL20
F0FE:                170 ;
F0FE: 20 C4 F2       171 Z3PARM  JSR  SIGCOM      ; ODD ADAPTER SIG TO PSTACK
F101: A9 00          172         LDA  #0          ; ZERO FOR UNUSED EVEN CONNECTOR
F103: 20 4A F4       173         JSR  SPARM
F106: 20 4A F4       174         JSR  SPARM
F109: 20 4A F4       175         JSR  SPARM
F10C: 60             176         RTS
F10D:                177 ;
F10D: A2 7F          178 CLRLAB  LDX  #$7F        ; CLEAR LABELED PIN INTERCONNECTIONS
F10F: BD 80 03       179 CLB00   LDA  LLIST,X
F112: F0 05          180         BEQ  CLB10       ; NOT LABELED BRANCH
F114: A9 80          181         LDA  #$80
F116: 9D 80 02       182         STA  OLIST,X     ; REMOVE CONNECT
F119: CA             183 CLB10   DEX
F11A: 10 F3          184         BPL  CLB00
F11C: 60             185         RTS
F11D:                186 ;
F11D:                187 LIMIT   EQU  $A
F11D:                188 ;
F11D: A9 20          189 CLRJ1   LDA  #32         ; CLEAR CONNECTIONS IN OLIST X TO A-1
```

```
F11F: A2 00        190            LDX  #0
F121: F0 1C        191            BEQ  CLJ00      ; CLEAR J1 CONNECTS
F123:              192 ;
F123: A9 40        193 CLRJ2      LDA  #64
F125: A2 20        194            LDX  #32
F127: D0 16        195            BNE  CLJ00      ; CLEAR J2 CONNECTS
F129:              196 ;
F129: A9 80        197 CLRJ4      LDA  #128
F12B: A9 60        198            LDA  #96
F12D: D0 10        199            BNE  CLJ00      ; CLEAR J4 CONNECTS
F12F:              200 ;
F12F: A9 40        201 CLRJ12     LDA  #64
F131: A2 00        202            LDX  #0
F133: F0 0A        203            BEQ  CLJ00      ; CLEAR J1 & J2 CONNECTS
F135:              204 ;
F135: A9 80        205 CLRJ34     LDA  #128
F137: A2 40        206            LDX  #64
F139: D0 04        207            BNE  CLJ00      ; CLEAR J3 & J4 CONNECTS
F13B:              208 ;
F13B: A9 60        209 CLRJ123    LDA  #96        ; CLEAR J1, J2, &J3 CONNECTS
F13D: A2 00        210            LDX  #0
F13F: 85 0A        211 CLJ00      STA  LIMIT
F141: A9 80        212            LDA  #$80       ; CLEAR CONNECT VALUE
F143: 9D 80 02     213 CLJ10      STA  OLIST,X
F146: E8           214            INX
F147: E4 0A        215            CPX  LIMIT
F149: 90 F8        216            BCC  CLJ10
F14B: 60           217            RTS
F14C:              218 ;
F14C:              219 ;
F14C:              220 ;
F14C:              221 ;***********************************************************************
F14C:              222 ; LABELING SEQUENCER SUBROUTINE
F14C:              223 ; GENERATES LLIST FOR TEST PIN IN Y
F14C:              224 ; FIRST LABEL IN A
F14C:              225 ; WHEN DONE EXT. FLAG <>0 IS EVEN J2 OR J4 APPEND TO J1 OR J3
F14C:              226 ; REGISTERS AND SCRATCH AREA DESTROYED
F14C:              227 ;***********************************************************************
F14C:              228 ; LOCAL VARIABLES IN SCRATCH AREA:
F14C:              229 TEMP1      EQU  1
F14C:              230 TEMP2      EQU  2
F14C:              231 MAX        EQU  3
F14C:              232 MIN        EQU  4
F14C:              233 PINN       EQU  5
F14C:              234 ODDFLG     EQU  7
F14C:              235 EVNFLG     EQU  8
F14C:              236 EOTEST     EQU  9
F14C:              237 ;
F14C:              238 ;
F14C: 85 05        239 LSEQ       STA  PINN
F14E: A2 00        240            LDX  #0         ; CLEAR EXTENSION FLAG
F150: 86 06        241            STX  EXTFLG
F152: 20 40 F2     242            JSR  SCAN
F155: A6 07        243            LDX  ODDFLG
F157: 30 10        244            BMI  LSQ20      ; EVEN OR NONE BRANCH
F159: 20 AC F1     245            JSR  ODDL2
F15C: A5 08        246            LDA  EVNFLG
F15E: 10 05        247            BPL  LSQ10      ; EVEN AND ODD BRANCH
F160: A6 07        248            LDX  ODDFLG
F162: 4C DB F1     249            JMP  EVNL1      ; LABEL FORWARD
F165:              250 ;
F165: AA           251 LSQ10      TAX  ; LABEL BACKWARD
F166: 4C 3C F2     252            JMP  REVEL2
F169:              253 ;
F169: A6 08        254 LSQ20      LDX  EVNFLG
F16B: 30 03        255            BMI  LSQ30      ; NONE BRANCH
F16D: 4C DF F1     256            JMP  ALTOL2
F170:              257 ;
F170: C8           258 LSQ30      INY             ; NO CONNECT TO 31, DO 32
F171: 20 40 F2     259            JSR  SCAN
F174: A6 08        260            LDX  EVNFLG
F176: 30 10        261            BMI  LSQ50      ; NO EVEN BRANCH
```

```
F178: 20 D6 F1    262        JSR   EVNL2      ; NUMBER EVEN SIDE
F17B: A5 07       263        LDA   ODDFLG
F17D: 10 05       264        BPL   LSQ40      ; ODD AND EVEN BRANCH
F17F: A6 08       265        LDX   EVNFLG
F181: 4C AC F1    266        JMP   ODDL2      ; NUMBER ODD SIDE FORWARD
F184:             267 ;
F184: AA          268 LSQ40  TAX              ; REVERSE NO ON ODD
F185: 4C 16 F2    269        JMP   REVOL2
F188:             270 ;
F188: A6 07       271 LSQ50  LDX   ODDFLG
F18A: 30 03       272        BMI   LSQ60      ; NO CONNECT BRANCH
F18C: 4C 12 F2    273        JMP   ALTEL1
F18F:             274 ;
F18F: 98          275 LSQ60  TYA              ; NO CONNECT
F190: AA          276        TAX
F191: 24 06       277        BIT   EXTFLG     ; COMPUTE END
F193: 10 4A       278        BPL   ALTOL2
F195: A9 20       279        LDA   #$20       ; EXTEND NUMBERING
F197: 84 01       280        STY   TEMP1
F199: 05 01       281        ORA   TEMP1
F19B: AA          282        TAX
F19C: 20 DF F1    283        JSR   ALTOL2
F19F: A5 05       284        LDA   PINN
F1A1: 9D 80 03    285        STA   LLIST,X
F1A4: E8          286        INX
F1A5: 18          287        CLC
F1A6: 69 01       288        ADC   #1
F1A8: 9D 80 03    289        STA   LLIST,X
F1AB: 60          290        RTS
F1AC:             291 ;
F1AC:             292 ;*********************************************************************
F1AC:             293 ; LABELER
F1AC:             294 ;*********************************************************************
F1AC: A9 00       295 ODDL2  LDA   #0         ; -2 ENTRY ODD
F1AE: CA          296        DEX
F1AF: 30 24       297        BMI   LAB40
F1B1: A9 00       298        LDA   #0         ; -1 ENTRY ODD
F1B3: 86 03       299 LAB10  STX   MAX
F1B5: 85 09       300        STA   EOTEST
F1B7: 98          301        TYA
F1B8: 29 E0       302        AND   #$E0       ; COMPUTE START
F1BA: 05 09       303        ORA   EOTEST
F1BC: AA          304 LAB20  TAX
F1BD: C5 03       305        CMP   MAX
F1BF: B0 14       306        BCS   LAB40      ; BRANCH WHEN DONE
F1C1: 29 1F       307        AND   #$1F
F1C3: C9 1E       308        CMP   #$1E
F1C5: B0 07       309        BCS   LAB30      ; PIN 31 OR 32 BRANCH
F1C7: A5 05       310        LDA   PINN
F1C9: 9D 80 03    311        STA   LLIST,X    ; WRITE LABEL
F1CC: E6 05       312        INC   PINN
F1CE: 8A          313 LAB30  TXA
F1CF: 18          314        CLC
F1D0: 69 02       315        ADC   #2
F1D2: 4C BC F1    316        JMP   LAB20
F1D5:             317 ;
F1D5: 60          318 LAB40  RTS
F1D6:             319 ;
F1D6: A9 01       320 EVNL2  LDA   #1         ; EVEN -2 ENTRY
F1D8: CA          321        DEX
F1D9: 30 FA       322        BMI   LAB40
F1DB: A9 01       323 EVNL1  LDA   #1         ; EVEN -1 ENTRY
F1DD: 10 D4       324        BPL   LAB10
F1DF:             325 ;
F1DF: CA          326 ALTOL2 DEX
F1E0: 30 F3       327        BMI   LAB40
F1E2: A9 00       328        LDA   #0         ; ALTERNATE LABEL START ODD
F1E4: 85 09       329 LAB50  STA   EOTEST
F1E6: 86 03       330        STX   MAX
F1E8: 98          331        TYA              ; COMPUTE BEGINNING
F1E9: 29 E0       332        AND   #$E0
F1EB: 05 09       333        ORA   EOTEST
```

```
F1ED: AA              334            TAX
F1EE: C5 03           335 LAB60      CMP  MAX
F1F0: B0 E3           336            BCS  LAB40        ; DONE
F1F2: 29 1F           337            AND  #$1F
F1F4: C9 1E           338            CMP  #$1E         ; PIN 31,32 BRANCH
F1F6: B0 14           339            BCS  LAB65
F1F8: A5 05           340            LDA  PINN
F1FA: 9D 80 03        341            STA  LLIST,X
F1FD: E6 05           342            INC  PINN
F1FF: A5 09           343            LDA  EOTEST
F201: F0 0A           344            BEQ  LAB70
F203: CA              345            DEX
F204: A5 05           346            LDA  PINN
F206: E6 05           347            INC  PINN         ; BACKTRACK FOR ODD PIN
F208: 9D 80 03        348            STA  LLIST,X
F20B: E8              349            INX
F20C: E8              350 LAB65      INX
F20D: E8              351 LAB70      INX
F20E: 8A              352            TXA
F20F: 4C EE F1        353            JMP  LAB60
F212:                 354 ;
F212: A9 01           355 ALTEL1     LDA  #1           ; ALTERNATE START WITH EVEN
F214: 10 CE           356            BPL  LAB50
F216:                 357 ;
F216: A9 00           358 REVOL2     LDA  #0           ; REVERSE ON ODD
F218: 85 09           359 LAB80      STA  EOTEST
F21A: 98              360            TYA               ; COMPUTE VALUE AT END
F21B: 29 E0           361            AND  #$E0
F21D: 05 09           362            ORA  EOTEST
F21F: 85 04           363            STA  MIN
F221: CA              364 LAB90      DEX
F222: 30 B1           365            BMI  LAB40        ; UNDERFLOW
F224: CA              366            DEX
F225: 30 AE           367            BMI  LAB40
F227: E4 04           368            CPX  MIN
F229: 90 AA           369            BCC  LAB40
F22B: 8A              370            TXA
F22C: 29 1F           371            AND  #$1F         ; SKIP 31,32
F22E: C9 1E           372            CMP  #$1E
F230: B0 EF           373            BCS  LAB90
F232: A5 05           374            LDA  PINN
F234: 9D 80 03        375            STA  LLIST,X
F237: E6 05           376            INC  PINN
F239: 4C 21 F2        377            JMP  LAB90
F23C:                 378 ;
F23C: A9 01           379 REVEL2     LDA  #1
F23E: 10 D8           380            BPL  LAB80        ; REVERSE EVEN
F240:                 381 ;************************************************************
F240:                 382 ; SCAN FOR LABEL SUBROUTINE
F240:                 383 ;************************************************************
F240:                 384 ;
F240: A2 FF           385 SCAN       LDX  #$FF         ; INITIALIZE FLAGS
F242: 86 07           386            STX  ODDFLG
F244: 86 08           387            STX  EVNFLG
F246: 84 02           388            STY  TEMP2        ; SAVE OUTPUT PIN
F248: 98              389            TYA               ; COMPUTE FIRST PIN
F249: 29 E0           390            AND  #$E0
F24B: AA              391            TAX
F24C: 8C 00 09        392            STY  DREG
F24F: 8E 00 08        393 SCN10      STX  MREG         ; TEST FOR LOW
F252: 2C 00 0A        394            BIT  STATUS
F255: 50 29           395            BVC  SCN40        ; ****NO CONNECT BRANCH
F257: E4 02           396            CPX  TEMP2        ;
F259: F0 25           397            BEQ  SCN40        ; SAME PIN BRANCH
F25B: 90 04           398            BCC  SCN20        ; NO EXTENSION BRANCH
F25D: A9 FF           399            LDA  #$FF
F25F: 85 06           400            STA  EXTFLG       ; SET EXTENSION FLAG
F261: 8A              401 SCN20      TXA
F262: 09 01           402            ORA  #1           ; 31,32 IGNORE
F264: C5 02           403            CMP  TEMP2
F266: F0 18           404            BEQ  SCN40
F268: 29 FE           405            AND  #$FE
F26A: C5 02           406            CMP  TEMP2
```

```
:: F0 12        407              BEQ   SCN40
:: 8A           408              TXA
:: 4A           409              LSR
:: B0 08        410              BCS   SCN30      ; EVEN BRANCH
:: A5 07        411              LDA   ODDFLG
:: 10 0A        412              BPL   SCN40      ; ALREADY HAVE PIN BRANCH
:: 86 07        413              STX   ODDFLG     ; SAVE ODD PIN
:: 90 06        414              BCC   SCN40
:               415 ;
: A5 08         416 SCN30        LDA   EVNFLG
: 10 02         417              BPL   SCN40      ; ALREADY HAVE EVEN FLAG BRANCH
: 86 08         418              STX   EVNFLG     ; SAVE EVEN FLAG
: E8            419 SCN40        INX              ; INCREMENT OUTPUT POINTER
: 30 04         420              BMI   SCN50      ; END OF SCAN TEST
: E0 40         421              CPX   #$40
: D0 C8         422              BNE   SCN10
: 60            423 SCN50        RTS
:               424 ;
:               425 ;
:               426 ;************************************************************
:               427 ; PRINT 3 BYTES IN HEX FROM PSTACK
:               428 ; DESTROYS X AND A
:               429 ;************************************************************
:               430 ;
: 20 5B F4      431 PSIG         JSR   LPARM
: 20 9B F2      432              JSR   PHEX
: 20 5B F4      433              JSR   LPARM
: 20 9B F2      434              JSR   PHEX
: 20 5B F4      435              JSR   LPARM
: 20 9B F2      436              JSR   PHEX
: 60            437              RTS
:               438 ;
:               439 ;************************************************************
:               440 ; PRINT TWO HEX DIGETS IN A
:               441 ; DESTROYS X AND A
:               442 ;************************************************************
:               443 ;
: 48            444 PHEX         PHA              ; PRINT 2 HEX DIGETS IN A
: 4A            445              LSR
: 4A            446              LSR
: 4A            447              LSR
: 4A            448              LSR
: AA            449              TAX
: BD B1 F2      450              LDA   THEX,X
: 20 00 F8      451              JSR   COUT
: 68            452              PLA
: 29 0F         453              AND   #$F
: AA            454              TAX
: BD B1 F2      455              LDA   THEX,X
: 4C 00 F8      456              JMP   COUT
:               457 ;
: B0 B1 B2
: B3 B4 B5
: B6 B7 B8
: B9 C1 C2
: C3 C4 C5
: C6             458 THEX        ASC   "0123456789ABCDEF"
:                459 ;
F2C1:            460 ;************************************************************
F2C1:            461 ; SIGNATURE COMPUTE
F2C1:            462 ; REGISTERS DISTROYED, MEMORY UNCHANGED
F2C1:            463 ; COMPUTATION FROM OLIST
F2C1:            464 ; RESULTS ON PSTACK (MSB ON TOP)
F2C1:            465 ;************************************************************
F2C1:            466 ;
F2C1:            467 ;TEMP1 EQU 1
F2C1:            468 ;TEMP2 EQU 2
F2C1:            469 TEMP3        EQU   3
F2C1:            470 TEMP4        EQU   4
F2C1:            471 TEMP5        EQU   5
F2C1:            472 SIGL         EQU   6
F2C1:            473 SIGM         EQU   7
F2C1:            474 SIGH         EQU   8
```

```
F2C1:                    475 ;
F2C1:  4C 47 F3          476 SIG0     JMP   SIG80          ; NO CONNECT
F2C4:                    477 ;
F2C4:  A2 07             478 SIGCOM   LDX   #7             ; SAVE SCRATCH AREA
F2C6:  B5 01             479 SIG1     LDA   TEMP1,X
F2C8:  48                480          PHA
F2C9:  CA                481          DEX
F2CA:  10 FA             482          BPL   SIG1
F2CC:  A2 00             483          LDX   #0
F2CE:  86 06             484          STX   SIGL           ;SIGNATURE COMPUTE
F2D0:  86 07             485          STX   SIGM
F2D2:  86 08             486          STX   SIGH
F2D4:  BD 80 02          487 SIG10    LDA   OLIST,X        ; COMPUTE MULTIPLIER MSB
F2D7:  30 E8             488          BMI   SIG0           ; NO CONNECT BRANCH
F2D9:  A8                489          TAY
F2DA:  A9 00             490          LDA   #0
F2DC:  85 05             491          STA   TEMP5
F2DE:  A9 03             492          LDA   #3
F2E0:  C0 25             493          CPY   #PTAB1-PTAB
F2E2:  90 0E             494          BCC   SIG30
F2E4:  A9 04             495          LDA   #4
F2E6:  C0 48             496          CPY   #PTAB2-PTAB
F2E8:  90 08             497          BCC   SIG30
F2EA:  A9 05             498          LDA   #5
F2EC:  C0 6B             499          CPY   #PTAB3-PTAB
F2EE:  90 02             500          BCC   SIG30
F2F0:  A9 06             501          LDA   #6
F2F2:  85 02             502 SIG30    STA   TEMP2
F2F4:  B9 67 F3          503          LDA   PTAB,Y         ; LSB
F2F7:  85 01             504          STA   TEMP1
F2F9:  BD 67 F3          505          LDA   PTAB,X         ; COMPUTE SECOUND MULTIPLIER
F2FC:  49 FF             506          EOR   #$FF           ; COMPLEMENT FOR FAST CARRY
F2FE:  85 03             507          STA   TEMP3
F300:  A9 FC             508          LDA   #$FC
F302:  E0 25             509          CPX   #PTAB1-PTAB
F304:  90 0E             510          BCC   SIG40
F306:  A9 FB             511          LDA   #$FB
F308:  E0 48             512          CPX   #PTAB2-PTAB
F30A:  90 08             513          BCC   SIG40
F30C:  A9 FA             514          LDA   #$FA
F30E:  E0 6B             515          CPX   #PTAB3-PTAB
F310:  90 02             516          BCC   SIG40
F312:  A9 F9             517          LDA   #$F9
F314:  85 04             518 SIG40    STA   TEMP4
F316:  A0 08             519          LDY   #8
F318:  46 03             520 SIG50    LSR   TEMP3          ; MULTIPLY
F31A:  B0 12             521          BCS   SIG60          ; NO BIT BRANCH
F31C:  A5 06             522          LDA   SIGL
F31E:  65 01             523          ADC   TEMP1
F320:  85 06             524          STA   SIGL
F322:  A5 07             525          LDA   SIGM
F324:  65 02             526          ADC   TEMP2
F326:  85 07             527          STA   SIGM
F328:  A5 08             528          LDA   SIGH
F32A:  65 05             529          ADC   TEMP5
F32C:  85 08             530          STA   SIGH
F32E:  46 04             531 SIG60    LSR   TEMP4          ; TEST UPPER MULT
F330:  B0 0C             532          BCS   SIG70
F332:  A5 07             533          LDA   SIGM
F334:  65 01             534          ADC   TEMP1
F336:  85 07             535          STA   SIGM
F338:  A5 08             536          LDA   SIGH
F33A:  65 02             537          ADC   TEMP2
F33C:  85 08             538          STA   SIGH
F33E:  06 01             539 SIG70    ASL   TEMP1
F340:  26 02             540          ROL   TEMP2
F342:  26 05             541          ROL   TEMP5
F344:  88                542          DEY
F345:  D0 D1             543          BNE   SIG50          ; MORE BITS IN MULT BRANCH
F347:  E8                544 SIG80    INX
F348:  30 03             545          BMI   SIG90
F34A:  4C D4 F2          546          JMP   SIG10
F34D:                    547 ;
F34D:  A5 06             548 SIG90    LDA   SIGL           ; SAVE SIG IN PSTACK
```

```
F34F: 20 4A F4    549              JSR     SPARM
F352: A5 07       550              LDA     SIGM
F354: 20 4A F4    551              JSR     SPARM
F357: A5 08       552              LDA     SIGH
F359: 20 4A F4    553              JSR     SPARM
F35C: A2 00       554              LDX     #0        ; RESTORE SCRATCH AREA
F35E: 68          555 SIG99        PLA
F35F: 95 01       556              STA     TEMP1,X
F361: E8          557              INX
F362: E0 08       558              CPX     #8
F364: D0 FB       559              BNE     SIG99
F366: 60          560              RTS
F367:             561 ;
F367: 01 05 13
F36A: 1D 29 2B
F36D: 35 37       562 PTAB         DFB     769,773,787,797,809,811,821,823
F36F: 3B 3D 47
F372: 55 59 5B
F375: 5F 6D       563              DFB     827,829,839,853,857,859,863,877
F377: 71 73 77
F37A: 8B 8F 97
F37D: A1 A9       564              DFB     881,883,887,907,911,919,929,937
F37F: AD B3 B9
F382: C7 CB D1
F385: D7 DF       565              DFB     941,947,953,967,971,977,983,991
F387: E5 F1 F5
F38A: FB FD       566              DFB     997,1009,1013,1019,1021
F38C: 07 09 0F
F38F: 19 1B 25
F392: 27 2D       567 PTAB1        DFB     1031,1033,1039,1049,1051,1061,1063,1069
F394: 3F 43 45
F397: 49 4F 55
F39A: 5D 63       568              DFB     1087,1091,1093,1097,1103,1109,1117,1123
F39C: 69 7F 81
F39F: 8B 93 9D
F3A2: A3 A9       569              DFB     1129,1151,1153,1163,1171,1181,1187,1193
F3A4: B1 BD C1
F3A7: C7 CD CF
F3AA: D5 E1       570              DFB     1201,1213,1217,1223,1229,1231,1237,1249
F3AC: EB FD FF    571              DFB     1259,1277,1279
F3AF: 03 09 0B
F3B2: 11 15 17
F3B5: 1B 27       572 PTAB2        DFB     1283,1289,1291,1297,1301,1303,1307,1319
F3B7: 29 2F 51
F3BA: 57 5D 65
F3BD: 77 81       573              DFB     1321,1327,1361,1367,1373,1381,1399,1409
F3BF: 8F 93 95
F3C2: 99 9F A7
F3C5: AB AD       574              DFB     1423,1427,1429,1433,1439,1447,1451,1453
F3C7: B3 BF C9
F3CA: CB CF D1
F3CD: D5 DB       575              DFB     1459,1471,1481,1483,1487,1489,1493,1499
F3CF: E7 F3 FB    576              DFB     1511,1523,1531
F3D2: 07 0D 11
F3D5: 17 1F 23
F3D8: 2B 2F       577 PTAB3        DFB     1543,1549,1553,1559,1567,1571,1579,1583
F3DA: 3D 41 47
F3DD: 49 4D 53
F3E0: 55 5B       578              DFB     1597,1601,1607,1609,1613,1619,1621,1627
F3E2: 65 79 7F
F3E5: 83 85       579              DFB     1637,1657,1663,1667,1669
F3E7:             580 ;
F3E7:             581 ;***********************************************************
F3E7:             582 ; SOUND/PAUSE GENERATOR SUBROUTINES
F3E7:             583 ; NO REGISTERS OR MEMORY ALTERED
F3E7:             584 ;***********************************************************
F3E7: 20 4A F4    585 TPG10        JSR     SPARM     ; VECTOR ON PSTACK
F3EA: AA          586              TAX               ; SAVE REGISTERS
F3EB: 48          587              PHA
F3EC: 98          588              TYA
F3ED: 48          589              PHA
F3EE: A5 01       590              LDA     TEMP1
F3F0: 48          591              PHA
```

```
F3F1: A5 02      592           LDA   TEMP2
F3F3: 48         593           PHA
F3F4: 20 5B F4   594           JSR   LPARM      ; FETCH VECTOR
F3F7: AA         595           TAX
F3F8: 10 1D      596           BPL   TPG35
F3FA: A0 00      597           LDY   #0         ; PREVENT SEQUENCE
F3FC: E8         598           INX
F3FD: F0 24      599           BEQ   TPG50      ; LONG PAUSE BRANCH
F3FF: A9 40      600           LDA   #$40       ; SHORT PAUSE
F401: E8         601           INX
F402: F0 1F      602           BEQ   TPG50
F404: A9 01      603           LDA   #1         ; MAKE CLICK
F406: A2 64      604           LDX   #100
F408: 20 39 F4   605           JSR   SND20
F40B: 68         606 TPG30     PLA              ; RESTORE REGISTERS
F40C: 85 02      607           STA   TEMP2
F40E: 68         608           PLA
F40F: 85 01      609           STA   TEMP1
F411: 68         610           PLA
F412: A8         611           TAY
F413: 68         612           PLA
F414: AA         613           TAX
F415: 68         614           PLA   ; RESTORE ACCUM
F416: 60         615           RTS
F417:            616 ;
F417: A8         617 TPG35     TAY
F418: BE 2E F4   618 TPG40     LDX   NOTES,Y    ; GET NOTE FOR SOUND ROUTINE
F41B: F0 EE      619           BEQ   TPG30      ; ZERO? YES, EXIT
F41D: 20 37 F4   620           JSR   SND10      ; NO, PLAY IT
F420: 88         621           DEY              ; NEXT POINTER
F421: A9 40      622           LDA   #$40       ; PAUSE LOOP
F423: 85 01      623 TPG50     STA   TEMP1      ; HI BYTE OF LOOP COUNTER
F425: E8         624 TPG60     INX              ; LOOP
F426: D0 FD      625           BNE   TPG60
F428: C6 01      626           DEC   TEMP1
F42A: D0 F9      627           BNE   TPG60
F42C: F0 EA      628           BEQ   TPG40      ; BRANCH ALWAYS
F42E:            629 ;
F42E:            630 ;
F42E: 00 69 69
F431: 69         631 NOTES     DFB   0,105,105,105 ; ERROR TONES
F432: 00 6E 82
F435: 96 AA      632           DFB   000,110,130,150,170 ; CONGRATULATIONS TONES
F437:            633 ;
F437:            634 ; **********************************************************************
F437:            635 ; SOUND SUBROUTINE
F437:            636 SNDOUT    EQU   $D00       ; SPEAKER TRANSITION OUT
F437:            637 ;
F437: A9 96      638 SND10     LDA   #150       ; 150 LOOPS
F439: 85 02      639 SND20     STA   TEMP2      ; PUT IN COUNTER
F43B: 86 01      640           STX   TEMP1      ; STORE TONE
F43D: CA         641 SND30     DEX              ; TONE LOOP
F43E: D0 FD      642           BNE   SND30
F440: 8D 00 0D   643           STA   SNDOUT     ; TOGGLE SPEAKER
F443: A6 01      644           LDX   TEMP1      ; RETRIEVE TONE
F445: C6 02      645           DEC   TEMP2      ; DONE LOOPS?
F447: D0 F4      646           BNE   SND30      ; NO, CONTINUE
F449: 60         647           RTS              ; YES, RETURN
F44A:            648 ;
F44A:            649 ; **********************************************************************
F44A:            650 ; SAVE ACCUM ON PARAMATER STACK AND INCREMENT POINTER
F44A:            651 ; **********************************************************************
F44A:            652 SPVAR     EQU   $27
F44A:            653 PARM      EQU   $28
F44A:            654 PSTACK    EQU   $200
F44A:            655 ;
F44A: 48         656 SPARM     PHA              ; SAVE COPY A
F44B: 86 27      657           STX   SPVAR      ; TEMP SAVE OF X
F44D: A6 28      658           LDX   PARM
F44F: 9D 00 02   659           STA   PSTACK,X
F452: E8         660           INX
F453: 30 02      661           BMI   SPR20      ;- OUT OF RANGE JUMP
F455: 86 28      662 SPR10     STX   PARM
```

```
F457: A6 27      663 SPR20   LDX   SPVAR
F459: 68         664         PLA
F45A: 60         665         RTS
F45B:            666 ;
F45B:            667 ;********************************************************************
F45B:            668 ; LOAD ACCUM FROM PARAMETER STACK AND DECREMENT POINTER
F45B:            669 ;********************************************************************
F45B:            670 ;
F45B: 86 27      671 LPARM   STX   SPVAR
F45D: A6 28      672         LDX   PARM
F45F: CA         673         DEX
F460: 30 07      674         BMI   LPR10
F462: BD 00 02   675         LDA   PSTACK,X
F465: 48         676         PHA
F466: 4C 55 F4   677         JMP   SPR10
F469:            678 ;
F469: A6 27      679 LPR10   LDX   SPVAR
F46B: 60         680         RTS
F46C:            681 ;
F46C:            682 ;********************************************************************
F46C:            683 ; ADAPTER INFO TO PSTACK
F46C:            684 ;********************************************************************
F46C:            685 AHIGH   EQU   1
F46C:            686 ALOW    EQU   2
F46C: A9 00      687 ACONS   LDA   #0            ; TERMINATION CHARACTER
F46E: 20 4A F4   688         JSR   SPARM
F471: AD E0 03   689         LDA   LLIST+96      TEST 4
F474: 0D E1 03   690         ORA   LLIST+97
F477: 29 40      691         AND   #$40
F479: F0 17      692         BEQ   ACN9
F47B: A9 80      693         LDA   #128
F47D: A2 60      694         LDX   #96
F47F: 20 DA F4   695         JSR   CTEST
F482: 90 0A      696         BCC   ACN8          ; NO J4 CONNECTS BRANCH
F484: A9 09      697         LDA   #9            ; LOAD A SIG FOR 4
F486: 20 FA F4   698         JSR   XATPS
F489: A9 34      699         LDA   #'4'
F48B: 20 4A F4   700         JSR   SPARM
F48E: A9 60      701 ACN8    LDA   #96
F490: D0 02      702         BNE   ACN10
F492: A9 80      703 ACN9    LDA   #128
F494: A2 40      704 ACN10   LDX   #64           ; LOAD ASIG FOR 3
F496: 20 DA F4   705         JSR   CTEST
F499: 90 0A      706         BCC   ACN17         ; NO J3 CONNECTS BRANCH
F49B: A2 06      707         LDX   #6
F49D: 20 FA F4   708         JSR   XATPS
F4A0: A9 33      709         LDA   #'3'
F4A2: 20 4A F4   710         JSR   SPARM
F4A5: AD A0 03   711 ACN17   LDA   LLIST+32
F4A8: 0D A1 03   712         ORA   LLIST+33
F4AB: 29 40      713         AND   #$40
F4AD: F0 17      714         BEQ   ACN19         ; NO J2 BRANCH
F4AF: A9 40      715         LDA   #64
F4B1: A2 20      716         LDX   #32
F4B3: 20 DA F4   717         JSR   CTEST
F4B6: 90 0A      718         BCC   ACN18         ; NO J2 CONNECTS BRANCH
F4B8: A2 03      719         LDX   #3
F4BA: 20 FA F4   720         JSR   XATPS
F4BD: A9 32      721         LDA   #'2'
F4BF: 20 4A F4   722         JSR   SPARM
F4C2: A9 20      723 ACN18   LDA   #32
F4C4: D0 02      724         BNE   ACN20
F4C6: A9 40      725 ACN19   LDA   #64
F4C8: A2 00      726 ACN20   LDX   #0
F4CA: 20 DA F4   727         JSR   CTEST
F4CD: 90 0A      728         BCC   ACN30
F4CF: A2 00      729         LDX   #0
F4D1: 20 FA F4   730         JSR   XATPS         ; GET J1 INFO
F4D4: A9 31      731         LDA   #'1'
F4D6: 20 4A F4   732         JSR   SPARM
F4D9: 60         733 ACN30   RTS
F4DA:            734 ;
F4DA: 85 01      735 CTEST   STA   AHIGH
```

```
F4DC: 86 02       736            STX   ALOW
F4DE: A2 00       737            LDX   #0
F4E0: BD 00 03    738 CTT10      LDA   DLIST,X
F4E3: 30 10       739            BMI   CTT30    ; NO CONNECT BRANCH
F4E5: E4 01       740            CPX   AHIGH
F4E7: B0 04       741            BCS   CTT20    ; PRESENT POINT TOO HIGH BRANCH
F4E9: E4 02       742            CPX   ALOW
F4EB: B0 0C       743            BCS   CTT40    ; VALID POINT IN USE BRANCH
F4ED: C5 01       744 CTT20      CMP   AHIGH
F4EF: B0 04       745            BCS   CTT30    ; DESTIN
F4F1: C5 02       746            CMP   ALOW
F4F3: B0 04       747            BCS   CTT40    ; VALID DESTINATION BRANCH
F4F5: E8          748 CTT30      INX
F4F6: 10 E8       749            BPL   CTT10
F4F8: 18          750            CLC
F4F9: 60          751 CTT40      RTS
F4FA:             752 ; ******************************************************************
F4FA:             753 ; TRANSFER ADAPTER SIG TO PSTACK
F4FA:             754 ; ******************************************************************
F4FA: B5 13       755 XATPS      LDA   ASIG,X
F4FC: 20 4A F4    756            JSR   SPARM
F4FF: E8          757            INX
F500: B5 13       758            LDA   ASIG,X
F502: 20 4A F4    759            JSR   SPARM
F505: E8          760            INX
F506: B5 13       761            LDA   ASIG,X
F508: 4C 4A F4    762            JMP   SPARM
F50B:             763 ;
F50B:             764 ; ******************************************************************
F50B:             765 ; PRINT LINE
F50B:             766 ; PRINTS THE XTH STRING
F50B:             767 ; DESTROYS X AND A
F50B:             768 ; ******************************************************************
F50B:             769 ;
F50B:             770 PPTR       EQU   $25
F50B:             771 ;                $16
F50B: BD E8 F6    772 PLINE      LDA   TSTRG,X
F50E: 85 25       773            STA   PPTR
F510: BD E9 F6    774            LDA   TSTRG+1,X
F513: 85 26       775            STA   PPTR+1
F515: A2 00       776 PLNE10     LDX   #0
F517: A1 25       777            LDA   (PPTR,X)
F519: 10 0C       778            BPL   PLNE20
F51B: 20 00 F8    779            JSR   COUT
F51E: E6 25       780            INC   PPTR
F520: D0 F3       781            BNE   PLNE10
F522: E6 26       782            INC   PPTR+1
F524: 4C 15 F5    783            JMP   PLNE10
F527:             784 ;
F527: 4C 00 F8    785 PLNE20     JMP   COUT     ; END OF STRING
F52A: C3 C1 C2
F52D: CC C5 20    786 TBS0       DCI   "CABLE    "
F530: D3 C9 C7
F533: CE C1 D4
F536: D5 D2 C5
F539: 20          787 TBS2       DCI   "SIGNATURE "
F53A: C1 C4 C1
F53D: D0 D4 C5
F540: D2 A0 D3
F543: C9 C7 CE
F546: C1 D4 D5
F549: D2 C5 BA
F54C: 20          788 TBS4       DCI   "ADAPTER    SIGNATURE: "
F54D: A0 A0 A0
F550: C3 C1 C2
F553: CC C5 A0
F556: D0 C1 D2
F559: D4 A0 CE
F55C: CF AE 3A    789 TBS6       DCI   "           CABLE PART NO.:"
F55F: A0 A0 A0
F562: C3 CF CE
F565: CE C5 C3
F568: D4 CF D2
F56B: A0 C4 C5
F56E: D3 C3 D2
```

```
F571: C9 D0 D4
F574: C9 CF CE
F577: 3A            790 TBS8     DCI  "          CONNECTOR DESCRIPTION:"
F578: D3 C9 C7
F57B: CE C1 D4
F57E: D5 D2 C5
F581: A0 B1 B0
F584: B0 B0 A0
F587: C3 C1 C2
F58A: CC C5 A0
F58D: C4 CF C3
F590: D5 CD C5
F593: CE D4 C1
F596: D4 C9 CF
F599: 4E            791 TBS10    DCI  "SIGNATURE  1000 CABLE DOCUMENTATION"
F59A: C3 C1 C2
F59D: CC C5 A0
F5A0: D3 C9 C7
F5A3: CE C1 D4
F5A6: D5 D2 C5
F5A9: BA A0 A0
F5AC: A0 A0 A0
F5AF: 20            792 TBS12    DCI  "CABLE     SIGNATURE:       "
F5B0: CE CF D4
F5B3: C5 D3 3A      793 TBS14    DCI  "NOTES:"
F5B6: A0 C1 C4
F5B9: C1 D0 D4
F5BC: C5 D2 A0
F5BF: A0 A0 A0
F5C2: A0 20         794 TBS16    DCI  "          ADAPTER         "
F5C4: CE CF AE
F5C7: A0 A0 C3
F5CA: CF CD CD
F5CD: CF CE A0
F5D0: C3 CF CE
F5D3: CE C5 C3
F5D6: D4 C9 CF
F5D9: CE A0 CC
F5DC: C9 D3 D4
F5DF: 3A            795 TBS18    DCI  "NO.       COMMON CONNECTION LIST:"
F5E0: D3 C8 CF
F5E3: D2 D4 D3
F5E6: 3A            796 TBS20    DCI  "SHORTS:"
F5E7: CF D0 C5
F5EA: CE D3 3A      797 TBS22    DCI  "OPENS:"
F5ED: A0 C3 CF
F5F0: D0 D9 D2
F5F3: C9 C7 C8
F5F6: D4 A0 B1
F5F9: B9 B8 B3
F5FC: A0            798 TBS24    ASC  "   COPYRIGHT 1983 "
F5FD: 8D            799          DFB  $8D
F5FE: A0 D6 C5
F601: D2 D3 C9
F604: CF CE A0
F607: B1 AE B0
F60A: A0 A0 A0
F60D: 20            800          DCI  "          VERSION 1.0    "
F60E: D2 C5 C1
F611: C4 D9 A0
F614: D4 CF A0
F617: D4 C5 D3
F61A: D4 A0 A0
F61D: 20            801 TBS26    DCI  "READY      TO TEST      "
F61E: CC C5 C1
F621: D2 CE C9
F624: CE C7 A0
F627: C3 C1 C2
F62A: CC C5 A0
F62D: 20            802 TBS28    DCI  "LEARNING  CABLE  "
F62E: D3 C8 CF
F631: D2 D4 A0
F634: C4 C5 D4
F637: C5 C3 D4
```

```
F63A: C5 C4 A0
F63D: 20            803 TBS30   DCI   "SHORT     DETECTED  "
F63E: CF D0 C5
F641: CE A0 C4
F644: C5 D4 C5
F647: C3 D4 C5
F64A: C4 A0 A0
F64D: 20            804 TBS32   DCI   "OPEN      DETECTED  "
F64E: C5 D2 D2
F651: CF D2 D3
F654: A0 C4 C5
F657: D4 C5 C3
F65A: D4 C5 C4
F65D: 20            805 TBS34   DCI   "ERRORS    DETECTED "
F65E: C7 CF CF
F661: C4 A0 C3
F664: C1 C2 CC
F667: C5 A0 A0
F66A: A0 A0 A0
F66D: 20            806 TBS36   DCI   "GOOD      CABLE     "
F66E: A0 C3 C9
F671: D2 D2 C9
F674: D3 A0 D3
F677: D9 D3 D4
F67A: C5 CD D3
F67D: A0            807 TBS38   ASC   "     CIRRIS SYSTEMS "
F67E: 8D            808         DFB   $8D
F67F: A0 D3 C9
F682: C7 CE C1
F685: D4 D5 D2
F688: C5 A0 B1
F68B: B0 B0 B0
F68E: 20            809         DCI   "     SIGNATURE 1000 "
F68F: D2 C5 C1
F692: C4 D9 A0
F695: D4 CF A0
F698: CC C5 C1
F69B: D2 CE A0
F69E: 20            810 TBS40   DCI   "READY     TO LEARN  "
F69F: D3 C3 C1
F6A2: CE CE C5
F6A5: D2 A0 C6
F6A8: C1 C9 CC
F6AB: D5 D2 C5
F6AE: 20            811 TBS42   DCI   "SCANNER   FAILURE "
F6AF:               812 ;
F6AF: C3 C1 C2
F6B2: CC C5 A0
F6B5: C5 D2 D2
F6B8: CF D2 A0
F6BB: D3 C9 C7
F6BE: CE C1 D4
F6C1: D5 D2 C5
F6C4: BA 20         813 TB44    DCI   "CABLE     ERROR SIGNATURE: "
F6C6: C3 C1 C2
F6C9: CC C5 A0
F6CC: C4 C5 D3
F6CF: C3 D2 C9
F6D2: D0 D4 C9
F6D5: CF CE 3A      814 TB46    DCI   "CABLE     DESCRIPTION:"
F6D8: D0 CC C5
F6DB: C1 D3 C5
F6DE: A0 D6 C5
F6E1: D2 C9 C6
F6E4: D9 A0 A0
```

What is claimed and desired to secured by United States Letters Patent is:

1. A method of documenting the terminal interconnections for each wire of a newly designed cable and for later checking the terminal interconnections for each wire of another cable that is to be used as a reference cable for checking subsequent cables so as to verify that the terminal interconnections of said cables are the same, said method comprising the steps of:

electronically determining the terminal interconnections for said newly designed cable;

electronically generating a unique cable signature based on the terminal interconnections determined for said newly designed cable;

documenting said cable signature and the terminal interconnections for said newly designed cable;

electronically determining and storing the terminal interconnections for said reference cable;

electronically generating a unique cable signature based on the terminal interconnections determined for said reference cable;

comparing said cable signature of said reference cable to said cable signature documented for said newly designed cable so as to verify that said reference cable has the same signature as the newly designed cable; and thereafter electronically determining and comparing the terminal interconnections for each said subsequent cable to the terminal interconnections stored from said verified reference cable.

2. A method as defined in claim 1 further comprising the steps of:

electronically storing a list which describes said terminal interconnections for said newly designed cable; and electronically storing said cable signature determined for said newly designed cable.

3. A method as defined in claim 2 wherein said step of documenting said cable signature and said terminal interconnections for said newly designed cable comprises the step of printing said cable signature and said list of terminal interconnections for said newly designed cable.

4. A method as defined in claim 1 further comprising the step of:

displaying each interconnection for each said subsequent cable which differs from the interconnections determined for said reference cable.

5. A method as defined in claim 1 further comprising the steps of:

electronically monitoring the terminal interconnections of each said cable for conditions of discontinuity and short circuits;

electronically storing a list of terminal interconnections for each interconnection where one of said conditions is detected; and displaying said list of terminal interconnections for each interconnection where one of said conditions is detected.

6. A method as defined in claim 4 further comprising the step of printing said list of interconnections which describes said differences.

7. A method as defined in claim 1 wherein each said cable comprises connectors at the ends thereof, each said connector comprising a plurality of terminals numbered in a particular sequence, and wherein said method further comprises the step of connecting an adapter to at least one end of each said cable so that said end of said cables may be interconnected to another connector having a different numbering sequence than that of said connector at said end of said cables.

8. A method as defined in claim 7 further comprising the steps of:

electronically determining the terminal interconnections for said adapter;

electronically generating a unique adapter signature based on the terminal interconnections determined for said adapter; and documenting said adapter signature.

9. A method as defined in claim 8 wherein said step of documenting said adapter signature comprises the step of printing said adapter signature with the cable signature and termination interconnections determine for said newly designed cable.

10. In an apparatus comprising detection means for electronically detecting the terminal interconnections for each wire of a cable, storage means for electronically storing data representing said terminal interconnections, processor means for electronically processing said data and output means for outputting information derived from said data, a method of documenting and comparing terminal interconnections for a plurality of cables, said method comprising the steps of:

electrically connecting the ends of a newly designed first cable to the detection means of said apparatus;

electronically detecting with said detection means the terminal interconnections for said first cable;

electronically storing in said storage means data which represents a list of said terminal interconnections detected for said first cable;

electronically processing with said processor means the data which represents said list of terminal interconnections for said first cable, whereby a unique cable signature is derived for said first cable;

electronically storing in said storage means data which represents the cable signature derived for said first cable;

documenting said list of terminal interconnections for said first cable with the cable signature derived for said first cable;

electrically connecting the ends of a second cable selected as a reference cable to the detection means of said apparatus;

electronically detecting with said detection means the terminal interconnections for said second cable;

electronically storing in said storage means data which represents a list of said terminal interconnections determined for said second cable;

electronically processing with said processor means the data which represents said list of terminal interconnections for said second cable, whereby a unique cable signature is derived for said second cable;

electronically storing in said storage means data which represents the cable signature derived from said second cable displaying at said output means a visual indication of the cable signature derived for said second cable; and comparing the cable signature displayed for said second cable with the cable signature documented for said first cable so as to verify that the signatures match, thereby verifying said second cable as a valid reference cable.

11. A method as defined in claim 10 wherein said detection means comprises a pair of connectors, each said connector having a plurality of terminals numbered in a first sequence, and wherein said cables each comprise connectors at the ends thereof which are intended to mate with the connectors of said detection means, at least one of the connectors of each said cable comprising a plurality of terminals numbered in a second sequence and each said step of electrically connecting the ends of said first and second cables to said detection means comprising the steps of:

connecting one end of an adapter to the connector of said cable; and connecting the other end of said adapter to one of the connectors of said detection means.

12. A method as defined in claim 11 further comprising the steps of:

electrically connecting the ends of the adapter used on said first cable to said detection means;

electronically detecting with said detection means the terminal interconnections for the adapter used on said first cable;

electronically storing in said storage means data which represents a list of said terminal interconnections detected for said adapter used on said first cable;

electronically processing with said processor means the data which represents said list of terminal interconnections for said adapter used on said first cable, whereby a unique adapter signature is derived for the adapter used on said first cable;

electronically storing in said storage means data which represents the adapter signature derived for the adapter used on said first cable; and documenting said adapter signature with said list of terminal interconnections for said first cable with said cable signature derived for said first cable.

13. A method defined in claim 12 wherein said output means comprises a printer and wherein said documenting step comprises the step of printing a visual indication of said adapter signature, said list of terminal interconnections and said cable signature derived for said first cable.

14. A method as defined in claim 12 further comprising the steps of:

electronically connecting the ends of the adapter used on said second cable to said detection means;

electronically detecting with said detection means the terminal interconnections for the adapter used on said second cable;

electronically storing in said storage means data which represents a list of said terminal interconnections detected for said adapter used on said second cable;

electrically processing with said processor means the data which represents said list of terminal interconnections for said adapter used on said second cable, whereby a unique adapter signature is derived for the adapter used on said second cable;

electrically storing in said storage means data which represents the adapter signature derived for the adapter used on said second cable;

displaying at said output means a visual indication of the adapter signature for the adapter used on said second cable; and comparing the displayed signature with said adapter signature documented for the adapter used on said first cable.

15. A method as defined in claim 10 wherein each said step of electronically detecting said terminal interconnections for said first and second cables comprises the steps of:

electronically monitoring said terminal interconnections with said detection means so as to detect open or short circuit conditions for any of said terminal interconnections;

electronically storing in said storage means data which represents a list of each terminal interconnection where one of said conditions is detected; and displaying at said fourth means a visual indication of each terminal interconnection where one of said conditions is detected.

16. A method as defined in claim 10 wherein said output means comprises a printer and wherein said documenting step comprises the step of printing a visual indication of said list of terminal interconnections and said cable signature derived for said first cable.

17. A method as defined in claim 10 further comprising the steps of:

electrically connecting the ends of one or more subsequent cables to the detection means of said apparatus;

electrically detecting with said detection means the terminal interconnections for each said subsequent cable;

electronically storing in said storage means data which represents a list of said terminal interconnections detected for each said subsequent cable;

electronically comparing with said processor means said lists of terminal interconnections stored for said verified reference cable and each said subsequent cable; and displaying at said output means each interconnection of each said subsequent cable which differs from the interconnections determined for said verified reference cable.

18. A method of documenting the terminal interconnections for each wire of a newly designed first cable and of checking the interconnections for each wire of a subsequent cable so as to verify that the terminal interconnections of said first and subsequent cables are the same, said method comprising the steps of:

electronically determining said terminal interconnections for said first cable;

electronically storing data which represents a list describing the terminal interconnections detected for said first cable;

electronically processing said data which describes the terminal interconnections detected for said first cable, whereby a unique cable signature is derived for said first cable;

documenting said list of terminal interconnections and said cable signature derived from said first cable;

electronically determining the terminal interconnections for a second cable that is to be used as a reference cable;

electronically storing data which represents a list of said terminal interconnections for said second cable;

electronically processing the data which represents said list of terminal interconnections for said second cable, whereby a unique cable signature is derived for said second cable;

electronically storing data which represents said cable signature derived for said second cable;

displaying a visual indication of said cable signature derived for said second cable;

comparing the displayed cable signature derived for said second cable to said cable signature documented for said first cable so as to verify that said signatures are the same, thereby verifying the second cable as a valid reference cable against which subsequent cables can be checked;

electronically determining the terminal interconnections for one or more subsequent cables to be checked against said reference cable;

electronically storing data which represents a list describing each terminal interconnection detected for each said subsequent cable;

electronically comparing the list of terminal interconnections stored for said verified reference cable with the list of terminal interconnections stored for each said subsequent cable; and displaying each interconnection for each said subsequent cable which differs from the list of interconnections stored for each verified reference cable.

19. A method as defined in claim 18 wherein said step of documenting said list of terminal interconnections and said cable signature derived for said first cable comprises the step of printing said list of terminal interconnections and said cable signature.

20. A method as defined in claim 18 wherein said first cable comprises connectors at the ends thereof, each said connector having a plurality of terminals numbered in a particular sequence, and wherein said method further comprises the step of connecting an adapter to at least one end of said first cable so that said end of the cable may be interconnected to a connector having a plurality of terminals numbered in a different sequence than that of said connector at said end of said first cable.

21. A method as defined in claim 20 further comprising the steps of:

electronically determining the terminal interconnections for said adapter;

electronically storing data which represents a list of terminal interconnections determined for said adapter;

electronically processing said data which represents the terminal interconnections determined for said adapter, whereby a unique adapter signature is derived for said adapter;

electronically storing data which represents the adapter signature derived for said adapter; and documenting said adapter signature for said first cable.

22. A method as defined in claim 21 further comprising the steps of:

connecting a second adapter to at least one end of said second cable;

electronically determining the terminal interconnections for said second adapter;

electronically storing data which represents a list of terminal interconnections determined for said second adapter;

electronically processing said data which represents the terminal interconnections determined for said second adapter, whereby a unique adapter signature is derived for said second adapter;

electronically storing data which represents the adapter signature derived for said second adapter;

displaying said adapter signature for said second adapter; and comparing the displayed adapter signature of said second adapter to the adapter signature documented for said first cable.

23. A system for documenting the terminal interconnections for each wire of a newly designed first cable and checking the terminal interconnections for each wire of one or more subsequent cables so as to verify that the terminal interconnections of said first and subsequent cables are the same, said system comprising:

(1) means for analyzing the terminal interconnections of each said cable, said means for analyzing said terminal interconnections comprising:

(a) means for testing each terminal position at the ends of each cable to determine which terminal positions of each cable are connected in common;

(b) means for connecting the ends of each said cable to said testing means;

(c) means for generating a unique cable signature based on the common connections determined by said testing means; and (d) means for outputting said cable signature and terminal interconnections determined by said testing means;

(2) means for documenting the cable signature and terminal interconnections output for said newly designed first cable; and (3) means for organizing the filing said documented cable signature and terminal interconnections of said first cable so as to permit later reference thereto when verifying the cable signature output for one of said subsequent cables.

24. A system as defined in claim 23 wherein said means for testing each terminal position comprises:

means for sequentially selecting each said terminal position as a test point and identifying said test point with a low signal level; and means for sequentially scanning each terminal position which occurs after said test point to determine the next terminal position, if any, after said test point at which a low signal level occurs.

25. A system as defined in claim 23 wherein said means for analyzing said terminal interconnections further comprises:

means for generating and storing a list for one of said subsequent cables which is used as a reference cable, said list describing the common connections determined by said testing means for said reference cable;

means for generating and storing a list for another one of said subsequent cables used as a test cable, said list describing the common connections determined by said testing means for said test cable; and means for comparing and storing any differences between the lists of common connections for said reference and test cables.

26. A system for documenting the terminal interconnections for each wire of a first cable and checking the terminal interconnections for each wire of one or more subsequent cables so as to verify that the terminal interconnections of said first and subsequent cables are the same, said system comprising:

(1) a cable analyzer comprising:

(a) a housing;

(b) a pair of cover plates removably secured to said housing;

(c) an electronic circuit mounted to said cover plates so as to be enclosed by said housing when said cover plates are secured to the housing, said circuit comprising a plurality of cable connectors, means for determining the terminal interconnections of each cable plugged into said connectors, means for generating a unique cable signature based on the terminal interconnections determined for each cable and means for outputting said terminal interconnections and cable signature determined for each said cable;

(d) means for displaying a visual indication of the cable signature and terminal interconnections determined by said electronic circuit, said means for displaying said visual indication being mounted to one of said cover plates; and (e) a pair of top plates removably secured to one of said cover plates and said housing, said top plates securing one of more cable adapters between said cover plate and said top plates;

(2) a plurality of cable adapters for connecting the ends of each said cable to corresponding cable connectors of said electronic circuit, each said adapter comprising means for adapting the numerical sequence of the terminal positions at the ends of said cable to the numerical sequence of the terminal positions of said cable connectors so as to provide a compatible interconnection to said cable connectors;

(3) a printer electrically connected to said means for outputting said terminal interconnections and cable signature determined for each said cable; and (4) means for organizing and filing documents output by said printer.

27. In a system for documenting the terminal interconnections for each wire of a first cable and checking the terminal interconnections for each wire of one or more subsequent cables so as to verify that the terminal interconnections of said first and subsequent cables are the same, an apparatus for analyzing the terminal interconnections of each said cable comprising:

means for testing each terminal position at the ends of each cable to determine which terminal positions of each cable are connected in common;

means for connecting the ends of each said cable to said testing means;

means for generating a unique cable signature based on the common connections determined by said testing means; and means for outputting said cable signature and terminal interconnections determined by said testing means.

28. An apparatus as defined in claim 27 wherein said means for testing each terminal position comprises a decoder and a multiplexer connected in common to each said cable connector.

29. An apparatus as defined in claim 28 wherein said means for generating said unique cable signature comprises:

a first register connected to said decoder for determining which terminal position of said cable connector is to be selected as a test point;

a second register connected to said multiplexer for determining which terminal position is to be scanned for purposes of determining whether said test point is connected in common to a subsequent terminal position;

a first memory device for storing a list of the common terminal interconnections detected by said multiplexer;

a microprocessor electrically connected to said first and second registers and to said first memory device, said microprocessor being programmed to control said first and second registers in the selection and scanning of said terminal positions by said decoder and said multiplexer; and a second memory device electrically connected to said microprocessor, said second memory device having stored therein a set of instructions for execution by said microprocessor so that said microprocessor will process the list of terminal interconnections stored in said first memory device in accordance with the following expression:

$$\sum_{i=1}^{n} P_1 \times P_R$$

where n is the number of test points corresponding to the terminal positions of said cable connectors, and where P is an array of n+1 elements in which $P_0=0$ and $P_1, P_2 \ldots P_n$ are prime numbers stored in said second storage device, and where $R_i$ is an array of n elements which represents said list of terminal interconnections stored in said first storage device such that each element of the array $R_i$ is set to 0 except for those elements of the array $R_i$ where pointers to common terminal interconnections have been stored in said list of terminal interconnections stored in said first memory device.

30. An apparatus as defined in claim 29 wherein said means for outputting said cable signature and terminal interconnections comprise:

means for interfacing a visual display to said microprocessor;

means for interfacing a printer to said microprocessor; and means for interfacing a speaker to said microprocessor.

31. An apparatus as defined in claim 28 wherein said means for generating said unique cable signature comprises:

a first counter electrically connected to said decoder;

a second counter electrically connected to said multiplexer;

a unit adder connected between the output of said first counter and the input of said second counter so as to increment by one the count output by said second counter to said multiplexer;

a clock for providing a clock pulse to the input of said first and second counters;

a first memory device having a first table of prime numbers accessed by said first counter;

a second memory device having a second table of prime numbers accessed by said second counter;

a multiplier electrically connected to said first and second memory devices for multiplying together the prime number accessed by said first and second counters from said first and second memory devices;

an output register for storing the sum of the products of each pair of prime numbers multiplied by said multiplier; and an adder interposed between said output register and said multiplier for adding the sum of sum of each said multiplier to the previous product stored in said output register.

* * * * *